United States Patent
Yamazaki

(10) Patent No.: US 9,716,003 B2
(45) Date of Patent: Jul. 25, 2017

(54) METHOD OF MANUFACTURING SEMICONDUCTOR DEVICE

(71) Applicant: Semiconductor Energy Laboratory Co., Ltd., Atsugi-shi, Kanagawa-ken (JP)

(72) Inventor: Shunpei Yamazaki, Setagaya (JP)

(73) Assignee: Semiconductor Energy Laboratory Co., Ltd., Atsugi-shi, Kanagawa-ken (JP)

(*) Notice: Subject to any disclaimer, the term of this patent is extended or adjusted under 35 U.S.C. 154(b) by 0 days.

(21) Appl. No.: 14/479,674

(22) Filed: Sep. 8, 2014

(65) Prior Publication Data

US 2015/0079729 A1    Mar. 19, 2015

(30) Foreign Application Priority Data

Sep. 13, 2013   (JP) .................. 2013-190216

(51) Int. Cl.
  *H01L 29/66*  (2006.01)
  *H01L 29/786*  (2006.01)
  *H01L 21/02*  (2006.01)

(52) U.S. Cl.
  CPC .... *H01L 21/02565* (2013.01); *H01L 21/0237* (2013.01); *H01L 21/0262* (2013.01); *H01L 21/02488* (2013.01); *H01L 21/02554* (2013.01); *H01L 29/66969* (2013.01); *H01L 29/7869* (2013.01); *H01L 29/78696* (2013.01)

(58) Field of Classification Search
  CPC ............. H01L 21/02565; H01L 29/66969
  USPC ............................. 438/104; 257/43
  See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Nicolay.S et al., "Growth Model of MOCVD Polycrystalline ZnO", Crystal Growth & Design, Nov. 1, 2009, vol. 9, No. 11, pp. 4957-4962.

(Continued)

*Primary Examiner* — Moazzam Hossain
(74) *Attorney, Agent, or Firm* — Eric J. Robinson; Robinson Intellectual Property Law Office, P.C.

(57) ABSTRACT

Provided are an oxide semiconductor layer in which the number of defects is reduced and a highly reliable semiconductor device including the oxide semiconductor. A first oxide semiconductor layer containing a single metal element as a constituent element is formed over a substrate by a thermal chemical vapor deposition method. A second oxide semiconductor layer containing two or more metal elements as constituent elements is formed successively after the first oxide semiconductor layer is formed. The second oxide semiconductor layer is formed by epitaxial growth using the first oxide semiconductor layer as a seed crystal. A channel is formed in the second oxide semiconductor layer.

24 Claims, 24 Drawing Sheets

(56) References Cited

U.S. PATENT DOCUMENTS

| | | | |
|---|---|---|---|
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,247,276 B2 | 8/2012 | Kondo et al. |
| 8,502,221 B2 | 8/2013 | Yamazaki |
| 8,765,522 B2 | 7/2014 | Yamazaki |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0111372 A1* | 5/2007 | Nause .................. C23C 16/407 438/104 |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0127522 A1* | 6/2011 | Yamazaki ......... H01L 21/02472 257/43 |
| 2011/0127523 A1* | 6/2011 | Yamazaki ......... H01L 21/02554 257/43 |
| 2011/0147739 A1 | 6/2011 | Yamazaki et al. |
| 2011/0156026 A1* | 6/2011 | Yamazaki ......... H01L 21/02422 257/43 |
| 2012/0061663 A1* | 3/2012 | Yamazaki ......... H01L 21/02488 257/43 |
| 2012/0138922 A1* | 6/2012 | Yamazaki ........... H01L 29/7869 257/43 |
| 2012/0146713 A1 | 6/2012 | Kim et al. |
| 2012/0175609 A1* | 7/2012 | Yamazaki ........... H01L 29/7869 257/43 |
| 2012/0305913 A1* | 12/2012 | Yamazaki ......... H01L 21/02422 257/43 |
| 2013/0037797 A1* | 2/2013 | Takechi ............. H01L 29/7869 257/43 |
| 2014/0042437 A1 | 2/2014 | Yamazaki |
| 2014/0210835 A1* | 7/2014 | Hong ................ H01L 29/78696 345/530 |
| 2014/0241978 A1 | 8/2014 | Yamazaki et al. |
| 2014/0273340 A1* | 9/2014 | Van Duren ....... H01L 21/30604 438/104 |
| 2015/0064840 A1 | 3/2015 | Shimomura et al. |
| 2015/0076491 A1 | 3/2015 | Yamazaki |
| 2015/0079728 A1 | 3/2015 | Yamazaki |

FOREIGN PATENT DOCUMENTS

| | | | |
|---|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |

(56) References Cited

FOREIGN PATENT DOCUMENTS

| JP | 2011-146698 A | 7/2011 |
|---|---|---|
| WO | WO-2004/114391 | 12/2004 |

OTHER PUBLICATIONS

Coates.D et al., "Optical Studies of the Amorphous Liquid-Cholesteric Liquid Crystal Transition:The "Blue Phase"", Physics Letters, Sep. 10, 1973, vol. 45A, No. 2, pp. 115-116.
Meiboom.S et al., "Theory of the Blue Phase of Cholesteric Liquid Crystals", Phys. Rev. Lett. (Physical Review Letters), May 4, 1981, vol. 46, No. 18, pp. 1216-1219.
Costello.M et al., "Electron Microscopy of a Cholesteric Liquid Crystal and Its Blue Phase", Phys. Rev. A (Physical Review. A), May 1, 1984, vol. 29, No. 5, pp. 2957-2959.
Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.
Nakamura.M et al., "The phase relations in the In2O3—Ga2ZnO4—ZnO system at 1350° C.", Journal of Solid State Chemistry, Aug. 1, 1991, vol. 93, No. 2, pp. 298-315.
Kitzerow.H et al., "Observation of Blue Phases in Chiral Networks", Liquid Crystals, 1993, vol. 14, No. 3, pp. 911-916.
Kimizuka.N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System", Journal of Solid State Chemistry, Apr. 1, 1995, vol. 116, No. 1, pp. 170-178.
Chern.H et al., "An Analytical Model for the Above-Threshold Characteristics of Polysilicon Thin-Film Transistors", IEEE Transactions on Electron Devices, Jul. 1, 1995, vol. 42, No. 7, pp. 1240-1246.
Prins.M et al., "A Ferroelectric Transparent Thin-Film Transistor", Appl. Phys. Lett. (Applied Physics Letters), Jun. 17, 1996, vol. 68, No. 25, pp. 3650-3652.
Li.C et al., "Modulated Structures of Homologous Compounds InMO3(ZnO)m (M=In,Ga; m=Integer)Described by Four-Dimensional Superspace Group", Journal of Solid State Chemistry, 1998, vol. 139, pp. 347-355.
Kikuchi.H et al., "Polymer-Stabilized Liquid Crystal Blue Phases", Nature Materials, Sep. 2, 2002, vol. 1, pp. 64-68.
Tsuda.K et al., "Ultra Low Power Consumption Technologies for Mobile TFT-LCDs ", IDW '02 : Proceedings of the 9th International Display Workshops, Dec. 4, 2002, pp. 295-298.
Nomura.K et al., "Thin-Film Transistor Fabricated in Single-Crystalline Transparent Oxide Semiconductor", Science, May 23, 2003, vol. 300, No. 5623, pp. 1269-1272.
Ikeda.T et al., "Full-Functional System Liquid Crystal Display Using CG-Silicon Technology", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors", Nature, Nov. 25, 2004, vol. 432, pp. 488-492.
Dembo.H et al., "RFCPUS on Glass and Plastic Substrates Fabricated by TFT Transfer Technology", IEDM 05: Technical Digest of International Electron Devices Meeting, Dec. 5, 2005, pp. 1067-1069.
Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.
Lee.H et al., "Current Status of, Challenges to, and Perspective View of AM-OLED", IDW '06 : Proceedings of the 13th International Display Workshops, Dec. 7, 2006, pp. 663-666.
Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.
Hirao.T et al., "Novel Top-Gate Zinc Oxide Thin-Film Transistors (ZnO TFTS) for AMLCDs", J. Soc. Inf. Display (Journal of the Society for Information Display), 2007, vol. 15, No. 1, pp. 17-22.
Park.S et al., "Challenge to Future Displays: Transparent AM-OLED Driven by Peald Grown ZnO TFT", IMID '07 Digest, 2007, pp. 1249-1252.
Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.
Miyasaka.M, "SUFTLA Flexible Microelectronics on Their Way to Business", SID Digest '07 : SID International Symposium Digest of Technical Papers, 2007, vol. 38, pp. 1673-1676.
Kurokawa.Y et al., "UHF RFCPUS on Flexible and Glass Substrates for Secure RFID Systems", Journal of Solid-State Circuits , 2008, vol. 43, No. 1, pp. 292-299.
Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.
Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.
Park.J et al., "Amorphous Indium-Gallium-Zinc Oxide TFTs and Their Application for Large Size AMOLED", AM-FPD '08 Digest of Technical Papers, Jul. 2, 2008, pp. 275-278.
Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.
Sakata.J et al., "Development of 4.0-in. AMOLED Display With Driver Circuit Using Amorphous In—Ga—Zn-Oxide TFTs", IDW '09 : Proceedings of the 16th International Display Workshops, 2009, pp. 689-692.
Asaoka.Y et al., "29.1: Polarizer-Free Reflective LCD Combined With Ultra Low-Power Driving Technology", SID Digest '09 : SID International Symposium Digest of Technical Papers, May 31, 2009, pp. 395-398.
Nowatari.H et al., "60.2: Intermediate Connector With Suppressed Voltage Loss for White Tandem OLEDs", SID Digest '09 : SID International Symposium Digest of Technical Papers, May 31, 2009, pp. 899-902.
Jin.D et al., "65.2:Distinguished Paper:World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.
Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.
Cho.D et al., "21.2:Al and Sn-Doped Zinc Indium Oxide Thin Film Transistors for AMOLED Back-Plane", SID Digest '09 : SID International Symposium Digest of Technical Papers, May 31, 2009, pp. 280-283.
Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.
Osada.T et al., "15.2: Development of Driver-Integrated Panel using Amorphous In—Ga—Zn-Oxide TFT", SID Digest '09 : SID International Symposium Digest of Technical Papers, May 31, 2009, pp. 184-187.
Ohara.H et al., "21.3:4.0 in. QVGA AMOLED Display Using In—Ga—Zn-Oxide TFTs With a Novel Passivation Layer", SID Digest '09 : SID International Symposium Digest of Technical Papers, May 31, 2009, pp. 284-287.
Godo.H et al:, "P-9:Numerical Analysis on Temperature Dependence of Characteristics of Amorphous In—Ga—Zn-Oxide TFT", SID Digest '09 : SID International Symposium Digest of Technical Papers, May 31, 2009, pp. 1110-1112.
Osada.T et al., "Development of Driver-Integrated Panel Using Amorphous In—Ga—Zn-Oxide TFT", AM-FPD '09 Digest of Technical Papers, Jul. 1, 2009, pp. 33-36.

(56) References Cited

OTHER PUBLICATIONS

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, The Japan Society of Applied Physics.

Park.J et al., "High performance amorphous oxide thin film transistors with self-aligned top-gate structure", IEDM 09: Technical Digest of International Electron Devices Meeting, Dec. 7, 2009, pp. 191-194.

Nakamura.M, "Synthesis of Homologous Compound with New Long-Period Structure", NIRIM Newsletter, Mar. 1, 1995, vol. 150, pp. 1-4.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Orita.M et al., "Amorphous transparent conductive oxide $InGaO_3(ZnO)m$ (m<4):a Zn4s conductor", Philosophical Magazine, 2001, vol. 81, No. 5, pp. 501-515.

Janotti.A et al., "Oxygen Vacancies in ZnO", Appl. Phys. Lett. (Applied Physics Letters), 2005, vol. 87, pp. 122102-1-122102-3.

Clark.S et al., "First Principles Methods Using CASTEP", Zeitschrift fur Kristallographie, 2005, vol. 220, pp. 567-570.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Janotti.A et al., "Native Point Defects in ZnO", Phys. Rev. B (Physical Review. B), Oct. 4, 2007, vol. 76, No. 16, pp. 165202-1-165202-22.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Oba.F et al., "Defect energetics in ZnO: A hybrid Hartree-Fock density functional study", Phys. Rev. B (Physical Review. B), 2008, vol. 77, pp. 245202-1-245202-6.

Kim.S et al., "High-Performance oxide thin film transistors passivated by various gas plasmas", 214th ECS Meeting, 2008, No. 2317, ECS.

Hayashi.R et al., "42.1: Invited Paper: Improved Amorphous In—Ga—Zn—O TFTs", SID Digest '08 : SID International Symposium Digest of Technical Papers, May 20, 2008, pp. 621-624.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Park.Sang-Hee et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, pp. 629-632.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Mo.Y et al., "Amorphous Oxide TFT Backplanes for Large Size AMOLED Displays", IDW '08 : Proceedings of the 6th International Display Workshops, Dec. 3, 2008, pp. 581-584.

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

Fortunato.E et al., "Wide-Bandgap High-Mobility ZnO Thin-Film Transistors Produced at Room Temperature", Appl. Phys. Lett. (Applied Physics Letters), Sep. 27, 2004, vol. 85, No. 13, pp. 2541-2543.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Nomura.K et al., "Carrier transport in transparent oxide semiconductor with intrinsic structural randomness probed using single-crystalline $InGaO_3(ZnO)5$ films", Appl. Phys. Lett. (Applied Physics Letters), Sep. 13, 2004, vol. 85, No. 11, pp. 1993-1995.

Nomura.K et al., "Growth mechanism for single-crystalline thin film of $InGaO_3(ZnO)5$ by reactive solid-phase epitaxy", J. Appl. Phys. (Journal of Applied Physics), May 15, 2004, vol. 95, No. 10, pp. 5532-5539.

Chung.Y et al., "High performance AMOLED Displays base on a-IGZO TFTs with high mobility by MOCVD technology", IMID 2013 (The 13th International Meeting on Information Display), Aug. 26, 2013, pp. 354-355.

Nicolay.S et al., "Growth Model of MOCVD Polycrystalline ZnO", Crystal Gronth & Design, Nov. 1, 2009, vol. 9, No. 11, pp. 4957-4962.

* cited by examiner

FIG. 21A
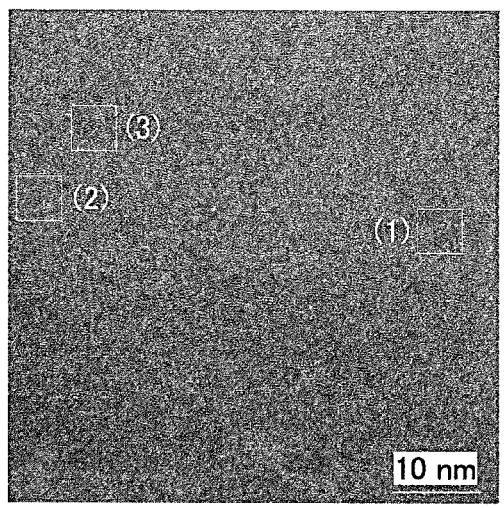
FIG. 21B    FIG. 21C    FIG. 21D
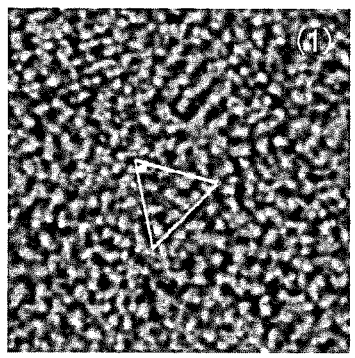 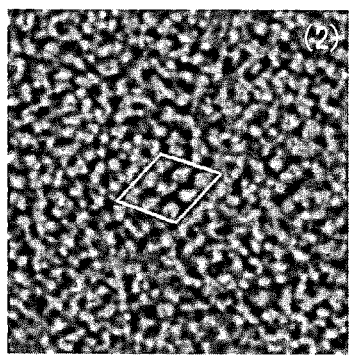 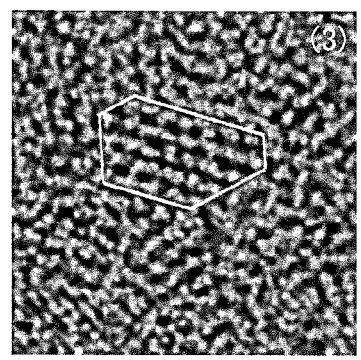

Electron beam incident in a direction
substantially parallel to
a sample surface Electron beam incident in a direction
substantially perpendicular to
a sample surface

METHOD OF MANUFACTURING SEMICONDUCTOR DEVICE

BACKGROUND OF THE INVENTION

1. Field of the Invention

The present invention relates to an object, a method, or a manufacturing method. The present invention relates to a process, a machine, manufacture, or a composition of matter. In particular, one embodiment of the present invention relates to a semiconductor device or a method of manufacturing the semiconductor device.

In this specification and the like, the term "semiconductor device" means all devices that can operate by utilizing semiconductor characteristics. An electro-optical device, an image display device (also referred to as a display device), a semiconductor circuit, a light-emitting device, a power storage device, a memory device, or an electronic device include a semiconductor device in some cases.

2. Description of the Related Art

A technique in which a transistor is formed using a semiconductor layer has attracted attention. The transistor is used in a wide range of electronic devices such as an integrated circuit (IC) and a display device. As semiconductor materials applicable to the transistor, silicon-based semiconductor materials have been widely used, but oxide semiconductors have attracted attention as alternative materials.

Formation of an oxide semiconductor film having crystallinity has been studied. For example, according to Non-Patent Document 1, an InGaO$_3$(ZnO)$_5$ thin film is formed by a PLD method over a single crystal thin film of ZnO formed over a YSZ substrate, and subjected to heat treatment at 1400° C. to have a single crystal structure. According to a technique disclosed in Patent Document 1, a single-component oxide semiconductor layer is formed over a substrate; crystal growth is carried out from a surface to an inside by heat treatment at 500° C. or higher and 1000° C. or lower, so that the single-component oxide semiconductor layer includes a single crystal region; and a multi-component oxide semiconductor layer including a single crystal region is formed over the single-component oxide semiconductor layer including a single crystal region. The multi-component oxide semiconductor layer formed in this manner is used for a transistor.

REFERENCE

Patent Document

[Patent Document 1] Japanese Published Patent Application No. 2011-146698

Non-Patent Document

[Non-Patent Document 1] Kenji Nomura et al., J. Appl. Phys. Vol. 95, pp. 5532-5539 (2004)

SUMMARY OF THE INVENTION

In a transistor including an oxide semiconductor, a defect in an oxide semiconductor layer or a bond of the defect with hydrogen or the like might cause a carrier in a film, which might change the electrical characteristics of the transistor.

In view of the above, an object of one embodiment of the present invention is to provide an oxide semiconductor layer in which the number of defects is reduced. Another object is to improve the reliability of a transistor including an oxide semiconductor. Another object is to improve electrical characteristics of a semiconductor device or the like including an oxide semiconductor. Another object is to provide a novel semiconductor device or the like.

Note that the descriptions of these objects do not disturb the existence of other objects. Note that in one embodiment of the present invention, there is no need to achieve all the objects. Objects other than the above objects will be apparent from and can be derived from the description of the specification and the like.

An oxygen vacancy is given as a carrier supply source of an oxide semiconductor. Oxygen vacancies contained in the oxide semiconductor appear as localized states in deep energy levels in the energy gap of the oxide semiconductor. When carriers are trapped by such localized states, electrical characteristics of the transistor degrade; for example, the transistor becomes normally-on, or has an increased leakage current or a threshold voltage shifted by stress application. To improve the reliability of the transistor, it is necessary to reduce the number of oxygen vacancies in the oxide semiconductor.

A factor that forms an oxygen vacancy in an oxide semiconductor layer is plasma damage during formation of the oxide semiconductor layer. For example, in the case where plasma is used to form an oxide semiconductor layer containing indium, the oxide semiconductor layer might be damaged by the plasma and an In—O—In bond having the weakest bonding might be cut, which causes an oxygen vacancy.

Accordingly, in one embodiment of the present invention, a method without using plasma is employed for forming an oxide semiconductor layer in which a channel is formed; thus, plasma damage to the oxide semiconductor layer is prevented and the oxide semiconductor layer has fewer defects. The method without using plasma is, for example, a thermal chemical vapor deposition (thermal CVD) method. In one embodiment of the present invention, by epitaxial growth in which the first oxide semiconductor layer containing a single metal element as a constituent element is used as a seed crystal, the second oxide semiconductor layer containing two or more metal elements as constituent elements is formed. The first oxide semiconductor layer containing a single metal element as a constituent element is crystallized more easily than the second oxide semiconductor layer containing two or more metal elements as constituent elements, and serves a seed crystal having high crystallinity. Thus, the second oxide semiconductor layer in which plasma damage is suppressed and which has high crystallinity can be formed with high productivity.

More specifically, for example, the following manufacturing method can be employed.

One embodiment of the present invention is a method of manufacturing a semiconductor device, including the steps of: forming a first oxide semiconductor layer containing a single metal element as a constituent element over a substrate by a thermal chemical vapor deposition method; and forming a second oxide semiconductor layer containing two or more metal elements as constituent elements successively after the first oxide semiconductor layer is formed. The second oxide semiconductor layer is formed by epitaxial growth using the first oxide semiconductor layer as a seed crystal.

Another embodiment of the present invention is a method of manufacturing a semiconductor device, including the steps of: forming a first oxide semiconductor layer containing a single metal element as a constituent element over a substrate by a metal organic chemical vapor deposition method; and forming a second oxide semiconductor layer containing two or more metal elements as constituent elements successively after the first oxide semiconductor layer is formed. The second oxide semiconductor layer is formed by epitaxial growth using the first oxide semiconductor layer as a seed crystal.

In the methods of manufacturing a semiconductor device, the first oxide semiconductor layer and the second oxide semiconductor layer are preferably formed in the same deposition chamber.

Another embodiment of the present invention is a method of manufacturing a semiconductor device, including the steps of: forming a first oxide semiconductor layer containing a single metal element as a constituent element over a substrate by a thermal chemical vapor deposition method; forming a second oxide semiconductor layer containing two or more metal elements as constituent elements successively after the first oxide semiconductor layer is formed; forming a source electrode layer and a drain electrode layer which are electrically connected to the second oxide semiconductor layer; forming a gate insulating layer in contact with the second oxide semiconductor layer; and forming a gate electrode layer facing the second oxide semiconductor layer with the gate insulating layer located therebetween. The second oxide semiconductor layer is formed by epitaxial growth using the first oxide semiconductor layer as a seed crystal.

Another embodiment of the present invention is a method of manufacturing a semiconductor device, including the steps of: forming a gate electrode layer over a substrate; forming a gate insulating layer in contact with the gate electrode layer; forming a first oxide semiconductor layer containing a single metal element as a constituent element in a position facing the gate electrode layer with the gate insulating layer located therebetween, by a thermal chemical vapor deposition method; forming a second oxide semiconductor layer containing two or more metal elements as constituent elements successively after the first oxide semiconductor layer is formed; and forming a source electrode layer and a drain electrode layer which are electrically connected to the second oxide semiconductor layer. The second oxide semiconductor layer is formed by epitaxial growth using the first oxide semiconductor layer as a seed crystal.

In the methods of manufacturing a semiconductor device, a metal organic chemical vapor deposition method can be used as the thermal chemical vapor deposition method.

In the methods of manufacturing a semiconductor device, the thickness of the first oxide semiconductor layer can be 0.1-atomic-layer thick or larger and 20-atomic-layer thick or smaller.

In the methods of manufacturing a semiconductor device, a film having a region whose electron affinity is higher than an electron affinity of the first oxide semiconductor layer is preferably formed as the second oxide semiconductor layer.

In the methods of manufacturing a semiconductor device, a zinc oxide layer having a hexagonal-crystal structure at the surface is preferably formed as the first oxide semiconductor layer.

In the method of manufacturing a semiconductor device, an In-M-Zn oxide layer (M is Al, Ti, Ga, Y, Zr, La, Ce, Nd, or Hf) is preferably formed as the second oxide semiconductor layer.

In the method of manufacturing a semiconductor device, the temperature for forming the first oxide semiconductor layer and the second oxide semiconductor layer may be 400° C. or higher and 800° C. or lower.

One embodiment of the present invention can provide an oxide semiconductor layer in which the number of defects is reduced. One embodiment of the present invention can improve the reliability of a transistor including an oxide semiconductor. One embodiment of the present invention can improve electrical characteristics of a semiconductor device or the like including an oxide semiconductor. Note that one embodiment of the present invention is not limited to these effects. For example, depending on circumstances or conditions, one embodiment of the present invention might produce another effect. Furthermore, depending on circumstances or conditions, one embodiment of the present invention might not produce the above effects.

BRIEF DESCRIPTION OF THE DRAWINGS

FIGS. 21A to 21D are Cs-corrected high-resolution TEM images of a plane of a CAAC-OS layer.

DETAILED DESCRIPTION OF THE INVENTION

Figure 1A:
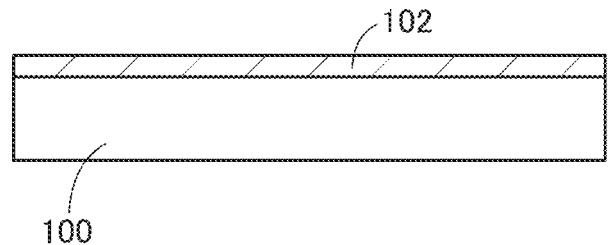
FIGS. 1A to 1D illustrate a method of forming an oxide semiconductor layer of one embodiment of the present invention.

Embodiments of the present invention will be described below in detail with reference to the drawings. Note that the present invention is not limited to the following description. It will be readily understood by those skilled in the art that modes and details of the present invention can be changed in various ways without departing from the spirit and scope of the present invention. Therefore, the present invention should not be interpreted as being limited to the description of the following embodiments. In addition, in the following embodiments, the same portions or portions having similar functions are denoted by the same reference numerals or the same hatching patterns in different drawings, and description thereof will not be repeated.

Note that in each drawing described in this specification, the size, the film thickness, or the region of each component is exaggerated for clarity in some cases. Therefore, the scale is not necessarily limited to that illustrated in the drawings and the like.

In this specification and the like, ordinal numbers such as "first", "second", and the like are used in order to avoid confusion among components, and the terms do not limit the components numerically. Therefore, for example, description can be made even when "first" is replaced with "second" or "third", as appropriate.

Functions of a "source" and a "drain" are sometimes replaced with each other when the direction of current flowing is changed in circuit operation, for example. Therefore, the terms "source" and "drain" can be replaced with each other in this specification and the like.

In this specification and the like, the terms "over" and "below" do not necessarily mean that a component is placed "directly on" or "directly under" another component. For example, the expression "a gate electrode layer over a gate insulating film" can mean the case where there is an additional component between the gate insulating film and the gate electrode layer. The same applies to the term "below".

In this specification and the like, the term "parallel" indicates that the angle formed between two straight lines is greater than or equal to −10° and less than or equal to 10°, and accordingly includes the case where the angle is greater than or equal to −5° and less than or equal to 5°. The term "substantially parallel" indicates that an angle formed between two straight lines is greater than or equal to −30 and less than or equal to 30°. The term "perpendicular" indicates that the angle formed between two straight lines is greater than or equal to 80° and less than or equal to 100°, and accordingly includes the case where the angle is greater than or equal to 85° and less than or equal to 95°. The term "substantially perpendicular" indicates that the angle formed between two straight lines is greater than or equal to 60° and less than or equal to 120°.

In this specification and the like, the trigonal and rhombohedral crystal systems are included in the hexagonal crystal system.

(Embodiment 1)

In this embodiment, a method of forming an oxide semiconductor layer that can be used in a semiconductor device of one embodiment of the present invention will be described with reference to drawings.

In one embodiment of the present invention, a first oxide semiconductor layer containing a single metal element as a constituent element is formed over a substrate, and a second oxide semiconductor layer containing two or more metal elements as constituent elements is formed by epitaxial growth using the first oxide semiconductor layer as a seed crystal. Here, a thermal CVD method is employed for the formation of the first oxide semiconductor layer and the second oxide semiconductor layer. The thermal CVD method is different from a plasma CVD method by which a source gas of a main component of a film is decomposed by plasma. By the thermal CVD method, a source gas is decomposed by heating over a heated substrate; thus, in the oxide semiconductor layer formed by the thermal CVD method, plasma damage is prevented and the number of defects is reduced. Furthermore, plasma damage at an interface between a lower layer of the oxide semiconductor layer and an insulating layer in contact with the lower layer can be inhibited. For example, in the case where a channel of a transistor is formed in the oxide semiconductor layer, change in electrical characteristics of the transistor can be suppressed.

Note that the thermal CVD method can be classified into a metal CVD (MCVD) method and a metal organic CVD (MOCVD) method depending on a source gas. To form oxide semiconductor layers having a crystal part as the first oxide semiconductor layer and the second oxide semiconductor layer, it is preferable to use an MOCVD method by which a gas containing an organic metal that is a main component is decomposed and deposited. Here, a thermal decomposition method is employed for decomposing a gas containing an organic metal. The methods of forming the first oxide semiconductor layer and the second oxide semiconductor layer are not limited to these methods, and a method by which plasma damage during the deposition is prevented or reduced can be used as appropriate. For example, an atomic layer deposition (ALD) method may be used.

<Method of Forming Stacked Structure Including Oxide Semiconductor Layers>

A method of forming an oxide semiconductor layer of one embodiment of the present invention and an insulating layer in contact with the oxide semiconductor layer will be described below with reference to FIGS. 1A to 1D and FIGS. 2A and 2B.

First, a substrate 100 is prepared. The substrate 100 is not limited to a single crystal substrate as long as the substrate has heat resistance high enough to withstand heat treatment in the process of manufacturing a semiconductor device. For example, a glass substrate, a ceramic substrate, a quartz substrate, a sapphire substrate, an yttria-stabilized zirconia (YSZ) substrate, an SOI substrate, or a substrate of a semiconductor such as silicon, silicon carbide, gallium nitride, or gallium oxide can be used as the substrate 100, as appropriate.

A first insulating layer 102 is formed over the substrate 100 (see FIG. 1A). The first insulating layer 102 has a function of preventing impurity diffusion from the substrate 100. The first insulating layer 102 preferably contains oxygen, more preferably contains oxygen more than that in the stoichiometric composition, in which case, oxygen can be supplied to a first oxide semiconductor layer or a second oxide semiconductor layer to be formed later over the first insulating layer 102.

As the first insulating layer 102, for example, a single layer or a stacked layer of an insulating film containing aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide may be used.

A surface of the first insulating layer 102 may be planarized. For example, the first insulating layer 102 may be subjected to planarization treatment such as chemical mechanical polishing (CMP) treatment. By the CMP treatment, the first insulating layer 102 has an average surface roughness ($R_a$) of less than or equal to 1 nm, preferably less than or equal to 0.3 nm, more preferably less than or equal to 0.1 nm. With $R_a$ of less than or equal to the above value, the crystallinity of a first oxide semiconductor layer 104 and/or a second oxide semiconductor layer 106 to be formed later may be improved. $R_a$ can be measured with an atomic force microscope (AFM). Note that the first insulating layer 102 is not necessarily formed.

The first insulating layer 102 can be formed by a sputtering method, a CVD method, a molecular beam epitaxy (MBE) method, an atomic layer deposition (ALD) method, or a pulsed laser deposition (PLD) method, for example. A thermal CVD method is preferably used to reduce plasma damage to the deposited film or the first or second oxide semiconductor layer formed over the first insulating layer 102.

Alternatively, in the case where a silicon substrate is used as the substrate 100, the insulating layer to be the first insulating layer 102 may be formed by a thermal oxidation method.

Figure 1B:
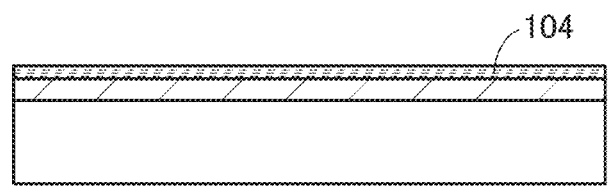

Next, the first oxide semiconductor layer 104 is formed over the first insulating layer 102 (see FIG. 1B).

An oxide semiconductor material containing a single metal element as a constituent element is preferably used for the first oxide semiconductor layer 104. More preferably, an oxide semiconductor material which contains a single metal element as a constituent element and which can have a hexagonal-crystal structure is used. The first oxide semiconductor layer 104 needs to have a crystal part, preferably a single crystal region because it is used as a seed crystal for forming the second oxide semiconductor layer to be formed later. The oxide semiconductor material containing a single metal element as a constituent element is crystallized more easily and can have higher crystallinity than an oxide semiconductor material containing two or more metal elements as constituent elements does. For this reason, the oxide semiconductor material containing a single metal element can be suitably used for the first oxide semiconductor layer 104. A typical example of the oxide semiconductor material is a zinc oxide.

Note that the oxide semiconductor material containing a single metal element as a constituent element (main component) may contain an element other than the metal element and oxygen as impurity. In that case, the concentration of the impurity is preferably 0.1% or lower. For example, when a zinc oxide layer is formed as the first oxide semiconductor layer 104, it might contain an element other than zinc and oxygen as impurity at 0.1% or lower. The same applies to an oxide semiconductor material containing two or more metal elements as constituent elements.

Alternatively, the first oxide semiconductor layer 104 is preferably formed with an oxide semiconductor material whose lattice constant in a single crystal state is close to that of the second oxide semiconductor layer in a single crystal state. The first oxide semiconductor layer 104 has a lattice constant close to that of the second oxide semiconductor layer, so that lattice mismatch with the second oxide semiconductor layer can be small and generation of lattice defects can be suppressed.

The case where a zinc oxide layer is formed as the first oxide semiconductor layer 104 is described below in this embodiment. Note that the first oxide semiconductor layer 104 is not limited to a zinc oxide layer.

The first oxide semiconductor layer 104 can be formed by a method without using plasma. In this embodiment, the zinc oxide layer is formed by an MOCVD method using an organometallic gas containing zinc and a gas containing oxygen. As the organometallic gas containing zinc, diethylzinc or dimethylzinc can be used, for example. As the gas containing oxygen, a dinitrogen monoxide gas, an oxygen gas, or ozone can be used, for example. Note that source gases that can be used are not limited thereto.

The first oxide semiconductor layer 104 is used as a seed crystal for crystal growth of the second oxide semiconductor layer to be formed later. Therefore, the thickness of the first oxide semiconductor layer 104 may be a thickness with which crystal growth is possible, and typically 0.1-atomic-layer thick or larger and 20-atomic-layer thick or smaller, preferably 1-atomic-layer thick or larger and 5-atomic-layer thick or smaller. The first oxide semiconductor layer 104 is preferably thin, in which case throughput in deposition can be improved. Note that in this specification and the like, the expression "the thickness of the first oxide semiconductor layer 104 is 0.1-atomic-layer thick or larger and less than 1-atomic-layer thick" can mean that the layer whose thickness is 1-atomic-layer thick or larger is partly deposited in a film formation region.

The atmosphere for forming the first oxide semiconductor layer 104 can be an inert gas atmosphere such as a rare gas (typically argon). To prevent impurity from entering the first oxide semiconductor layer 104, a deposition gas is preferably highly purified. It is preferable to highly purify a gas containing oxygen and an inert gas used as deposition gases such that the dew point is −40° C. or lower, preferably −80° C. or lower, more preferably −100° C. or lower, still more preferably −120° C. or lower.

The substrate temperature for forming the first oxide semiconductor layer 104 is 110° C. or higher, preferably 150° C. or higher, more preferably 200° C. or higher. For example, when a zinc oxide layer is formed as the first oxide semiconductor layer 104 at a substrate temperature of 110° C. or higher, oxygen particles and zinc particles move over a surface on which a film is to be formed and form a hexagonal-crystal zinc oxide. Crystal growth of a zinc oxide is fast in the direction parallel to the a-b plane. When the substrate temperature is 110° C. or higher, preferably 150° C. or higher, more preferably 200° C. or higher, crystal growth of the hexagonal-crystal zinc oxide proceeds in the direction parallel to the surface of the substrate 100 (i.e., the lateral direction in the cross section of the zinc oxide layer). As a result, a hexagonal-crystal zinc oxide layer which has a single crystal region is formed. By setting the substrate temperature high, impurity in the first oxide semiconductor layer 104 can be reduced; thus, the crystallinity of the first oxide semiconductor layer 104 can be improved. For example, when an oxide semiconductor layer which is single crystal or substantially single crystal is formed as the first oxide semiconductor layer 104, the substrate temperature is set to 400° C. or higher, preferably 500° C. or higher.

In terms of deposition rate and productivity, the substrate temperature is preferably 800° C. or lower. A zinc oxide is likely to evaporate under a reduced-pressure atmosphere at 600° C. or higher. For this reason, when the substrate temperature is 600° C. or higher, evaporation of a zinc oxide partly occurs, so that the hexagonal-crystal zinc oxide layer might have a region where the zinc oxide layer is not formed (a region where the first insulating layer 102 is exposed) and do not cover the entire surface of the substrate 100. Thus, the substrate temperature is preferably lower than 600° C.

Figure 2A:
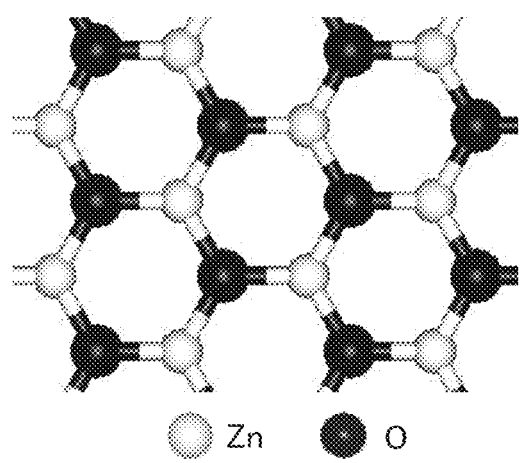
FIGS. 2A and 2B are schematic views illustrating an oxide semiconductor layer of one embodiment of the present invention.
Figure 2B:
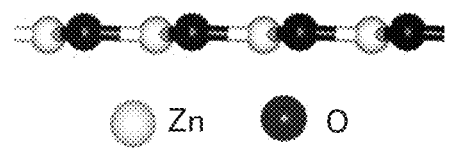

FIG. 2A illustrates a model of a top-view shape of the hexagonal-crystal zinc oxide layer, and FIG. 2B illustrates a model of a cross-sectional shape thereof. As illustrated in FIGS. 2A and 2B, Zn atoms and O atoms are bound in a hexagonal shape in the hexagonal-crystal zinc oxide layer. The binding of Zn atoms and O atoms in the hexagonal shape extends over the a-b plane. As described above, since crystal growth of a zinc oxide is fast in the direction parallel to the a-b plane, crystal growth proceeds first in the direction parallel to the surface (a-b plane). At this time, in the a-b plane, crystal growth occurs in the lateral direction to form a single crystal region. Next, crystal growth proceeds in the c-axis direction which is perpendicular to the surface (a-b plane), using the single crystal region formed in the surface (a-b plane) as a seed crystal. Accordingly, a zinc oxide is likely to have c-axis alignment.

Figure 1C:
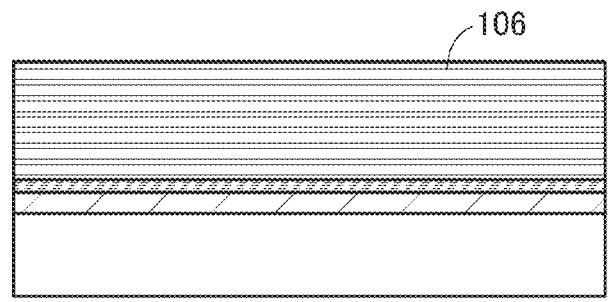

Next, by epitaxial growth using the first oxide semiconductor layer 104 as a crystal seed, a second oxide semiconductor layer 106 is formed over the first oxide semiconductor layer 104 (see FIG. 1C). The second oxide semiconductor layer 106 is formed by a method without using plasma (e.g., a thermal CVD method).

The second oxide semiconductor layer 106 is formed successively after the first oxide semiconductor layer 104 is formed, without exposure to the air. Thus, an impurity (e.g., hydrogen or a hydrogen compound in adsorbed water) can be prevented from entering an interface between the first oxide semiconductor layer 104 and the second oxide semiconductor layer 106. Note that although the first oxide semiconductor layer 104 and the second oxide semiconductor layer 106 may be formed in different deposition chambers as long as they are not exposed to the air, it is preferable that the first oxide semiconductor layer 104 and the second oxide semiconductor layer 106 be formed successively in the same chamber because the productivity of a semiconductor device can be improved. In addition, entry of impurity at the time of transfer can be prevented.

In the case where the first oxide semiconductor layer 104 and the second oxide semiconductor layer 106 are formed in the same deposition chamber, it is preferable that deposition conditions (e.g., deposition temperature) for the oxide semiconductor layers be partly or entirely the same because the productivity is improved. Furthermore, it is preferable that the first oxide semiconductor layer 104 and the second oxide semiconductor layer 106 be both formed by an MOCVD method, in which case they can have different compositions by changing the flow rates of source gases.

For the second oxide semiconductor layer 106, an oxide semiconductor material containing two or more metal elements as constituent elements is preferably used; an oxide semiconductor material containing at least indium as a constituent element is more preferably used; an oxide semiconductor material containing at least indium and zinc as constituent elements is still more preferably used. Still further preferably, an In-M-Zn oxide (M is Al, Ti, Ga, Y, Zr, La, Ce, Nd, or Hf) is used for the second oxide semiconductor layer 106. The element M is an element that can increase the energy gap of an oxide, for example. Thus, the energy gap of the oxide can be controlled by adjusting the composition of M in the In-M-Zn oxide.

The atmosphere in the formation of the second oxide semiconductor layer 106 can be an inert gas (e.g., a rare gas) atmosphere. As in the formation of the first oxide semiconductor layer 104, it is preferable that a deposition chamber be highly vacuum-evacuated and a deposition gas be highly purified in order to prevent an impurity from entering the second oxide semiconductor layer 106.

In this embodiment, an In—Ga—Zn oxide layer is formed as the second oxide semiconductor layer 106 by an MOCVD method using an organometallic gas containing indium, an organometallic gas containing gallium, an organometallic gas containing zinc, and a gas containing oxygen. For example, trimethylindium can be used as the organometallic material containing indium; trimethylgallium or triethylgallium can be used as the organometallic material containing gallium; diethylzinc or dimethylzinc can be used as the organometallic material containing zinc; and a dinitrogen monoxide gas, an oxygen gas, or ozone can be used as the gas containing oxygen. The hexagonal-crystal zinc oxide layer has high crystallinity and the lattice constant in the a-b plane direction is close to that of an In—Ga—Zn oxide. Since a hexagonal-crystal zinc oxide has a hexagonal lattice structure, epitaxial growth of the In—Ga—Zn oxide having a hexagonal lattice structure can be carried out over the zinc oxide layer. Therefore, with use of the hexagonal-crystal zinc oxide layer as a seed crystal, the In—Ga—Zn oxide layer having high crystallinity can be firmed. Note that the source gases that can be used are not limited to these. Furthermore, an oxide semiconductor material other than the In—Ga—Zn oxide can be used for the second oxide semiconductor layer 106.

Since the first oxide semiconductor layer 104 has a hexagonal-crystal structure at its surface, when the mixed source gas described above reaches the surface of the first oxide semiconductor layer 104 while the second oxide semiconductor layer 106 is deposited, thermal decomposition and/or chemical reaction occurs, and the second oxide semiconductor layer 106 is formed in the same manner as the first oxide semiconductor layer 104. Thus, the second oxide semiconductor layer 106 with high crystallinity can be formed even with an oxide semiconductor material which contains two or more metal elements as constituent elements and which is relatively difficult to crystallize. When the first oxide semiconductor layer 104 has a single crystal region or is a single crystal layer (substantially a single crystal layer), the second oxide semiconductor layer 106, which results from the epitaxial growth using the first oxide semiconductor layer 104, also can have a single crystal region or can be a single crystal layer (substantially a single crystal layer).

The substrate temperature for forming the second oxide semiconductor layer 106 is 110° C. or higher, preferably 150° C. or higher, more preferably 200° C. or higher. By setting the substrate temperature high, impurities in the second oxide semiconductor layer 106 can be reduced; thus, the crystallinity of the second oxide semiconductor layer 106 can be improved. For example, in the case where an oxide semiconductor layer which is a single crystal layer or substantially a single crystal layer is formed as the second oxide semiconductor layer 106, the substrate temperature is 400° C. or higher, preferably 500° C. or higher. In terms of deposition rate and productivity, the substrate temperature is preferably 800° C. or lower. In terms of evaporation of a zinc oxide, the substrate temperature is preferably lower than 600° C.

Figure 1D:
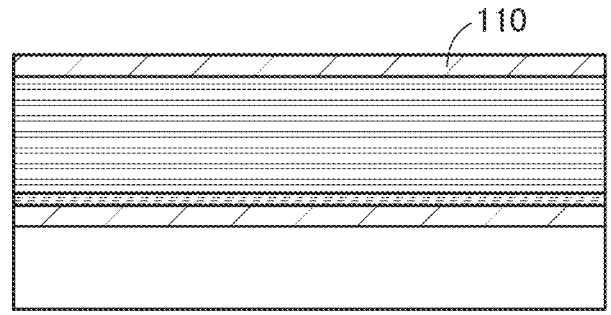

Next, a second insulating layer 110 is formed over the second oxide semiconductor layer 106 (see FIG. 1D).

As the second insulating layer 110, for example, a single layer or a stacked layer of an insulating film containing aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide may be used.

The second insulating layer 110 may be formed by a sputtering method, a CVD method, a pulsed laser deposition method, or the like. It is preferable to use a thermal CVD method to reduce plasma damage to the deposited film or the first oxide semiconductor layer 104 or the second oxide semiconductor layer 106 under the second insulating layer 110.

Through the above steps, a stacked structure including oxide semiconductor layers of one embodiment of the present invention can be formed.

By a CVD method, the composition of a film can be controlled by a flow rate of a source gas. For example, by an MCVD method or an MOCVD method, a film with a desired composition can be formed by adjusting the flow rate of a source gas. Furthermore, for example, by an MCVD method or an MOCVD method, a film whose composition is gradually changed can be formed by changing the flow rate of a source gas during deposition. In the case where a film is deposited while the flow rate of a source gas is changed, the time for film formation can be shorter than in the case where a film is deposited using a plurality of deposition chambers because time for transferring the substrate and time for adjusting the pressure are not needed. Thus, a semiconductor device can be manufactured with improved productivity.

For example, the second oxide semiconductor layer 106 is deposited while the flow rate of a source gas is changed, in which case the composition of the second oxide semiconductor layer 106 can be changed in the thickness direction. In the case where an In-M-Zn oxide layer is formed as the second oxide semiconductor layer 106, the band structure of the second oxide semiconductor layer 106 can be controlled by adjusting the proportion of the element M which has a function of making the energy gap of an oxide large. Specifically, for example, in the case where an In—Ga—Zn oxide layer is formed as the second oxide semiconductor layer 106, by setting the flow rate of an organometallic gas containing Ga to be small, the oxide semiconductor layer has a small band gap. In this case, the electron affinity (an energy difference between the vacuum level and the bottom of the conduction band) of the second oxide semiconductor layer 106 can be high. The energy at the top of the valence band of the In—Ga—Zn oxide can be controlled by adjusting the proportion of zinc, for example. In the case where an In—Ga—Zn oxide layer is formed as the second oxide semiconductor layer 106, by setting the flow rate of an organometallic gas containing Ga to be large, the oxide semiconductor layer has a large band gap. In this case, the electron affinity of the second oxide semiconductor layer 106 can be low.

Figure 3A:
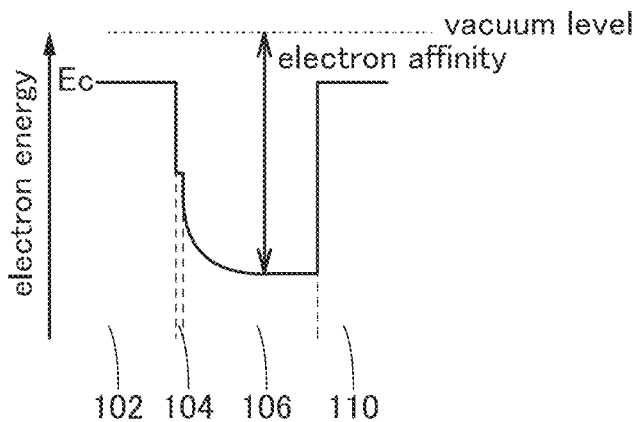
FIGS. 3A to 3C each illustrate a band structure of oxide semiconductor layers of one embodiment of the present invention.
Figure 3B:
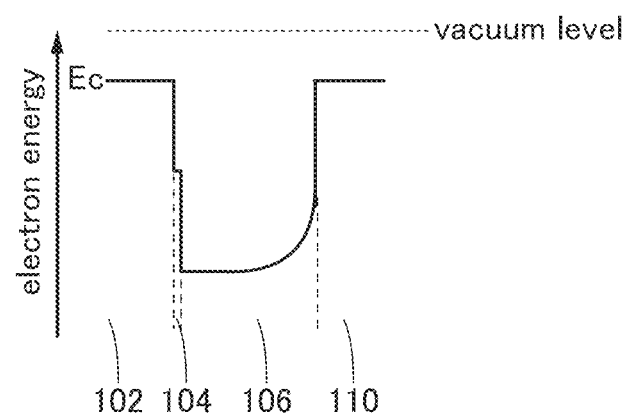
Figure 3C:
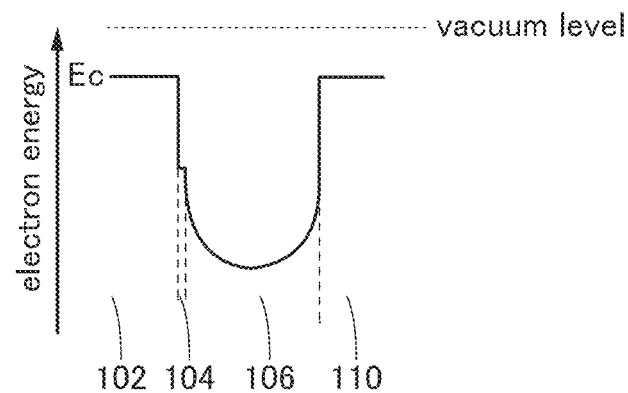

FIGS. 3A to 3C illustrate examples of a band structure of the second oxide semiconductor layer 106 in the case where the flow rate of a source gas is changed during the deposition.

FIGS. 3A to 3C each illustrate a band structure of a stacked structure in the thickness direction including the first insulating layer 102, the first oxide semiconductor layer 104, the second oxide semiconductor layer 106, and the second insulating layer 110. For easy understanding, each band structure shows energy (Ec) at bottoms of conduction bands of the first insulating layer 102, the first oxide semiconductor layer 104, the second oxide semiconductor layer 106, and the second insulating layer 110.

In the band structure of the second oxide semiconductor layer 106 in FIG. 3A, energy is continuously changed near an interface with the first oxide semiconductor layer 104 (continuous junction). Specifically, near the interface with the first oxide semiconductor layer 104, the electron affinity becomes larger as the bottom of the conduction band of the second oxide semiconductor layer 106 is farther from the first oxide semiconductor layer 104. Near the interface with the second insulating layer 110, energy at the bottom of the conduction band of the second oxide semiconductor layer 106 is constant, and the electron affinity is also constant.

For example, in the case where an In-M-Zn oxide layer (M is Al, Ti, Ga, Y, Zr, La, Ce, Nd, or Hf) is formed as the second oxide semiconductor layer 106, the second oxide semiconductor layer 106 has a concentration gradient such that, near the interface with the first oxide semiconductor layer 104, the concentration of the element M is lower as the second oxide semiconductor layer 106 is farther from the first oxide semiconductor layer 104, and near the interface with the second insulating layer 110, the concentration of the element M is constant (or substantially constant). In that case, the band structure of the second oxide semiconductor layer 106 illustrated in FIG. 3A might be formed. Note that the concentration of the element M in the second oxide semiconductor layer 106 can be measured by secondary ion mass spectrometry (SIMS), for example.

In the case where an insulating layer including a constituent element (e.g., silicon) which is different from that of an oxide semiconductor is provided as the first insulating layer 102, an interface state due to junction of different kinds of materials, entry of an impurity, or the like might be formed at the interface with the first oxide semiconductor layer 104. In the case where the first insulating layer 102 is formed by a method using plasma (e.g., a plasma CVD method or a sputtering method), an interface state due to plasma damage might be formed in the first insulating layer 102 or near the interface between the first insulating layer 102 and the first oxide semiconductor layer 104. Since the first oxide semiconductor layer 104 is used as a seed crystal and has an extremely small thickness (typically, the thickness is 0.1-atomic-layer thick or larger and 20-atomic-layer thick or smaller), the interface state might affect the second oxide semiconductor layer 106 depending on the bonding state between the first oxide semiconductor layer 104 and the second oxide semiconductor layer 106.

In a transistor employing the band structure illustrated in FIG. 3A, the channel is less likely to be affected by the interface state and on-state current is less likely to be decreased by the interface state. This is because a channel is formed in a region of the second oxide semiconductor layer 106 which is far from the interface with the first oxide semiconductor layer 104 and has the highest electron affinity. Therefore, the transistor can have high on-state current and low S value. Furthermore, a difference in energy at the bottom of the conduction band exists between the channel and the interface between the first insulating layer 102 and the first oxide semiconductor layer 104 at which an interface state might be formed; thus, carriers are not easily trapped in the interface state. Thus, change in the electrical characteristics due to the interface state does not easily occur, so that the transistor can have high reliability.

The band structure of the second oxide semiconductor layer 106 in FIG. 3B has continuous junction near an interface with the second insulating layer 110. Specifically, near the interface with the second insulating layer 110, the electron affinity becomes larger as the bottom of the conduction band of the second oxide semiconductor layer 106 is farther from the second insulating layer 110. Near the interface with the first oxide semiconductor layer 104, energy at the bottom of the conduction band of the second oxide semiconductor layer 106 is constant, and the electron affinity is also constant.

For example, in the case where an In-M-Zn oxide layer (M is Al, Ti, Ga, Y, Zr, La, Ce, Nd, or Hf) is formed as the second oxide semiconductor layer 106, the second oxide semiconductor layer 106 has a concentration gradient such that, near the interface with the second insulating layer 110, the concentration of the element M is lower as the second oxide semiconductor layer 106 is farther from the second insulating layer 110, and near the interface with the first oxide semiconductor layer 104, the concentration of the element M is constant (or substantially constant). In that case, the band structure of the second oxide semiconductor layer 106 illustrated in FIG. 3B might be formed.

In the case where an insulating layer including a constituent element (e.g., silicon) which is different from that of an oxide semiconductor is provided as the second insulating layer 110, an interface state due to junction of different kinds of materials, entry of an impurity, or the like might be formed at the interface with the second oxide semiconductor layer 106, like at the interface between the first insulating layer 102 and the first oxide semiconductor layer 104. In the case where the second insulating layer is formed by a method using plasma (e.g., a plasma CVD method or a sputtering method), an interface state due to plasma damage might be formed in the second insulating layer 110 or near the interface between the second insulating layer 110 and the second oxide semiconductor layer 106.

In a transistor employing the band structure illustrated in FIG. 3B, the channel is less likely to be affected by the interface state and on-state current is less likely to be decreased by the interface state. This is because a channel can be formed in a region of the second oxide semiconductor layer 106 which is far from the interface with the second insulating layer 110 and has the highest electron affinity. Therefore, the transistor can have high on-state current and low S value. Furthermore, a difference in energy at the bottom of the conduction band exists between the channel and the interface between the second insulating layer 110 and the second oxide semiconductor layer 106 at which an interface state might be formed; thus, carriers are not easily trapped in the interface state. Thus, change in the electrical characteristics due to the interface state does not easily occur, so that the transistor can have high reliability.

The band structure of the second oxide semiconductor layer 106 in FIG. 3C has continuous junction near an interface with the first oxide semiconductor layer 104 and near an interface with the second insulating layer 110. Specifically, near the interface with the first oxide semiconductor layer 104, the electron affinity becomes larger as the bottom of the conduction band of the second oxide semiconductor layer 106 is farther from the first oxide semiconductor layer 104; near the interface with the second insulating layer 110, the electron affinity becomes larger as the bottom of the conduction band of the second oxide semiconductor layer 106 is farther from the second insulating layer 110.

For example, in the case where an In-M-Zn oxide layer (M is Al, Ti, Ga, Y, Zr, La, Ce, Nd, or Hf) is formed as the second oxide semiconductor layer 106, the second oxide semiconductor layer 106 has a concentration gradient such that, near the interface with the second insulating layer 110, the concentration of the element M is lower as the second oxide semiconductor layer 106 is farther from the second insulating layer 110, and also near the interface with the first oxide semiconductor layer 104, the concentration of the element M is lower as the second oxide semiconductor layer 106 is farther from the first oxide semiconductor layer 104. In that case, the band structure of the second oxide semiconductor layer 106 illustrated in FIG. 3C might be formed.

In a transistor employing the band structure illustrated in FIG. 3C, the channel in the second oxide semiconductor layer 106 is formed in a region that is apart from an interface states that might occur at the interfaces (the interface between the first insulating layer 102 and the first oxide semiconductor layer 104 and the interface between the second oxide semiconductor layer 106 and the second insulating layer 110). Therefore, the transistor can have high on-state current and low S value. Thus, change in the electrical characteristics due to the interface state does not easily occur, so that the transistor can have high reliability.

Note that the band structure of the stacked structure described in this embodiment is not limited to the band structures illustrated in FIGS. 3A to 3C. The composition and electron affinity of the second oxide semiconductor layer 106 can be changed as appropriate as long as the second oxide semiconductor layer 106 has a region whose electron affinity is higher than that of the first oxide semiconductor layer 104. For example, a band structure may be employed in which the electron affinity of the second oxide semiconductor layer 106 becomes higher as the distance from a layer in contact with the second oxide semiconductor layer 106 (the first oxide semiconductor layer 104 and/or the second insulating layer 110) is smaller. In the case where this band structure is employed for a transistor and the electron affinity on the back-channel side is high, high on-state current can be obtained at low gate voltage; thus, the power consumption of the transistor can be low. Alternatively, when the electron affinity on the front-channel side is high, the transistor is sensitive to an electric field from a gate electrode; thus, on/off of the transistor can be quickly switched and the transistor can have low S value.

In the case of a band structure in which the electron affinity of the second oxide semiconductor layer 106 becomes higher as the distance from a layer in contact with the second oxide semiconductor layer 106 (the first oxide semiconductor layer 104 and/or the second insulating layer 110) is larger or smaller, the band structure may have a shoulder peak.

In the second oxide semiconductor layer 106, a constituent element of a region in contact with the first oxide semiconductor layer 104 may be different from a constituent element of a region in contact with the second insulating layer 110. In this case, the second oxide semiconductor layer 106 may have a stacked structure of layers having different constituent elements.

The oxide semiconductor layer of one embodiment of the present invention obtained by the above method is an oxide semiconductor layer in which plasma damage is prevented and the number of defects is reduced. With use of the oxide semiconductor layer for a channel of, for example, a semiconductor device, change in the electrical characteristics of the semiconductor device can be suppressed and the reliability thereof can be improved.

In the method of forming an oxide semiconductor layer of one embodiment of the present invention, the second oxide semiconductor layer can have higher crystallinity in the case where an oxide semiconductor material containing a single metal element as a constituent element is used for the first oxide semiconductor layer serving as a seed crystal, than in the case where the second oxide semiconductor layer has a single layer structure of an oxide semiconductor material containing two or more metal elements as constituent elements. Furthermore, the first oxide semiconductor layer, which is used as a seed crystal, is relatively easy to crystallize; thus, in the case where deposition is performed while the substrate is being heated, a substrate over which the oxide semiconductor layer having a crystal part is formed is not limited to a single crystal substrate and may be a substrate having an amorphous or polycrystalline surface.

Moreover, in the method of forming an oxide semiconductor layer, which is one embodiment of the present invention, deposition proceeds simultaneously with crystallization; thus, high temperature (e.g., higher than 1300° C.) heat treatment for the purpose of crystallization does not need to be performed after the formation of the first oxide semiconductor layer and/or the formation of the second oxide semiconductor layer. To perform heat treatment at a temperature higher than 1300° C., a muffle furnace provided with a ceramic partition wall needs to be used, for example, but such a furnace has the following problems: the productivity cannot be increased because it is difficult to increase the size of the furnace, and contamination to a substrate to be processed might be caused because it is difficult to keep the furnace clean. Therefore, the formation method of one embodiment of the present invention is effective.

The structures, the methods, and the like described in this embodiment can be combined as appropriate with any of the structures, the methods, and the like described in the other embodiments.

(Embodiment 2)

In this embodiment, described will be specific examples of a manufacturing apparatus with which an oxide semiconductor layer and the like of one embodiment of the present invention can be formed.

Figure 4A:
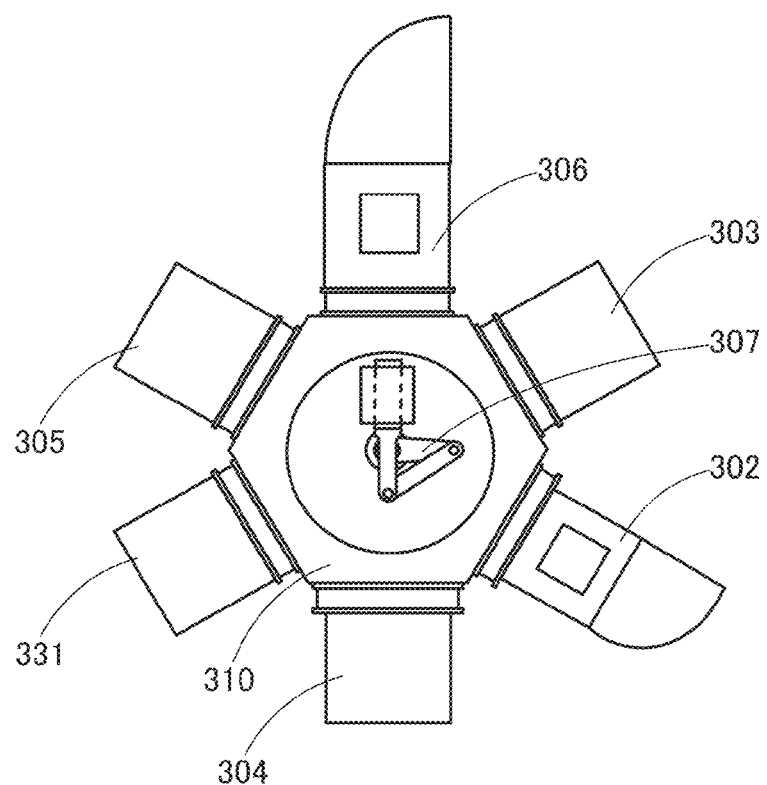
FIGS. 4A and 4B illustrate an apparatus for manufacturing a semiconductor device of one embodiment of the present invention.

A manufacturing apparatus illustrated in FIG. 4A includes at least a load chamber 302, a transfer chamber 310, a pretreatment chamber 303, a treatment chamber 331 which is a deposition chamber using a thermal CVD method, and an unload chamber 306. With the manufacturing apparatus illustrated in FIG. 4A, films can be formed successively without being exposed to the air. Therefore, in the case where a stacked structure is formed, an impurity can be prevented from entering a film or an interface between films. Note that in order to prevent, for example, attachment of moisture to inner walls of chambers (including a load chamber, a treatment chamber, a transfer chamber, a deposition chamber, and an unload chamber) of the manufacturing apparatus, the chambers are preferably filled with an inert gas (e.g., a nitrogen gas or a rare gas) whose dew point is lower than −60° C., preferably lower than −80° C., more preferably lower than −100° C. The pressure in the cambers is reduced to less than 1 Pa, preferably less than 0.1 Pa, more preferably less than $1 \times 10^{-4}$ Pa.

Like the treatment chamber 331, the treatment chamber 304 and/or a treatment chamber 305 may be a chamber using a thermal CVD method (also referred to as a thermal CVD apparatus).

For example, the first oxide semiconductor layer and the second oxide semiconductor layer are formed in the treatment chamber 331, the insulating layer is formed in the treatment chamber 304, and a conductive film is formed in the treatment chamber 305. In that case, a stacked structure of these layers can be formed successively without being exposed to the air.

First, a substrate is transferred to the load chamber 302. Next, the substrate is transferred to the pretreatment chamber 303 by a transfer unit 307 of the transfer chamber 310. In the pretreatment chamber 303, treatment for cleaning the substrate or heat treatment is performed. Then, the substrate is transferred to the treatment chamber 331 and the first oxide semiconductor layer and the second oxide semiconductor layer are formed. By the treatment in the pretreatment chamber 303, a surface of the substrate can be cleaned. Furthermore, the substrate and the layers are not exposed to the air in the process from the surface treatment of the substrate to the formation of the second oxide semiconductor layer, so that attachment of an impurity or the like to substrate surface can be prevented.

Next, the substrate is transferred to the treatment chamber 304 by the transfer unit 307, and an insulating layer such as a hafnium oxide layer is formed. The substrate is transferred to the treatment chamber 305 by the transfer unit 307 and a conductive film such as a tungsten film is formed. Then, the substrate is transferred to the unload chamber 306 by the transfer unit 307. Through the above steps, the first oxide semiconductor layer, the second oxide semiconductor layer, the insulating layer, and the conductive layer can be stacked in this order.

Figure 4B:
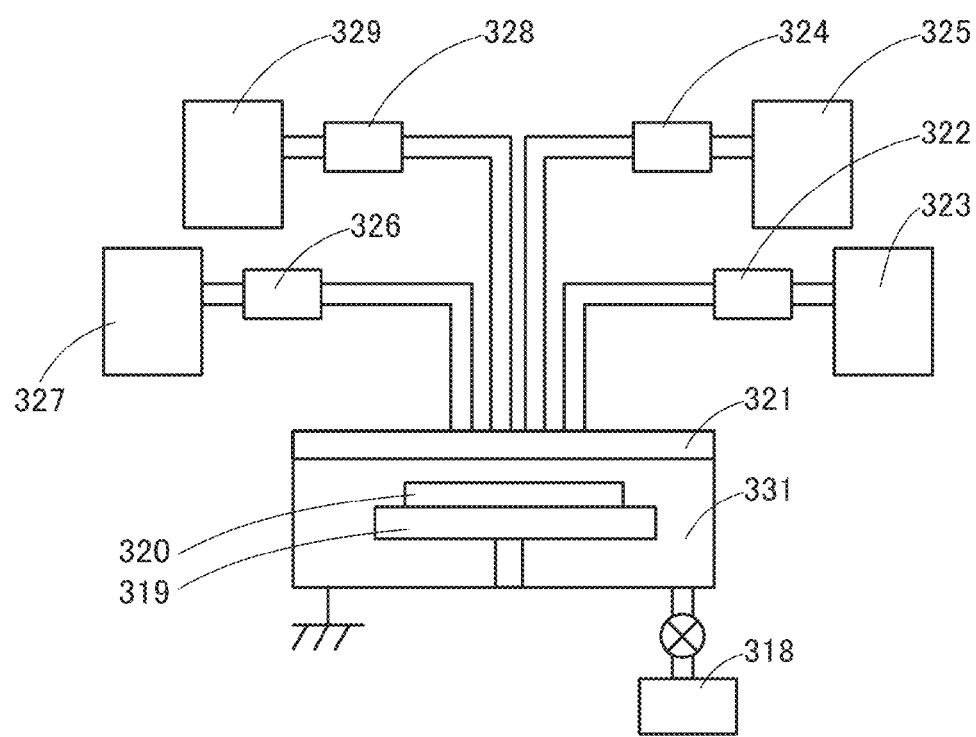

FIG. 4B illustrates an example of a thermal CVD apparatus. In the thermal CVD apparatus, oxidizer (e.g., $O_2$ or $O_3$), one kind or plural kinds of source gases, and the like are supplied at the same time to a chamber to which a substrate 320 is transferred; oxidizer, the gases, and the like react with one another near the substrate or at the surface of the substrate; and reaction products are deposited to form a film.

The treatment chamber 331 of the thermal CVD apparatus includes at least a substrate holder 319, a member 321 to which a plurality of source gas inlets is connected, and an exhaust unit 318. Each of the source gas inlets is connected to a source material supply portion (a source material supply portion 323, 325, 327, or 329) through a supply tube, a pressure regulator, a valve, and a flow controller (a flow controller 322, 324, 326, or 328). A gas outlet is connected to the exhaust unit 318 through a supply tube valve or a pressure regulator.

The atmosphere in the treatment chamber 331 during deposition may be an air atmosphere or a reduced-pressure atmosphere.

When a source gas is supplied, the source gas may be supplied through a plurality of openings formed like openings of a shower head.

To make the thickness of a film on the substrate uniform, the substrate 320 fixed on the substrate holder 319 may be rotated by rotating the substrate holder 319.

Since the thermal CVD method does not use plasma, a defect due to plasma is not formed in a film.

By the thermal CVD method, various films such as a conductive layer, a semiconductor layer, and an insulating layer can be formed. For example, in the case where an In—Ga—Zn oxide layer is formed, trimethylindium $((CH_3)_3In)$, trimethylgallium $((CH_3)_3Ga)$, dimethylzinc $((CH_3)_2Zn)$, and the like are used as source gases. Note that the combination of source gases for the In—Ga—Zn oxide film is not limited to the above. For example, triethylgallium $((C_2H_5)_3Ga)$ can be used instead of trimethylgallium, and diethylzine $((C_2H_5)_2Zn)$ can be used instead of dimethylzinc.

Although FIG. 4A illustrates an example of the multi-chamber manufacturing apparatus having the transfer chamber 310 whose top view is hexagonal, the top view of the transfer chamber 310 may be polygonal (e.g., heptagonal or octagonal) and more chambers may be connected to the transfer chamber 310. Alternatively, the top view of the transfer chamber 310 of the manufacturing apparatus may be pentagonal or tetragonal. Further alternatively, an in-line manufacturing apparatus in which the transfer chamber is omitted by connecting a plurality of chambers to each other may be used. The in-line manufacturing apparatus has high productivity because there is no transfer chamber and the transfer time can be shortened. Although FIG. 4A illustrates an example of the single wafer manufacturing apparatus, a batch-type deposition apparatus in which films are deposited over a plurality of substrates at a time may be used. In addition, a mechanism for cleaning (such as plasma cleaning) may be included in each treatment chamber.

In FIG. 4A, a thermal CVD apparatus is used as each of the treatment chambers 304, 305, and 331, but one of the treatment chambers may be another deposition apparatus such as a sputtering apparatus or an ALD apparatus.

The structures, the methods, and the like described in this embodiment can be combined as appropriate with any of the structures, the methods, and the like described in the other embodiments.

(Embodiment 3)

In this embodiment, the structure of a transistor of one embodiment of the present invention having the stacked structure described in Embodiment 1 will be described.

<Transistor Structure 1>

Figure 5A:
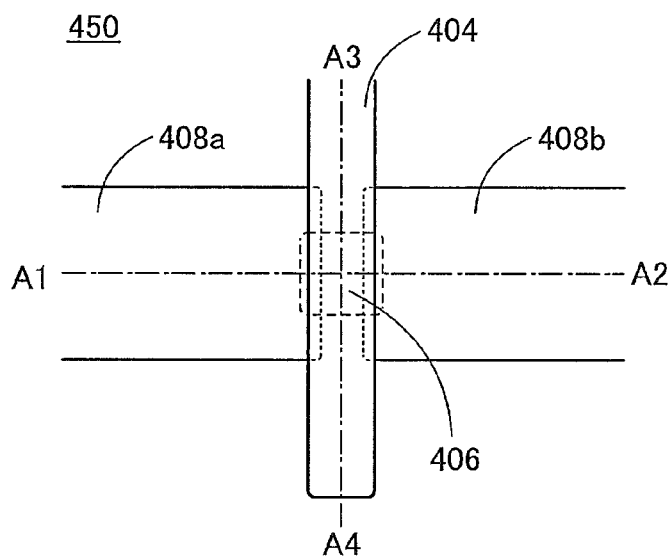
FIGS. 5A and 5B are a plan view and a cross-sectional view illustrating a transistor of one embodiment of the present invention.
Figure 5B:
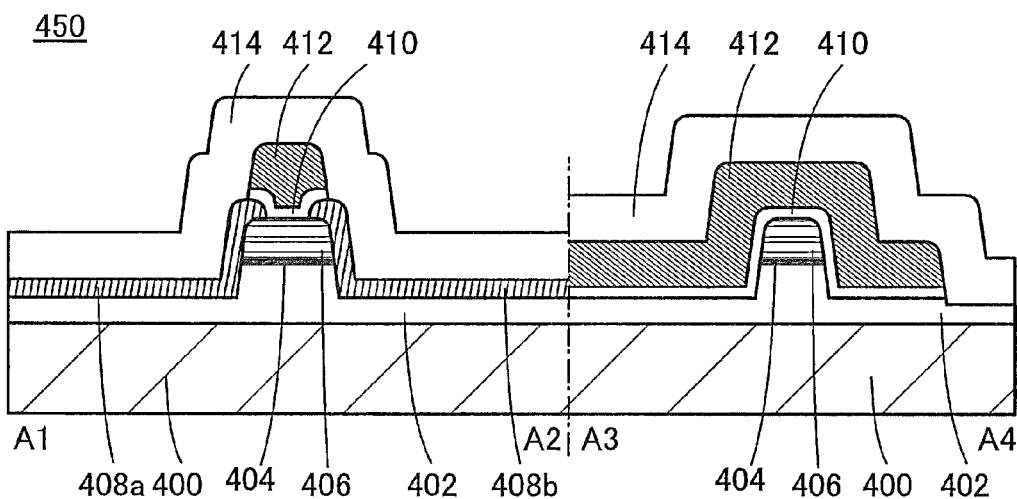

FIGS. 5A and 5B are a plan view and a cross-sectional view illustrating a transistor 450 of one embodiment of the present invention. FIG. 5A is a plan view and FIG. 5B is a cross-sectional view taken along dashed-dotted line A1-A2 and dashed-dotted line A3-A4 in FIG. 5A. Note that for simplification of the drawing, some components are not illustrated in the plan view in FIG. 5A.

The transistor 450 illustrated in FIGS. 5A and 5B includes an insulating layer 402 having a projecting portion over a substrate 400; a first oxide semiconductor layer 404 and a second oxide semiconductor layer 406 over the projecting portion of the insulating layer 402; a source electrode layer 408a and a drain electrode layer 408b which are in contact with side surfaces of the first oxide semiconductor layer 404 and a top surface and side surfaces of the second oxide semiconductor layer 406; an insulating layer 410 in contact with the second oxide semiconductor layer 406 over the source electrode layer 408a and the drain electrode layer 408b; and a gate electrode layer 412 which is in contact with a top surface of the insulating layer 410 and faces the side surfaces of the first oxide semiconductor layer 404 and the top surface and the side surfaces of the second oxide semiconductor layer 406. Note that an insulating layer 414 over the source electrode layer 408a, the drain electrode layer 408b, and the gate electrode layer 412 may be regarded as a component of the transistor 450. The insulating layer 402 does not necessarily have a projecting portion.

Note that at least part (or all) of the source electrode layer 408a (and/or the drain electrode layer 408b) is provided on at least part (or all) of a surface, side surfaces, a top surface, and/or a bottom surface of a semiconductor layer such as the second oxide semiconductor layer 406 (and/or the first oxide semiconductor layer 404).

Alternatively, at least part (or all) of the source electrode layer 408a (and/or the drain electrode layer 408b) is in contact with at least part (or all) of a surface, side surfaces, a top surface, and/or a bottom surface of a semiconductor layer such as the second oxide semiconductor layer 406 (and/or the first oxide semiconductor layer 404). Alternatively, at least part (or all) of the source electrode layer 408a (and/or the drain electrode layer 408b) is in contact with at least part (or all) of a semiconductor layer such as the second oxide semiconductor layer 406 (and/or the first oxide semiconductor layer 404).

Alternatively, at least part (or all) of the source electrode layer 408a (and/or the drain electrode layer 408b) is electrically connected to at least part (or all) of a surface, side surfaces, a top surface, and/or a bottom surface of a semiconductor layer such as the second oxide semiconductor layer 406 (and/or the first oxide semiconductor layer 404). Alternatively, at least part (or all) of the source electrode layer 408a (and/or the drain electrode layer 408b) is electrically connected to part (or all) of a semiconductor layer such as the second oxide semiconductor layer 406 (and/or the first oxide semiconductor layer 404).

Alternatively, at least part (or all) of the source electrode layer 408a (and/or the drain electrode layer 408b) is provided near at least part (or all) of a surface, side surfaces, a top surface, and/or a bottom surface of a semiconductor layer such as the second oxide semiconductor layer 406 (and/or the first oxide semiconductor layer 404). Alternatively, at least part (or all) of the source electrode layer 408a (and/or the drain electrode layer 408b) is provided near part (or all) of a semiconductor layer such as the second oxide semiconductor layer 406 (and/or the first oxide semiconductor layer 404).

Alternatively, at least part (or all) of the source electrode layer 408a (and/or the drain electrode layer 408b) is provided on a side of at least part (or all) of a surface, side surfaces, a top surface, and/or a bottom surface of a semiconductor layer such as the second oxide semiconductor layer 406 (and/or the first oxide semiconductor layer 404). Alternatively, at least part (or all) of the source electrode layer 408a (and/or the drain electrode layer 408b) is in provided on a side of part (or all) of a semiconductor layer such as the second oxide semiconductor layer 406 (and/or the first oxide semiconductor layer 404).

Alternatively, at least part (or all) of the source electrode layer 408a (and/or the drain electrode layer 408b) is provided obliquely above at least part (or all) of a surface, side surfaces, a top surface, and/or a bottom surface of a semiconductor layer such as the second oxide semiconductor layer 406 (and/or the first oxide semiconductor layer 404). Alternatively, at least part (or all) of the source electrode layer 408a (and/or the drain electrode layer 408b) is provided obliquely above part (or all) of a semiconductor layer such as the second oxide semiconductor layer 406 (and/or the first oxide semiconductor layer 404).

Alternatively, at least part (or all) of the source electrode layer 408a (and/or the drain electrode layer 408b) is provided above at least part (or all) of a surface, side surfaces, a top surface, and/or a bottom surface of a semiconductor layer such as the second oxide semiconductor layer 406 (and/or the first oxide semiconductor layer 404). Alternatively, at least part (or all) of the source electrode layer 408a (and/or the drain electrode layer 408b) is provided above part (or all) of a semiconductor layer such as the second oxide semiconductor layer 406 (and/or the first oxide semiconductor layer 404).

In the transistor 450 illustrated in FIGS. 5A and 5B, the insulating layer 402 corresponds to the first insulating layer 102 in Embodiment 1, the first oxide semiconductor layer 404 corresponds to the first oxide semiconductor layer 104 in Embodiment 1, the second oxide semiconductor layer 406 corresponds to the second oxide semiconductor layer 106 in Embodiment 1, and the insulating layer 410 functioning as a gate insulating layer corresponds to the second insulating layer 110 in Embodiment 1. Therefore, in the transistor 450, the second oxide semiconductor layer 406 has a crystal part resulting from epitaxial growth using the first oxide semiconductor layer 404 as a seed crystal, and a region whose electron affinity is higher than that of the first oxide semiconductor layer 404. In other words, in the transistor 450, the second oxide semiconductor layer 406 functions as a main current path (channel). The second oxide semiconductor layer 406 is an oxide semiconductor layer in which plasma damage is prevented and the number of defects is reduced.

As in FIG. 5B, side surfaces of the source electrode layer 408a and the drain electrode layer 408b are in contact with the side surfaces of the second oxide semiconductor layer 406 in which a channel is formed. In a cross section in the channel width direction, the gate electrode layer 412 is provided to face the top surface and the side surfaces of the second oxide semiconductor layer 406, and the second oxide semiconductor layer 406 can be electrically surrounded by an electric field of the gate electrode layer 412. Here, a structure of a transistor in which a channel is electrically surrounded by the electric field of the gate electrode layer 412 (or an electric field of the second oxide semiconductor layer 406 in which a channel is formed) is referred to as a surrounded channel (s-channel) structure. The transistor 450 has the s-channel structure, which enables to form a channel in the entire second oxide semiconductor layer 406 (bulk). In the s-channel structure, a large amount of current can flow between a source and a drain of a transistor, so that a high on-state current can be obtained.

The s-channel structure is suitable for a miniaturized transistor because a high on-state current can be obtained. A semiconductor device including the miniaturized transistor can have a high integration degree and high density. For example, the channel length of the transistor is preferably less than or equal to 40 nm, more preferably less than or equal to 30 nm, still more preferably less than or equal to 20 nm and the channel width of the transistor is preferably less than or equal to 40 nm, more preferably less than or equal to 30 nm, still more preferably less than or equal to 20 nm.

Note that a channel length refers to a distance between a source (a source region or a source electrode) and a drain (a drain region or a drain electrode) in a region where a semiconductor layer and a gate electrode layer overlap with each other in a plan view. Accordingly, in FIG. 5A, a channel length is a distance between the source electrode layer 408a and the drain electrode layer 408b in a region where the second oxide semiconductor layer 406 and the gate electrode layer 412 overlap with each other. A channel width refers to the width of a source or a drain in a region where a semiconductor layer and a gate electrode layer overlap with each other. Accordingly, in FIG. 5A, a channel width is a width of the source electrode layer 408a or the drain electrode layer 408b in a region where the second oxide semiconductor layer 406 and the gate electrode layer 412 overlap with each other.

The descriptions on the substrate 100, the first insulating layer 102, the first oxide semiconductor layer 104, the second oxide semiconductor layer 106, and the second insulating layer 110 can be referred to for the substrate 400, the insulating layer 402, the first oxide semiconductor layer 404, the second oxide semiconductor layer 406, and the insulating layer 410, respectively.

As the source electrode layer 408a and the drain electrode layer 408b illustrated, a conductive layer capable of extracting oxygen from the oxide semiconductor layer is preferably used. As an example of the conductive layer capable of extracting oxygen from the oxide semiconductor layer, a conductive layer containing aluminum, titanium, chromium, nickel, molybdenum, tantalum, tungsten, or the like can be given.

By the conductive layer capable of extracting oxygen from the oxide semiconductor layer, oxygen in the first oxide semiconductor layer 104 and/or the second oxide semiconductor layer 106 is released to form oxygen vacancies in the oxide semiconductor layer in some cases. Oxygen is more likely to be extracted as the temperature is higher. Since the process of manufacturing a transistor involves some heat treatment steps, oxygen vacancies are likely to be formed in a region of the oxide semiconductor layer, which is in contact with the source electrode layer or the drain electrode layer. Furthermore, hydrogen enters sites of oxygen vacancies by heating, and thus the oxide semiconductor layer becomes n-type in some cases. Thus, due to the source electrode layer and the drain electrode layer, the resistance of a region where the oxide semiconductor layer is in contact with the source electrode layer or the drain electrode layer is reduced, so that the on-state resistance of the transistor can be reduced.

In the case where a transistor with a short channel length (e.g., less than or equal to 200 nm, or less than or equal to 100 nm) is manufactured, a source and a drain might be short-circuited due to formation of an n-type region. Therefore, in the case where a transistor with a short channel length is manufactured, a conductive layer capable of moderately extracting oxygen from the oxide semiconductor layer may be used as the source electrode layer and the drain electrode layer. As the conductive layer capable of moderately extracting oxygen, a conductive layer containing nickel, molybdenum, or tungsten can be used, for example.

Furthermore, in the case where a transistor with an extremely short channel length (less than or equal to 40 nm, or less than or equal to 30 nm) is manufactured, a conductive layer which hardly extracts oxygen from the oxide semiconductor layer may be used as the source electrode layer 408a and the drain electrode layer 408b. As the conductive layer which hardly extracts oxygen from the oxide semiconductor layer, a conductive layer containing tantalum nitride, titanium nitride, or ruthenium can be used, for example. Note that plural kinds of conductive layers may be stacked.

The gate electrode layer 412 may be formed using a conductive layer containing one or more of aluminum, titanium, chromium, cobalt, nickel, copper, yttrium, zirconium, molybdenum, ruthenium, silver, tantalum, tungsten, and the like.

As the insulating layer 414, for example, a single layer or a stacked layer of an insulating layer containing aluminum oxide, magnesium oxide, silicon oxide, silicon oxynitride, silicon nitride oxide, silicon nitride, gallium oxide, germanium oxide, yttrium oxide, zirconium oxide, lanthanum oxide, neodymium oxide, hafnium oxide, or tantalum oxide may be used.

An oxide semiconductor that can be used for the second oxide semiconductor layer 406 in which a channel is formed will be described below.

In the case where an oxide semiconductor containing two or more metal elements as constituent elements is used for the second oxide semiconductor layer 406, the oxide semiconductor preferably contains at least indium. An oxide can have high carrier mobility (electron mobility) by containing indium, for example. More preferably, the oxide semiconductor layer contains the element M. The element M is preferably aluminum, gallium, yttrium, tin, or the like. Other elements that can be used as the element M are, for example, titanium, zirconium, lanthanum, cerium, neodymium, and hafnium. Note that two or more of the above elements may be used in combination as the element M. The element M is an element having a high bonding energy with oxygen, for example. The element M is an element that can increase the energy gap of the oxide, for example. Furthermore, the oxide semiconductor layer preferably contains zinc. When the oxide contains zinc, the oxide is likely to be crystallized, for example.

Note that the oxide contained in the second oxide semiconductor layer 406 is not limited to the oxide containing indium. The second oxide semiconductor layer 406 may contain, for example, zinc tin oxide or gallium tin oxide.

An oxide with a wide energy gap is used for the second oxide semiconductor layer 406. The energy gap of the second oxide semiconductor layer 406 is, for example, 2.5 eV or larger and 4.2 eV or smaller, preferably 2.8 eV or larger and 3.8 eV or smaller, more preferably 3 eV or larger and 3.5 eV or smaller.

An influence of impurities in the oxide semiconductor layer where a channel is formed is described below. To obtain stable electrical characteristics of a transistor, it is effective to reduce the concentration of impurities in the second oxide semiconductor layer 406 (including an interface) so that the second oxide semiconductor layer 406 has a lower carrier density and is highly purified. The carrier density of the second oxide semiconductor layer 406 is lower than $1\times10^{17}/cm^3$, lower than $1\times10^{15}/cm^3$, or lower than $1\times10^{13}/cm^3$. To reduce the concentration of impurities in the second oxide semiconductor layer 406, the concentrations of impurities in adjacent layers are preferably reduced.

For example, silicon in the second oxide semiconductor layer 406 might serve as a carrier trap or a carrier generation source. The concentration of silicon in a region between the second oxide semiconductor layer 406 and the insulating layer 410 measured by SIMS is lower than $1\times10^{19}$ atoms/$cm^3$, preferably lower than $5\times10^{18}$ atoms/$cm^3$, more preferably lower than $2\times10^{18}$ atoms/$cm^3$.

When hydrogen is contained in the second oxide semiconductor layer 406, the carrier density is increased in some cases. Thus, the concentration of hydrogen in the second oxide semiconductor layer 406, measured by SIMS is lower than or equal to $2\times10^{20}$ atoms/$cm^3$, preferably lower than or equal to $5\times10^{19}$ atoms/$cm^3$, more preferably lower than or equal to $1\times10^{19}$ atoms/$cm^3$, further more preferably lower than or equal to $5\times10^{18}$ atoms/$cm^3$. When nitrogen is contained in the second oxide semiconductor layer 406, the carrier density is increased in some cases. The concentration of nitrogen in the second oxide semiconductor layer 406 measured by SIMS is lower than $5\times10^{19}$ atoms/$cm^3$, preferably lower than or equal to $5\times10^{18}$ atoms/$cm^3$, more preferably lower than or equal to $1\times10^{18}$ atoms/$cm^3$, further more preferably lower than or equal to $5\times10^{17}$ atoms/$cm^3$.

The thickness of the first oxide semiconductor layer 404 is extremely small; thus, an impurity contained in the first oxide semiconductor layer 404 might affect the channel. Therefore, the silicon concentration, the hydrogen concentration, and the nitrogen concentration in the first oxide semiconductor layer 404 are preferably reduced as well as those in the second oxide semiconductor layer 406.

To reduce the hydrogen concentration in the first oxide semiconductor layer 404 and the second oxide semiconductor layer 406, it is preferable to reduce the hydrogen concentration in the insulating layer 402 and the insulating layer 410. The hydrogen concentration in the insulating layer 402 and the insulating layer 410 measured by SIMS is $2\times10^{20}$ atoms/$cm^3$ or lower, preferably $5\times10^{19}$ atoms/$cm^3$ or lower, more preferably $1\times10^{19}$ atoms/$cm^3$ or lower, still more preferably $5\times10^{18}$ atoms/$cm^3$ or lower. To reduce the nitrogen concentration in the first oxide semiconductor layer 404 and the second oxide semiconductor layer 406, it is preferable to reduce the nitrogen concentration in the insulating layer 402 and the insulating layer 410. The nitrogen concentration in the insulating layer 402 and the insulating layer 410 measured by SIMS is lower than $5\times10^{19}$ atoms/$cm^3$, preferably $5\times10^{18}$ atoms/$cm^3$ or lower, more preferably $1\times10^{18}$ atoms/$cm^3$ or lower, still more preferably $5\times10^{17}$ atoms/$cm^3$ or lower.

Next, a crystal part included in the first oxide semiconductor layer 104 or the second oxide semiconductor layer 406 will be described.

An oxide semiconductor layer is classified into a single crystal oxide semiconductor layer and a non-single-crystal oxide semiconductor layer. Examples of a non-single-crystal oxide semiconductor layer include a c-axis aligned crystalline oxide semiconductor (CAAC-OS) layer, a polycrystalline oxide semiconductor layer, a microcrystalline oxide semiconductor layer, and an amorphous oxide semiconductor layer.

From another perspective, an oxide semiconductor layer is classified into an amorphous oxide semiconductor layer and a crystalline oxide semiconductor layer. Examples of a crystalline oxide semiconductor layer include a single crystal oxide semiconductor layer, a CAAC-OS layer, a polycrystalline oxide semiconductor layer, and a microcrystalline oxide semiconductor layer.

<CAAC-OS Layer>

First, a CAAC-OS layer is described. Note that a CAAC-OS layer can be referred to as an oxide semiconductor layer including c-axis aligned nanocrystals (CANC).

A CAAC-OS layer is one of oxide semiconductor layers having a plurality of c-axis aligned crystal parts (also referred to as pellets).

In a combined analysis image (also referred to as a high-resolution TEM image) of a bright-field image and a diffraction pattern of a CAAC-OS layer, which is obtained using a transmission electron microscope (TEM), a plurality of pellets can be observed. However, in the high-resolution TEM image, a boundary between pellets, that is, a grain boundary is not clearly observed. Thus, in the CAAC-OS layer, a reduction in electron mobility due to the grain boundary is less likely to occur.

Figure 20A:
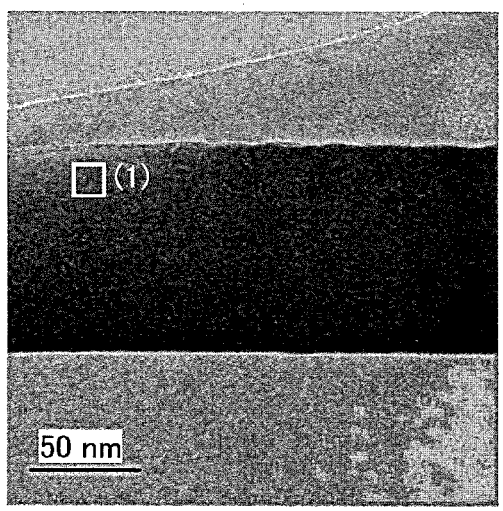
FIGS. 20A to 20D are Cs-corrected high-resolution TEM images of a cross section of a CAAC-OS layer and a cross-sectional schematic view of the CAAC-OS layer.

The CAAC-OS layer observed with a TEM is described below. FIG. 20A shows an example of a high-resolution TEM image of a cross section of the CAAC-OS layer which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 20B:
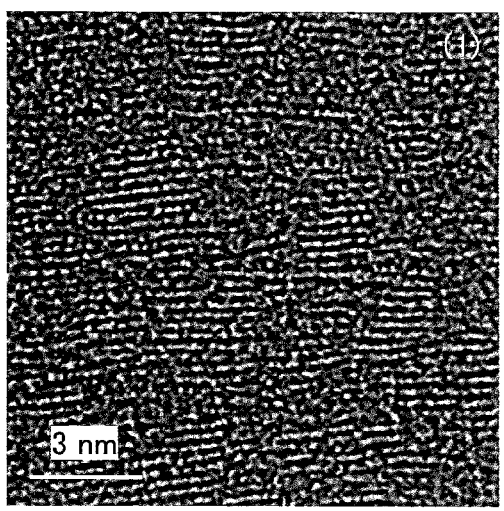

FIG. 20B is an enlarged Cs-corrected high-resolution TEM image of a region (1) in FIG. 20A. FIG. 20B shows that metal atoms are arranged in a layered manner in a pellet.

Each metal atom layer has a configuration reflecting unevenness of a surface over which the CAAC-OS layer is formed (hereinafter, the surface is referred to as a formation surface) or a top surface of the CAAC-OS layer, and is arranged parallel to the formation surface or the top surface of the CAAC-OS.

Figure 20C:
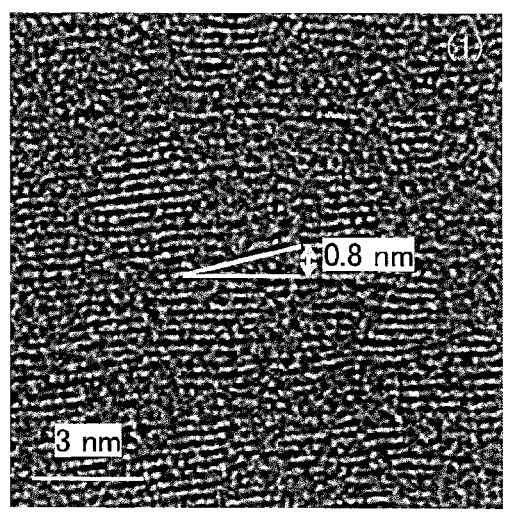

As shown in FIG. 20B, the CAAC-OS layer has a characteristic atomic arrangement. The characteristic atomic arrangement is denoted by an auxiliary line in FIG. 20C. FIGS. 20B and 20C prove that the size of a pellet is approximately 1 nm to 3 nm, and the size of a space caused by tilt of the pellets is approximately 0.8 nm. Therefore, the pellet can be referred to as a nanocrystal (nc).

Figure 20D:
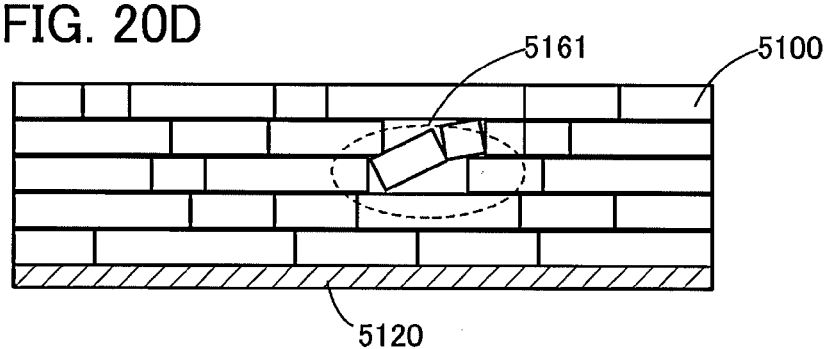

Here, according to the Cs-corrected high-resolution TEM images, the schematic arrangement of pellets 5100 of a CAAC-OS layer over a substrate 5120 is illustrated by such a structure in which bricks or blocks are stacked (see FIG. 20D). The part in which the pellets are tilted as observed in FIG. 20C corresponds to a region 5161 shown in FIG. 20D.

FIG. 21A shows a Cs-corrected high-resolution TEM image of a plane of the CAAC-OS layer observed from a direction substantially perpendicular to the sample surface. FIGS. 21B, 21C, and 21D are enlarged Cs-corrected high-resolution TEM images of regions (1), (2), and (3) in FIG. 21A, respectively. FIGS. 21B, 21C, and 21D indicate that metal atoms are arranged in a triangular, quadrangular, or hexagonal configuration in a pellet. However, there is no regularity of arrangement of metal atoms between different pellets.

Figure 22A:
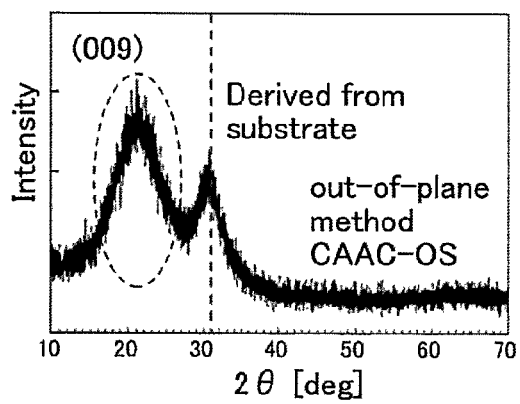
FIGS. 22A to 22C show structural analysis of a CAAC-OS layer and a single crystal oxide semiconductor by XRD.

Next, the CAAC-OS layer analyzed by X-ray diffraction (XRD) is described. For example, when the structure of a CAAC-OS layer including an InGaZnO$_4$ crystal is analyzed by an out-of-plane method, a peak appears at a diffraction angle (2θ) of around 31° as shown in FIG. 22A. This peak is derived from the (009) plane of the InGaZnO$_4$ crystal, which indicates that crystals in the CAAC-OS layer have c-axis alignment, and that the c-axes are aligned in a direction substantially perpendicular to the formation surface or the top surface of the CAAC-OS layer.

Note that in structural analysis of the CAAC-OS layer by an out-of-plane method, another peak may appear when 2θ is around 36°, in addition to the peak at 2θ of around 31°. The peak at 2θ of around 36° indicates that a crystal having no c-axis alignment is included in part of the CAAC-OS layer. It is preferable that in the CAAC-OS layer analyzed by an out-of-plane method, a peak appear when 2θ is around 31° and that a peak not appear when 2θ is around 36°.

Figure 22B:
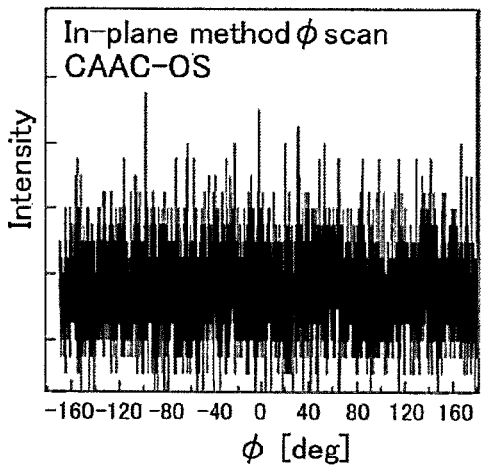
Figure 22C:
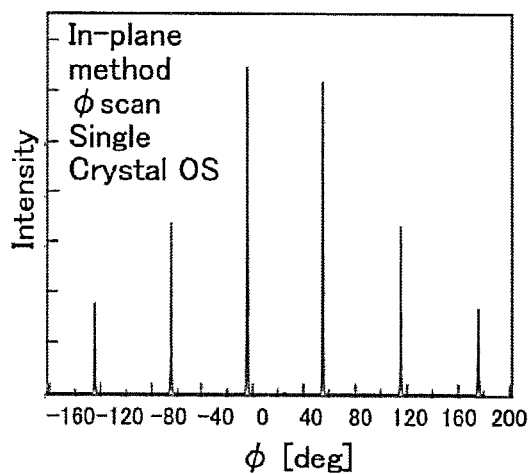

On the other hand, in structural analysis of the CAAC-OS layer by an in-plane method in which an X-ray is incident on a sample in a direction substantially perpendicular to the c-axis, a peak appears when 2θ is around 56°. This peak is attributed to the (110) plane of the InGaZnO$_4$ crystal. In the case of the CAAC-OS, when analysis (φ scan) is performed with 2θ fixed at around 56° and with the sample rotated using a normal vector of the sample surface as an axis (φ axis), as shown in FIG. 22B, a peak is not clearly observed. In contrast, in the case of a single crystal oxide semiconductor layer of InGaZnO$_4$, when φ scan is performed with 2θ fixed at around 56°, as shown in FIG. 22C, six peaks which are derived from crystal planes equivalent to the (110) plane are observed. Accordingly, the structural analysis using XRD shows that the directions of a-axes and b-axes are different in the CAAC-OS layer.

Figure 23A:
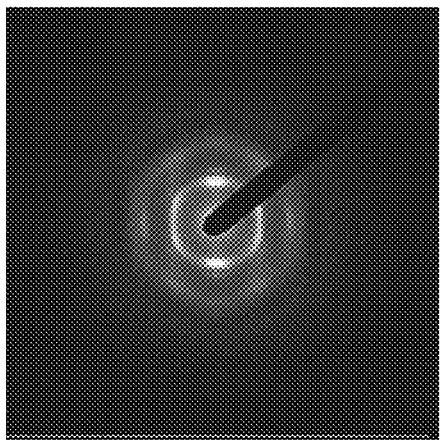
FIGS. 23A and 23B show electron diffraction patterns of a CAAC-OS layer.
Figure 23B:
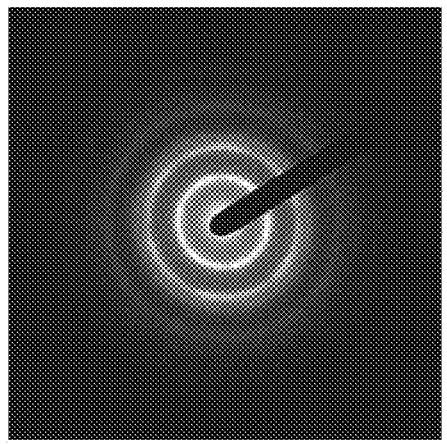

Next, the CAAC-OS layer analyzed by electron diffraction is described. For example, when an electron beam with a probe diameter of 300 nm is incident on a CAAC-OS layer including an InGaZnO$_4$ crystal in a direction parallel to the sample surface, a diffraction pattern (also referred to as a selected-area transmission electron diffraction pattern) shown in FIG. 23A might be obtained. In this diffraction pattern, spots derived from the (009) plane of an InGaZnO$_4$ crystal are included. Thus, the electron diffraction also indicates that pellets included in the CAAC-OS layer have c-axis alignment and that the c-axes are aligned in a direction substantially perpendicular to the formation surface or the top surface of the CAAC-OS layer. Meanwhile, FIG. 23B shows a diffraction pattern obtained in such a manner that an electron beam with a probe diameter of 300 nm is incident on the same sample in a direction perpendicular to the sample surface. As shown in FIG. 23B, a ring-like diffraction pattern is observed. Thus, the electron diffraction also indicates that the a-axes and b-axes of the pellets included in the CAAC-OS layer do not have regular alignment. The first ring in FIG. 23B is considered to be derived from the (010) plane, the (100) plane, and the like of the InGaZnO$_4$ crystal. The second ring in FIG. 23B is considered to be derived from the (110) plane and the like.

Moreover, the CAAC-OS layer is an oxide semiconductor layer having a low density of defect states. Defects in the oxide semiconductor layer are, for example, a defect due to impurity and oxygen vacancies. Therefore, the CAAC-OS layer can be regarded as an oxide semiconductor layer with a low impurity concentration, or an oxide semiconductor layer having a small number of oxygen vacancies.

The impurity contained in the oxide semiconductor layer might serve as carrier traps or serve as carrier generation sources. In addition, oxygen vacancies in the oxide semiconductor layer might serve as carrier traps or serve as carrier generation sources when hydrogen is captured therein.

Note that the impurity means an element other than the main components of the oxide semiconductor layer, such as hydrogen, carbon, silicon, or a transition metal element. For example, an element (specifically, silicon or the like) having higher strength of bonding to oxygen than a metal element included in an oxide semiconductor layer extracts oxygen from the oxide semiconductor layer, which results in disorder of the atomic arrangement and reduced crystallinity of the oxide semiconductor layer. A heavy metal such as iron or nickel, argon, carbon dioxide, or the like has a large atomic radius (or molecular radius), and thus disturbs the atomic arrangement of the oxide semiconductor layer and decreases crystallinity.

An oxide semiconductor layer having a low density of defect states (a small number of oxygen vacancies) can have a low carrier density. Such an oxide semiconductor layer is referred to as a highly purified intrinsic or substantially highly purified intrinsic oxide semiconductor layer. A CAAC-OS layer has a low impurity concentration and a low density of defect states. That is, a CAAC-OS layer is likely to be highly purified intrinsic or substantially highly purified intrinsic oxide semiconductor layer. Thus, a transistor including a CAAC-OS layer rarely has negative threshold voltage (is rarely normally on). The highly purified intrinsic or substantially highly purified intrinsic oxide semiconductor layer has few carrier traps. An electric charge trapped by the carrier traps in the oxide semiconductor layer takes a long time to be released. The trapped electric charge may behave like a fixed electric charge. Thus, the transistor which includes the oxide semiconductor layer having a high impurity concentration and a high density of defect states might have unstable electrical characteristics. However, a transistor including a CAAC-OS layer has small variation in electrical characteristics and high reliability.

Since the CAAC-OS layer has a low density of defect states, the number of carries trapped in defect states by light irradiation is small. Therefore, in a transistor using the CAAC-OS layer, change in electrical characteristics due to irradiation with visible light or ultraviolet light is small.

<Microcrystalline Oxide Semiconductor Layer>

Next, a microcrystalline oxide semiconductor layer is described.

A microcrystalline oxide semiconductor layer has a region in which a crystal part is observed and a region in which a crystal part is not clearly observed in a high-resolution TEM image. In most cases, the size of a crystal part included in the microcrystalline oxide semiconductor layer is greater than or equal to 1 nm and less than or equal to 100 nm, or greater than or equal to 1 nm and less than or equal to 10 nm. An oxide semiconductor layer including a nanocrystal (nc) that is a microcrystal with a size greater than or equal to 1 nm and less than or equal to 10 nm, or a size greater than or equal to 1 nm and less than or equal to 3 nm is specifically referred to as a nanocrystalline oxide semiconductor (nc-OS) layer. In a high-resolution TEM image of the nc-OS layer, for example, a grain boundary is not clearly observed in some cases. Note that there is a possibility that the origin of the nanocrystal is the same as that of a pellet in a CAAC-OS layer. Therefore, a crystal part of the nc-OS layer may be referred to as a pellet in the following description.

In the nc-OS layer, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS layer. Thus, the orientation of the whole film is not ordered. Accordingly, the nc-OS layer cannot be distinguished from an amorphous oxide semiconductor layer, depending on an analysis method. For example, when the nc-OS layer is subjected to structural analysis by an out-of-plane method with an XRD apparatus using an X-ray having a diameter larger than the size of a pellet, a peak which shows a crystal plane does not appear. Furthermore, a diffraction pattern like a halo pattern is observed when the nc-OS layer is subjected to electron diffraction using an electron beam with a probe diameter (e.g., 50 nm or larger) that is larger than the size of a pellet (the electron diffraction is also referred to as selected-area electron diffraction). Meanwhile, spots appear in a nanobeam electron diffraction pattern of the nc-OS layer when an electron beam having a probe diameter close to or smaller than the size of a pellet is applied. Moreover, in a nanobeam electron diffraction pattern of the nc-OS layer, regions with high luminance in a circular (ring) pattern are shown in some cases. Also in a nanobeam electron diffraction pattern of the nc-OS layer, a plurality of spots is shown in a ring-like region in some cases.

Since there is no regularity of crystal orientation between the pellets (nanocrystals) as mentioned above, the nc-OS layer can also be referred to as an oxide semiconductor layer including random aligned nanocrystals (RANC) or an oxide semiconductor layer including non-aligned nanocrystals (NANC).

The nc-OS layer is an oxide semiconductor layer that has high regularity as compared with an amorphous oxide semiconductor layer. Therefore, the nc-OS layer is likely to have a lower density of defect states than an amorphous oxide semiconductor layer. Note that there is no regularity of crystal orientation between different pellets in the nc-OS. Therefore, the nc-OS layer has a higher density of defect states than the CAAC-OS layer.

<Amorphous Oxide Semiconductor Layer>

Next, an amorphous oxide semiconductor layer is described.

The amorphous oxide semiconductor layer is an oxide semiconductor layer having disordered atomic arrangement and no crystal part and exemplified by an oxide semiconductor which exists in an amorphous state as quartz.

In a high-resolution TEM image of the amorphous oxide semiconductor layer, crystal parts cannot be found.

When the amorphous oxide semiconductor layer is subjected to structural analysis by an out-of-plane method with an XRD apparatus, a peak which shows a crystal plane does not appear. A halo pattern is observed when the amorphous oxide semiconductor layer is subjected to electron diffraction. Furthermore, a spot is not observed and only a halo pattern appears when the amorphous oxide semiconductor layer is subjected to nanobeam electron diffraction.

There are various understandings of an amorphous structure. For example, a structure whose atomic arrangement does not have ordering at all is called a completely amorphous structure. Meanwhile, a structure which has ordering until the nearest neighbor atomic distance or the second-nearest neighbor atomic distance but does not have long-range ordering is also called an amorphous structure. Therefore, the strictest definition does not permit an oxide semiconductor layer to be called an amorphous oxide semiconductor layer as long as even a negligible degree of ordering is present in an atomic arrangement. At least an oxide semiconductor layer having long-term ordering cannot be called an amorphous oxide semiconductor layer. Accordingly, because of the presence of crystal part, for example, a CAAC-OS layer and an nc-OS layer cannot be called an amorphous oxide semiconductor layer or a completely amorphous oxide semiconductor layer.

<Amorphous-Like Oxide Semiconductor Layer>

Note that an oxide semiconductor layer may have a structure having physical properties intermediate between the nc-OS layer and the amorphous oxide semiconductor layer. The oxide semiconductor layer having such a structure is specifically referred to as an amorphous-like oxide semiconductor (a-like OS) layer.

In a high-resolution TEM image of the a-like OS layer, a void may be observed. Furthermore, in the high-resolution TEM image, there are a region where a crystal part is clearly observed and a region where a crystal part is not observed.

An a-like OS layer has an unstable structure because it includes a void. To verify that an a-like OS layer has an unstable structure as compared with a CAAC-OS layer and an nc-OS layer, a change in structure caused by electron irradiation is described below.

An a-like OS layer, an nc-OS layer, and a CAAC-OS layer are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of InGaZnO$_4$. Each of lattice fringes corresponds to the a-b plane of the InGaZnO$_4$ crystal.

Figure 24:
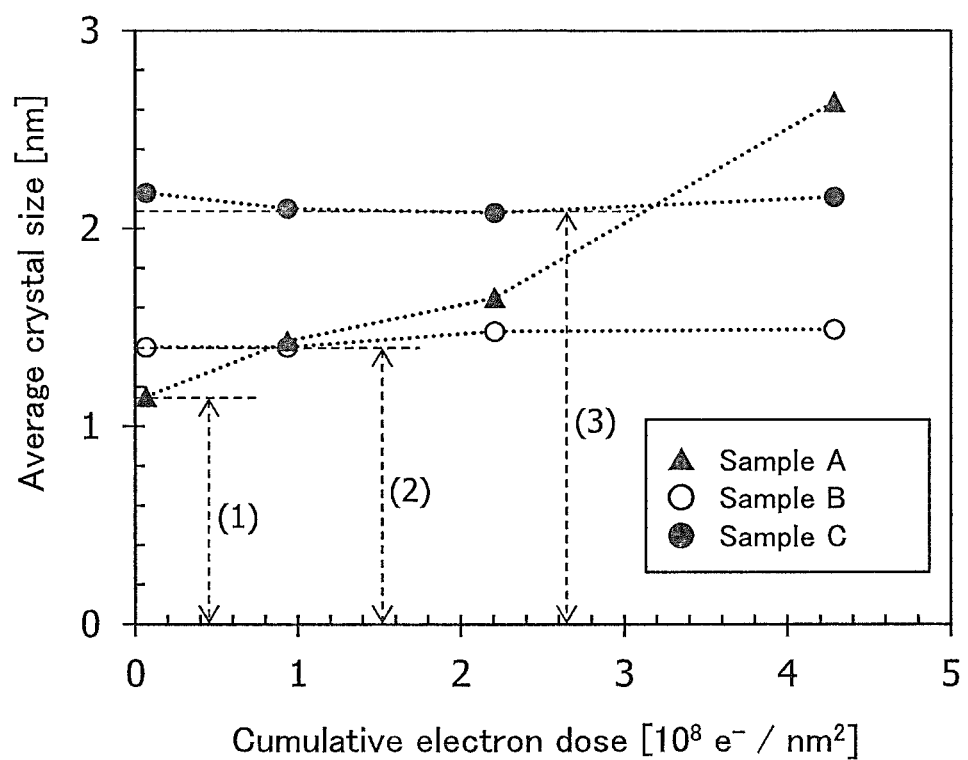
FIG. 24 shows a change of crystal parts of an In—Ga—Zn oxide owing to electron irradiation.

FIG. 24 shows the change in the average size of crystal parts (at 22 points to 45 points) in each sample. Note that the crystal part size corresponds to the length of a lattice fringe. FIG. 24 indicates that the crystal part size in the a-like OS increases with an increase in the cumulative electron dose. Specifically, as shown by (1) in FIG. 24, a crystal part of approximately 1.2 nm (also referred to as an initial nucleus) at the start of TEM observation grows to a size of approximately 2.6 nm at a cumulative electron dose of 4.2×10$^8$ e$^-$/nm$^2$. In contrast, the crystal part size in the nc-OS and the CAAC-OS shows little change from the start of electron irradiation to a cumulative electron dose of 4.2×10$^8$ e$^-$/nm$^2$. Specifically, as shown by (2) and (3) in FIG. 24, the average crystal sizes in an nc-OS layer and a CAAC-OS layer are approximately 1.4 nm and approximately 2.1 nm, respectively, regardless of the cumulative electron dose.

In this manner, growth of the crystal part in the a-like OS layer is induced by electron irradiation. In contrast, in the nc-OS layer and the CAAC-OS layer, growth of the crystal part is hardly induced by electron irradiation. Therefore, the a-like OS layer has an unstable structure as compared with the nc-OS layer and the CAAC-OS layer.

The a-like OS layer has a lower density than the nc-OS layer and the CAAC-OS layer because it includes a void. Specifically, the density of the a-like OS layer is higher than or equal to 78.6% and lower than 92.3% of the density of the single crystal oxide semiconductor layer having the same composition. The density of each of the nc-OS layer and the CAAC-OS layer is higher than or equal to 92.3% and lower than 100% of the density of the single crystal oxide semiconductor layer having the same composition. Note that it is difficult to deposit an oxide semiconductor layer having a density of lower than 78% of the density of the single crystal oxide semiconductor layer.

For example, in the case of an oxide semiconductor layer having an atomic ratio of In:Ga:Zn=1:1:1, the density of single crystal InGaZnO$_4$ with a rhombohedral crystal structure is 6.357 g/cm$^3$. Accordingly, in the case of the oxide semiconductor layer having an atomic ratio of In:Ga:Zn=1:1:1, the density of the a-like OS layer is higher than or equal to 5.0 g/cm$^3$ and lower than 5.9 g/cm$^3$. For example, in the case of the oxide semiconductor layer having an atomic ratio of In:Ga:Zn=1:1:1, the density of each of the nc-OS layer and the CAAC-OS layer is higher than or equal to 5.9 g/cm$^3$ and lower than 6.3 g/cm$^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductor layers have various structures and various properties. Note that an oxide semiconductor layer may be a stacked layer including two or more films of an amorphous oxide semiconductor layer, an a-like OS layer, a microcrystalline oxide semiconductor layer, and a CAAC-OS layer, for example.

<Method of Manufacturing Transistor>

A method of manufacturing the transistor 450 will be described below. For portions similar to those described in Embodiment 1 or 2. Embodiment 1 or 2 can be referred to and repetitive description is omitted in some cases.

First, the substrate 400 is prepared. The substrate 400 can be formed of a material similar to that of the substrate 100. A substrate already provided with a semiconductor element may be used as the substrate 400.

Alternatively, a flexible substrate may be used as the substrate 400. As a method of providing a transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor.

The insulating layer 402 is formed over the substrate 400. After the formation of the insulating layer 402, oxygen may be added to the insulating layer 402 so that the insulating layer contains oxygen in excess of the stoichiometric composition. Oxygen may be added by plasma treatment, an ion implantation method, or the like. In the case where oxygen may be added by an ion implantation method, the acceleration voltage may be 2 kV or higher and 100 kV or lower and the dose is 5×10$^{14}$ ions/cm$^2$ or more and 5×10$^{16}$ ions/cm$^2$ or less, for example.

Next, the first oxide semiconductor layer 404 and the second oxide semiconductor layer 406 are stacked over the insulating layer 402. Then, the layers are processed into an island shape by an etching method using a photolithography technique. In this etching step, the insulating layer 402 may also be etched so that the thickness of a region exposed from the first oxide semiconductor layer 404 can be reduced. However, the insulating layer 402 is moderately etched not to expose the surface of the substrate 400. By etching the insulating layer 402 moderately, the gate electrode layer 412 to be formed later can cover the second oxide semiconductor layer 406 easily. Note that to miniaturize the transistor, a hard mask may be used in processing the first oxide semiconductor layer 404 and the second oxide semiconductor layer 406.

In the processing of the first oxide semiconductor layer 404 and the second oxide semiconductor layer 406, etching is preferably performed not to cause damage to processed surfaces of the first oxide semiconductor layer 404 and the second oxide semiconductor layer 406. For example, neutral beam etching may be performed by a dry etching method. A neutral beam does not cause buildup of electrical charges and has low energy, which enables low damage etching. Alternatively, in the case where the first oxide semiconductor layer 404 and the second oxide semiconductor layer 406 are crystalline layers, a wet etching method in which an etching rate is changed depending on a crystal plane may be used. By using a wet etching method, damage to a processed surface can be reduced.

First heat treatment may be performed after the second oxide semiconductor layer 406 is formed. The first heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. Alternatively, the first heat treatment may be performed in such a manner that heat treatment is performed in an inert gas atmosphere, and then another heat treatment is performed in an atmosphere containing an oxidizing gas at 10 ppm or more, in order to compensate desorbed oxygen. By the first heat treatment, the crystallinity of the second oxide semiconductor layer 406 can be increased, and in addition, impurities such as hydrogen and water can be removed from the base insulating layer 402.

Next, a conductive film to be the source electrode layer 408a and the drain electrode layer 408b is formed to cover the second oxide semiconductor layer 406. The conductive film may be formed by a sputtering method, a CVD method, an MBE method, an ALD method, or a PLD method. To reduce plasma damage to the first oxide semiconductor layer or the second oxide semiconductor layer, a thermal CVD method such as an MCVD method is preferably used.

Next, the conductive film is divided by etching to form the source electrode layer 408a and the drain electrode layer 408b. Note that when the conductive film is etched, end portions of the source electrode layer 408a and the drain electrode layer 408b are rounded (have curved surfaces) in some cases. Furthermore, when the conductive film is etched, the insulating layer 402 is etched and a region with a reduced thickness is formed in some cases.

Next, the insulating layer 410 functioning as a gate insulating layer is formed over the second oxide semiconductor layer 406, the source electrode layer 408a, and the drain electrode layer 408b. Then, the gate electrode layer 412 is formed over the insulating layer 410. The gate electrode layer 412 may be formed by a sputtering method, a CVD method, an MBE method, an ALD method, or a PLD method. To reduce plasma damage to the first oxide semiconductor layer or the second oxide semiconductor layer, a thermal CVD method such as an MCVD method is preferably used.

Next, the insulating layer 414 is formed over the source electrode layer 408a, the drain electrode layer 408b, the insulating layer 410, and the gate electrode layer 412. The insulating layer 414 may be formed by a sputtering method, a CVD method, an MBE method, an ALD method, or a PLD method. To reduce plasma damage to the first oxide semiconductor layer or the second oxide semiconductor layer, a thermal CVD method or an ALD method is preferably used.

Next, second heat treatment may be performed. The second heat treatment can be performed under conditions similar to those of the first heat treatment. The second heat treatment allows reducing oxygen vacancies in the second oxide semiconductor layer 406 in some cases.

Through the above steps, the transistor 450 illustrated in FIGS. 5A and 5B can be manufactured.

Figure 17A:
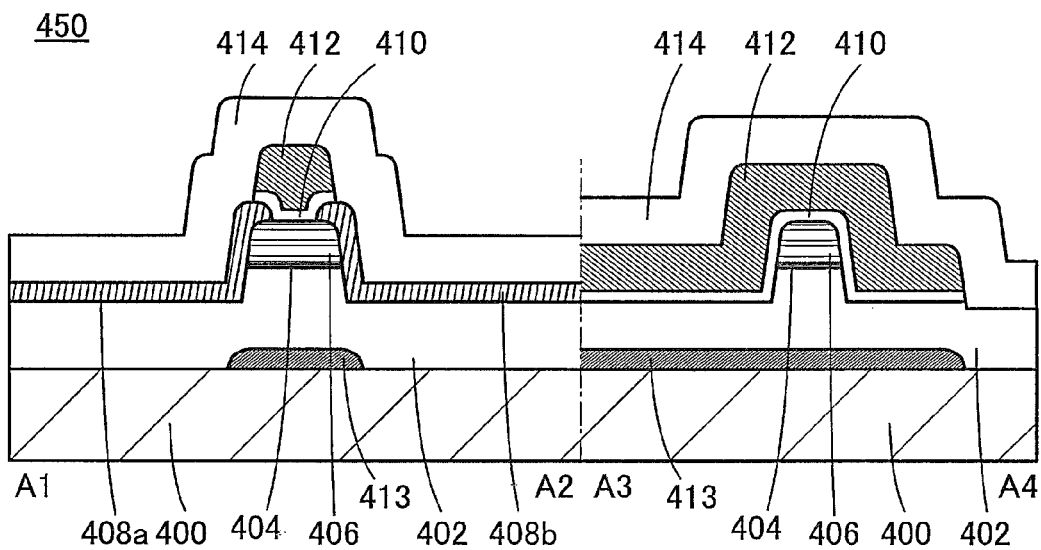
FIGS. 17A and 17B are cross-sectional views illustrating a transistor of one embodiment of the present invention.
Figure 17B:
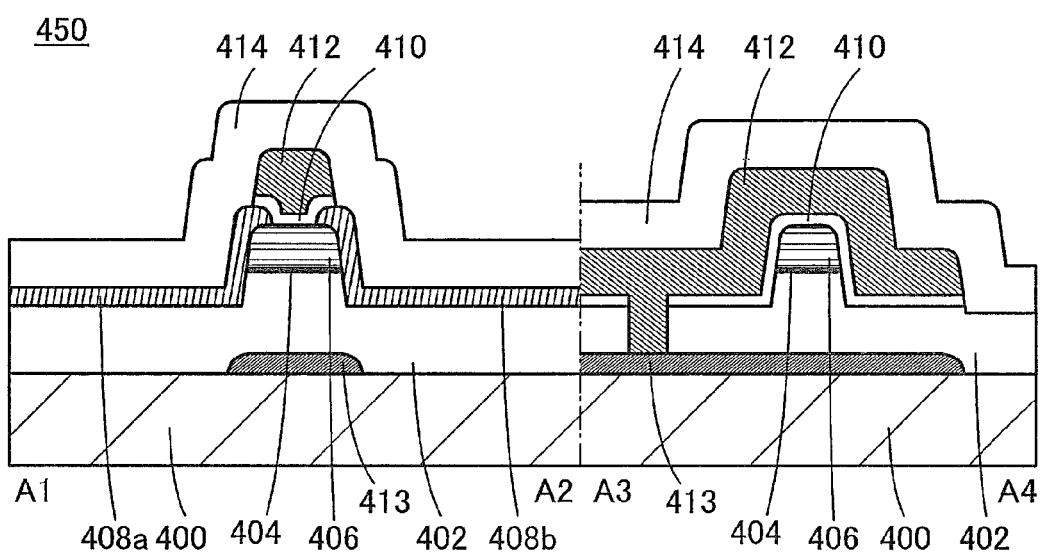

Although in FIG. 5B, the gate electrode layer 412 is provided above the first oxide semiconductor layer 404 and the second oxide semiconductor layer 406, one embodiment of the present invention is not limited to this structure. For example, a gate electrode layer 413 may be provided below the first oxide semiconductor layer 404 and the second oxide semiconductor layer 406, as illustrated in FIG. 17A. A variety of materials can be used for the gate electrode layer 413, as well as for the gate electrode layer 412. Note that a potential or signal supplied to the gate electrode layer 413 may be the same as or different from a potential or signal supplied to the gate electrode layer 412. By supplying a constant potential to the gate electrode layer 413, the threshold voltage of the transistor may be controlled. FIG. 17B illustrates an example in which the gate electrode layer 412 is electrically connected to the gate electrode layer 413 through an opening. Note that in a case other than the case of FIGS. 5A and 5B, the gate electrode layer 413 can be provided in a similar manner.

<Modification Example of Transistor Structure 1>

Figure 6A:
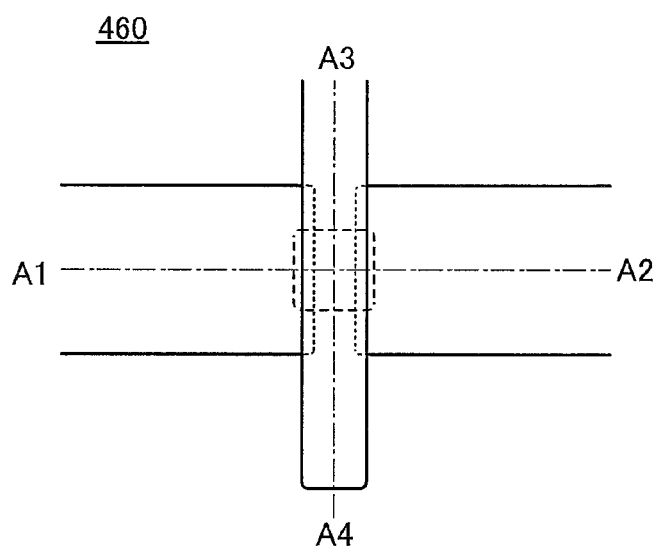
FIGS. 6A and 6B are a plan view and a cross-sectional view illustrating a transistor of one embodiment of the present invention.
Figure 6B:
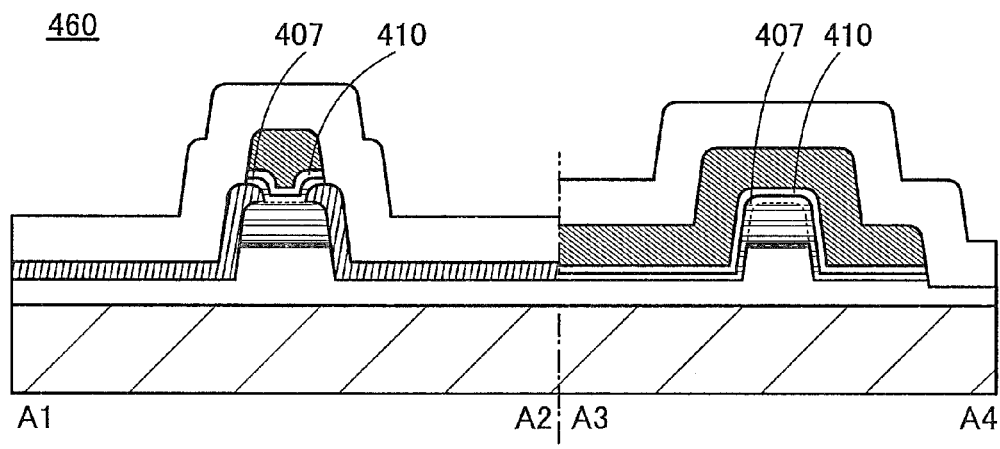

As in a transistor 460 illustrated in FIGS. 6A and 6B, a third oxide semiconductor layer 407 may be provided between the insulating layer 410 and the second oxide semiconductor layer 406. The same material as the second oxide semiconductor layer 406 can be used for the third oxide semiconductor layer 407. Since the third oxide semiconductor layer 407 is in contact with the insulating layer 410 which might contain a constituent element (e.g., silicon) that is different from that of an oxide semiconductor, an interface state due to junction of different kinds of materials, entry of an impurity, or the like might be formed at an interface between the third oxide semiconductor layer 407 and the insulating layer 410. For this reason, to stabilize electrical characteristics of a transistor, a channel is preferably formed in the second oxide semiconductor layer 406. Thus, a material whose electron affinity is lower than that of the second oxide semiconductor layer 406 is preferably used for the third oxide semiconductor layer 407.

A method without using plasma, in particular, an MOCVD method is preferably used for forming the third oxide semiconductor layer 407. In the case where the third oxide semiconductor layer 407 is formed by an MOCVD method, the third oxide semiconductor layer 407 can have a crystal part by epitaxial growth using a crystal part in the second oxide semiconductor layer 406 as a seed crystal. Note that the description of the transistor illustrated in FIGS. 5A and 5B is referred to for the structures of the other components.

Figure 18A:
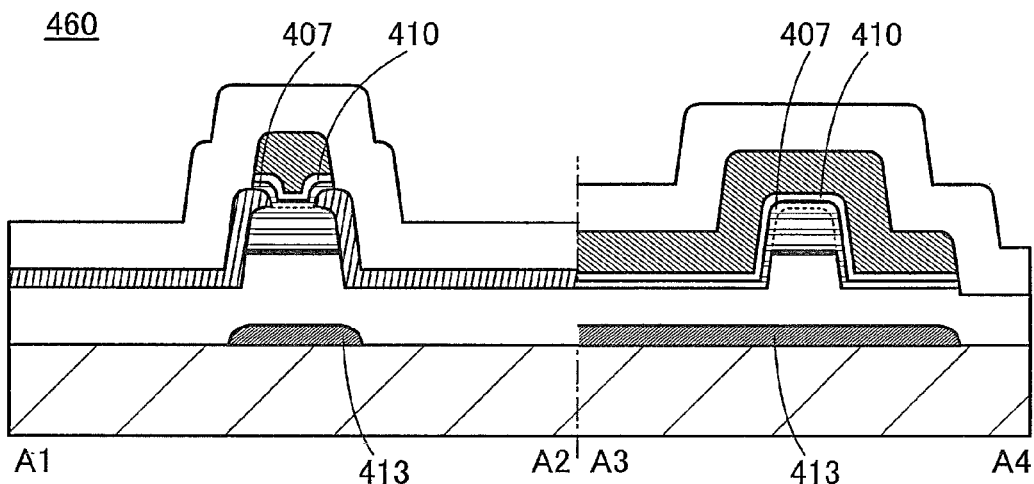
FIGS. 18A and 18B are cross-sectional views illustrating a transistor of one embodiment of the present invention.
Figure 18B:
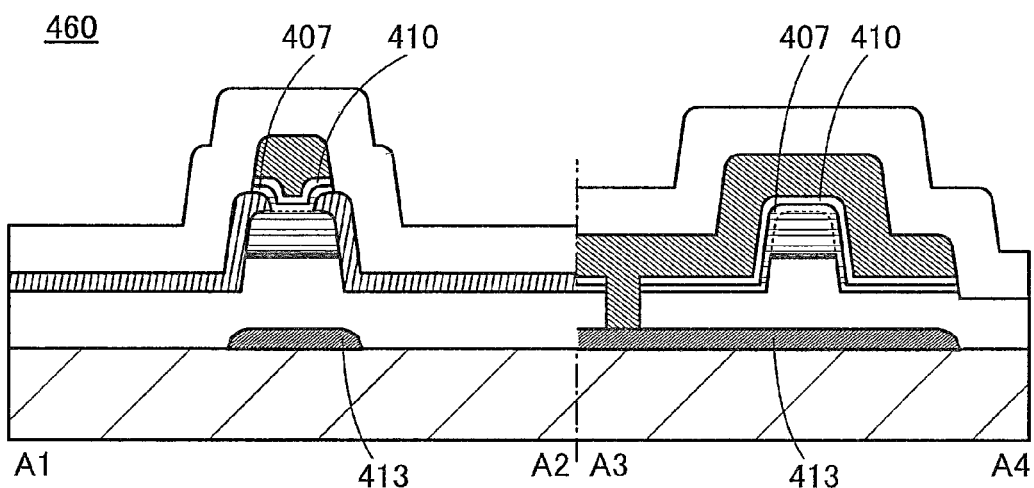

Although in FIG. 6B, the gate electrode layer 412 is provided above the third oxide semiconductor layer 407, one embodiment of the present invention is not limited to this structure. For example, a gate electrode layer 413 may be provided below the first oxide semiconductor layer 404 to the third oxide semiconductor layer 407, as illustrated in FIG. 18A. FIG. 18B illustrates an example in which the gate electrode layer 412 is electrically connected to the gate electrode layer 413 through an opening. Note that in a case other than the cases of FIGS. 5A and 5B and FIGS. 6A and 6B, the gate electrode layer 413 can be provided in a similar manner.

<Transistor Structure 2>

Figure 7A:
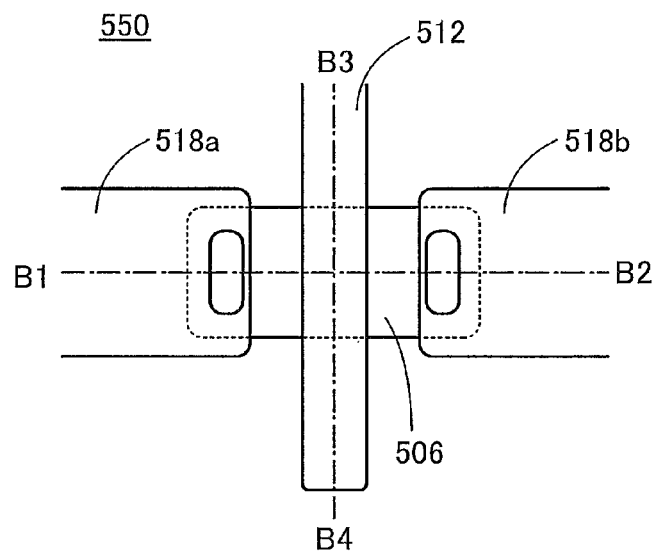
FIGS. 7A and 7B are a plan view and a cross-sectional view illustrating a transistor of one embodiment of the present invention.
Figure 7B:
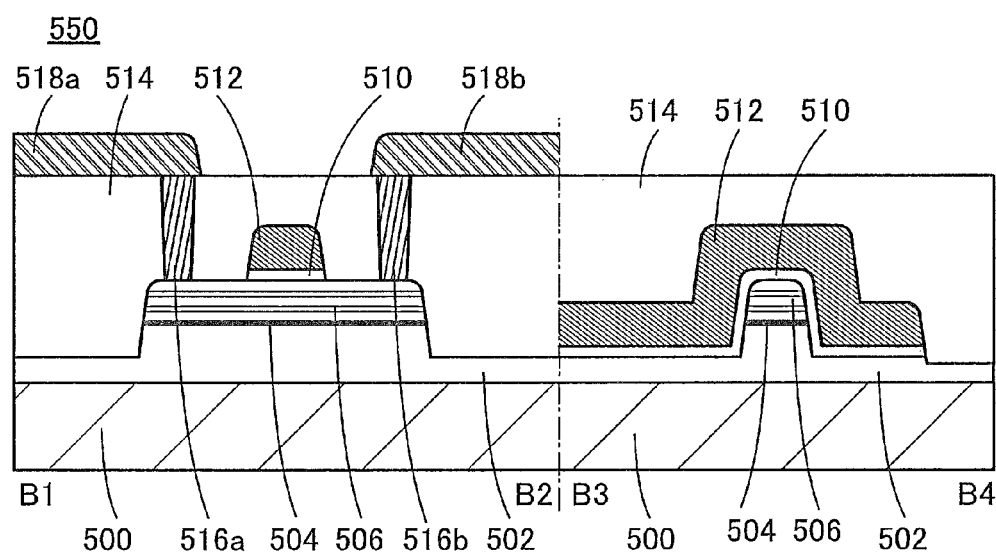

FIGS. 7A and 7B are a plan view and a cross-sectional view illustrating a transistor 550 of one embodiment of the present invention. FIG. 7A is a plan view and FIG. 7B is a cross-sectional view taken along dashed-dotted line B1-B2 and dashed-dotted line B3-B4 in FIG. 7A. Note that for simplification of the drawing, some components are not illustrated in the plan view in FIG. 7A.

The transistor 550 illustrated in FIGS. 7A and 7B includes an insulating layer 502 having a projecting portion over a substrate 500; a first oxide semiconductor layer 504 and a second oxide semiconductor layer 506 over the projecting portion of the insulating layer 502; an insulating layer 510 over the second oxide semiconductor layer 506; a gate electrode layer 512 which is in contact with a top surface of the insulating layer 510 and faces a top surface and side surfaces of the second oxide semiconductor layer 506; an insulating layer 514 which is over the second oxide semiconductor layer 506 and the gate electrode layer 512 and has openings reaching the second oxide semiconductor layer 506; a source electrode layer 516a and a drain electrode layer 516b which fill the openings; and a conductive layer 518a and a conductive layer 518b which are in contact with the source electrode layer 516a and the drain electrode layer 516b, respectively. Note that the insulating layer 502 does not necessarily have a projecting portion.

In the transistor 550 in FIGS. 7A and 7B, the source electrode layer 516a and the drain electrode layer 516b are provided so as not to overlap with the gate electrode layer 512. Thus, parasitic capacitance generated between the gate electrode layer 512 and the source electrode layer 516a or the drain electrode layer 516b can be reduced. For this reason, the transistor in FIGS. 7A and 7B can have excellent switching characteristics.

In addition, the level of the top surface of the insulating layer 514, that of the source electrode layer 516a, and that of the drain electrode layer 516b are the same; thus, shape defects do not easily occur. Therefore, a semiconductor device including the transistor can be manufactured with high yield.

As for the conductive layer 518a and the conductive layer 518b, for example, a single layer or a stacked layer of a conductive layer containing one or more of aluminum, titanium, chromium, cobalt, nickel, copper, yttrium, zirconium, molybdenum, ruthenium, silver, tantalum, and tungsten may be used.

The description on the substrate 400, the insulating layer 402, the first oxide semiconductor layer 404, the second oxide semiconductor layer 406, the source electrode layer 408a and the drain electrode layer 408b, the insulating layer 410, the gate electrode layer 412, and the insulating layer 414 can be referred to for the substrate 500, the insulating layer 502, the first oxide semiconductor layer 504, the second oxide semiconductor layer 506, the source electrode layer 516a and the drain electrode layer 516b, the insulating layer 510, the gate electrode layer 512, and the insulating layer 514, respectively.

Figure 19A:
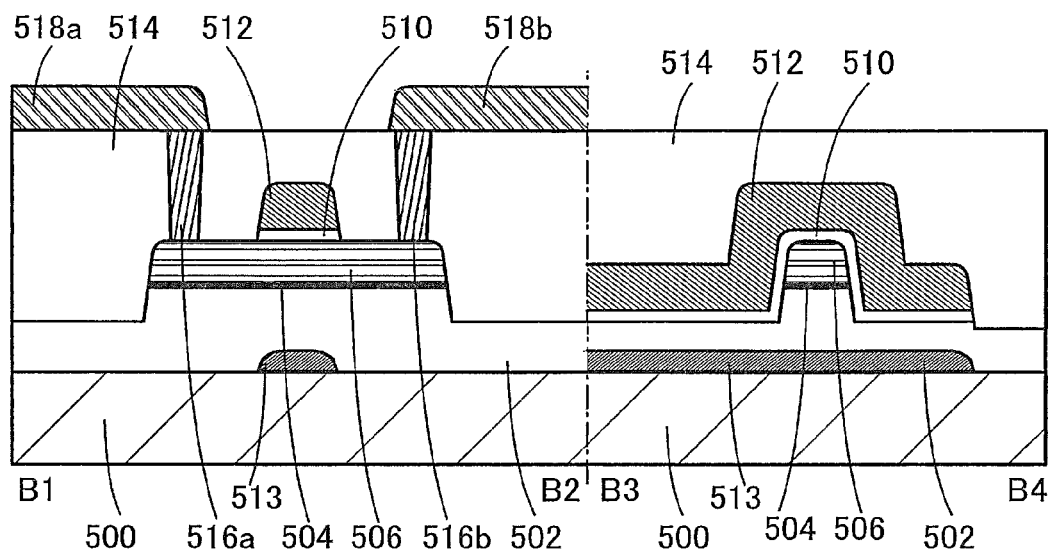
FIGS. 19A and 19B are cross-sectional views illustrating a transistor of one embodiment of the present invention.
Figure 19B:
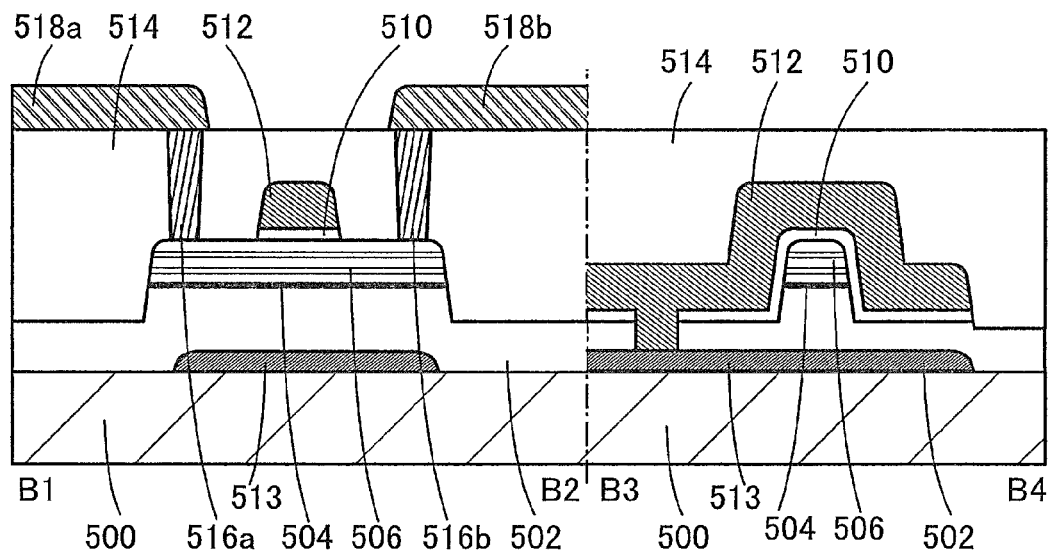

Although in FIG. 7B, the gate electrode layer 512 is provided above the first oxide semiconductor layer 504 and the second oxide semiconductor layer 506, one embodiment of the present invention is not limited to this structure. For example, a gate electrode layer 513 may be provided below the first oxide semiconductor layer 504 and the second oxide semiconductor layer 506, as illustrated in FIG. 19A. A variety of materials can be used for the gate electrode layer 513, as well as for the gate electrode layer 512. Note that a potential or signal supplied to the gate electrode layer 513 may be the same as or different from a potential or signal supplied to the gate electrode layer 512. By supplying a constant potential to the gate electrode layer 513, the threshold voltage of the transistor may be controlled. FIG. 19B illustrates an example in which the gate electrode layer 512 is electrically connected to the gate electrode layer 513 through a contact hole. The gate electrode layer 513 may be provided to overlap with the source electrode layer 516a and the drain electrode layer 516b. That case is illustrated in FIG. 19B. Note that in a case other than the cases of FIGS. 5A and 5B, FIGS. 6A and 6B, and FIGS. 7A and 7B, the gate electrode layer 513 can be provided in a similar manner.

<Modification Example of Transistor Structure 2>

In the transistor illustrated in FIGS. 7A and 7B, a third oxide semiconductor layer may be provided between the insulating layer 510 and the second oxide semiconductor layer 506. The description on the third oxide semiconductor layer 407 can be referred to for the third oxide semiconductor layer. Note that the description on the transistor illustrated in FIGS. 7A and 7B can be referred to for the structures of the other components.

<Transistor Structure 3>

Figure 8A:
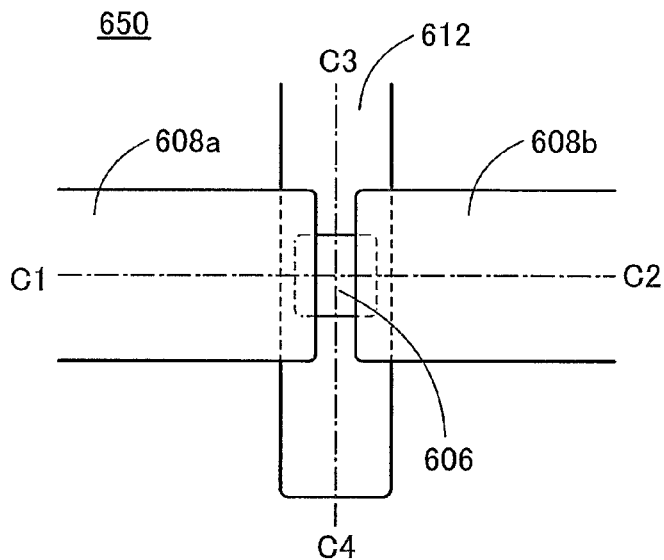
FIGS. 8A and 8B are a plan view and a cross-sectional view illustrating a transistor of one embodiment of the present invention.
Figure 8B:
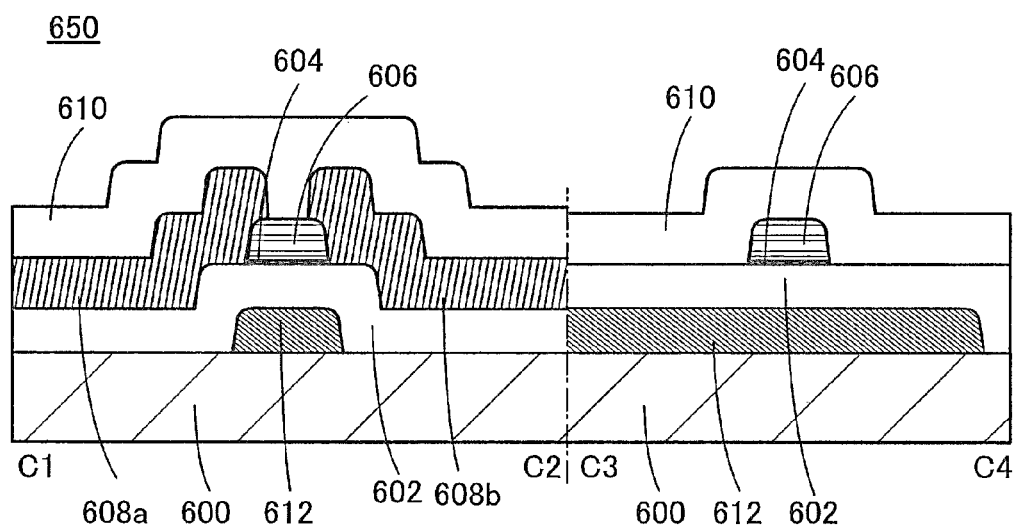

FIGS. 8A and 8B are a plan view and a cross-sectional view illustrating a transistor 650 of one embodiment of the present invention. FIG. 8A is a plan view and FIG. 8B is a cross-sectional view taken along dashed-dotted line C1-C2 and dashed-dotted line C3-C4 in FIG. 8A. Note that for simplification of the drawing, some components are not illustrated in the plan view in FIG. 8A.

The transistor 650 illustrated in FIGS. 8A and 8B includes a gate electrode layer 612 over a substrate 600; an insulating layer 602 over the gate electrode layer 612; a first oxide semiconductor layer 604 over the insulating layer 602; a second oxide semiconductor layer 606 over the first oxide semiconductor layer 604; a source electrode layer 608a and a drain electrode layer 608b in contact with side surfaces of the first oxide semiconductor layer 604 and a top surface and side surfaces of the second oxide semiconductor layer 606; and an insulating layer 610 over the second oxide semiconductor layer 606, the source electrode layer 608a, and the drain electrode layer 608b. Note that an insulating layer may be provided between the substrate 600 and the gate electrode layer 612.

The transistor 650 may include a conductive layer which overlaps with the second oxide semiconductor layer 606 with the insulating layer 610 provided therebetween. The conductive layer functions as a second gate electrode layer of the transistor 650. An s-channel structure may be formed using the second gate electrode.

The description on the substrate 400, the gate electrode layer 412, the insulating layer 402, the first oxide semiconductor layer 404, the second oxide semiconductor layer 406, the source electrode layer 408a and the drain electrode layer 408b, and the insulating layer 410 can be referred to for the substrate 600, the gate electrode layer 612, the insulating layer 602, the first oxide semiconductor layer 604, the second oxide semiconductor layer 606, the source electrode layer 608a and the drain electrode layer 608b, and the insulating layer 610, respectively.

In each of the above-described transistors of one embodiment of the present invention, a channel is formed in an oxide semiconductor layer in which plasma damage is prevented and the number of defects is reduced; thus, change in electrical characteristics of the transistor can be suppressed. A semiconductor device including the transistor can have improved reliability.

Although the case where an oxide semiconductor layer is used for a channel and the like is described in this embodiment as an example, one embodiment of the present invention is not limited thereto. For example, depending on circumstances or conditions, a material containing Si (silicon), Ge (germanium), SiGe (silicon germanium), GaAs (gallium arsenide), or the like may be used for a channel, the vicinity of the channel, a source region, a drain region, or the like.

The structures, the methods, and the like described in this embodiment can be combined as appropriate with any of the structures, the methods, and the like described in the other embodiments.

(Embodiment 4)

An example of a semiconductor device of one embodiment of the present invention is described in this embodiment.

<Circuit>

An example of a circuit including a transistor of one embodiment of the present invention is described below.

[Cross-Sectional Structure]

Figure 9A:
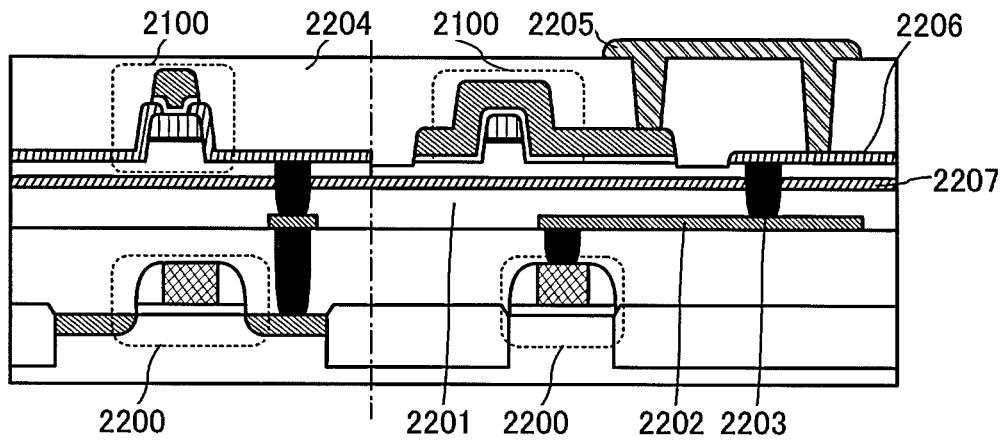
FIGS. 9A and 9D are cross-sectional views and FIGS. 9B and 9C are circuit diagrams of a semiconductor device of one embodiment of the present invention.

FIG. 9A is a cross-sectional view of a semiconductor device of one embodiment of the present invention. The semiconductor device illustrated in FIG. 9A includes a transistor 2200 using a first semiconductor in a lower portion and a transistor 2100 using a second semiconductor in an upper portion. FIG. 9A shows an example in which the transistor illustrated in FIGS. 5A and 5B is used as the transistor 2100 using the second semiconductor. Note that a transistor having a different structure described in Embodiment 3 may be used as the transistor 2100.

As the first semiconductor, a semiconductor having an energy gap different from that of the second semiconductor may be used. For example, the first semiconductor may be a semiconductor other than an oxide semiconductor and the second semiconductor may be an oxide semiconductor. When single crystal silicon is used as the first semiconductor, the transistor 2200 capable of high-speed operation can be obtained. When an oxide semiconductor is used as the second semiconductor, the transistor 2100 that is suitable for low off-state current can be obtained.

Note that the transistor 2200 may be either an n-channel transistor or a p-channel transistor, and an appropriate transistor is used in accordance with a circuit. As the transistor 2100 and/or the transistor 2200, the above-described transistor or the transistor illustrated in FIG. 9A is not necessarily used in some cases.

The semiconductor device illustrated in FIG. 9A includes the transistor 2100 above the transistor 2200 with an insulating layer 2201 and an insulating layer 2207 provided therebetween. Between the transistor 2200 and the transistor 2100, a plurality of conductive layers 2202 which function as wirings are provided. Wirings or electrodes provided in an upper layer and a lower layer are electrically connected to each other by a plurality of conductive layers 2203 embedded in insulating films. Furthermore, the semiconductor device includes an insulating layer 2204 over the transistor 2100, a conductive film 2205 over the insulating layer 2204, and a conductive layer 2206 formed in the same layer (through the same steps) as a source electrode layer and a drain electrode layer of the transistor 2100.

By stacking a plurality of transistors, a plurality of circuits can be arranged with high density.

Here, in the case where single crystal silicon is used as the first semiconductor of the transistor 2200, the hydrogen concentration in an insulating layer near the first semiconductor of the transistor 2200 is preferably high. The hydrogen terminates dangling bonds of silicon, so that the reliability of the transistor 2200 can be increased. On the other hand, the hydrogen concentration in an insulating layer near the oxide semiconductor of the transistor 2100 is preferably low. The hydrogen causes generation of carriers in the oxide semiconductor, which might lead to a decrease in the reliability of the transistor 2100. Therefore, in the case where the transistor 2200 using single crystal silicon and the transistor 2100 using an oxide semiconductor are stacked, providing the insulating layer 2207 having a function of blocking hydrogen between the transistors is effective because the reliability of the transistors can be increased.

The insulating layer 2207 may be, for example, formed to have a single-layer structure or a stacked-layer structure using an insulating layer containing aluminum oxide, aluminum oxynitride, gallium oxide, gallium oxynitride, yttrium oxide, yttrium oxynitride, hafnium oxide, hafnium oxynitride, yttria-stabilized zirconia (YSZ), or the like.

Furthermore, an insulating layer having a function of blocking hydrogen is preferably formed over the transistor 2100 to cover the transistor 2100 using an oxide semiconductor. As the insulating layer, an insulating layer that is similar to the insulating layer 2207 can be used, and in particular, an aluminum oxide film is preferably used. The aluminum oxide film has a high blocking effect of preventing penetration of both oxygen and impurities such as hydrogen and moisture. Thus, by using the aluminum oxide film as the insulating layer 2208 covering the transistor 2100, release of oxygen from the oxide semiconductor included in the transistor 2100 can be prevented and entry of water and hydrogen into the oxide semiconductor can be prevented.

Note that the transistor 2200 can be a transistor of various types without being limited to a planar type transistor. For example, a FIN-type transistor or a TRI-GATE transistor can be used. An example of a cross-sectional view in this case is illustrated in FIG. 9D. An insulating layer 2212 is provided over a semiconductor substrate 2211. The semiconductor substrate 2211 is processed to have a projecting portion in the channel width direction of the transistor 2200. A gate insulating film 2214 is provided over the processed semiconductor substrate 2211, and a gate electrode 2213 is provided over the gate insulating film 2214. Source and drain regions 2215 are formed in the semiconductor substrate 2211. Note that here is shown an example in which the semiconductor substrate 2211 is processed to have a projecting portion; however, one embodiment of the present invention is not limited thereto. For example, a semiconductor region having a projecting portion may be formed by processing an SOI substrate.

[Circuit Configuration Example]

In the above circuit, electrodes of the transistor 2100 and the transistor 2200 can be connected in a variety of ways; thus, a variety of circuits can be formed. Examples of circuit configurations which can be achieved by using a semiconductor device of one embodiment of the present invention are shown below.

[CMOS Circuit]

Figure 9B:
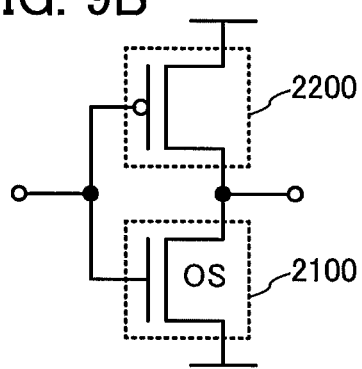

A circuit diagram in FIG. 9B shows a configuration of a CMOS circuit in which the p-channel transistor 2200 and the n-channel transistor 2100 are connected to each other in series and in which gates of them are connected to each other.

[Analog Switch]

Figure 9C:
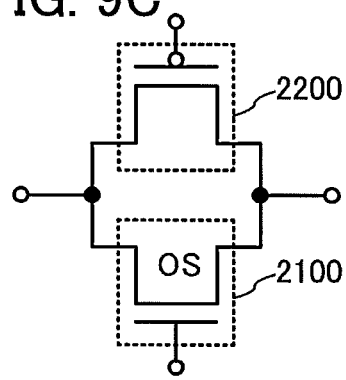
Figure 9D:
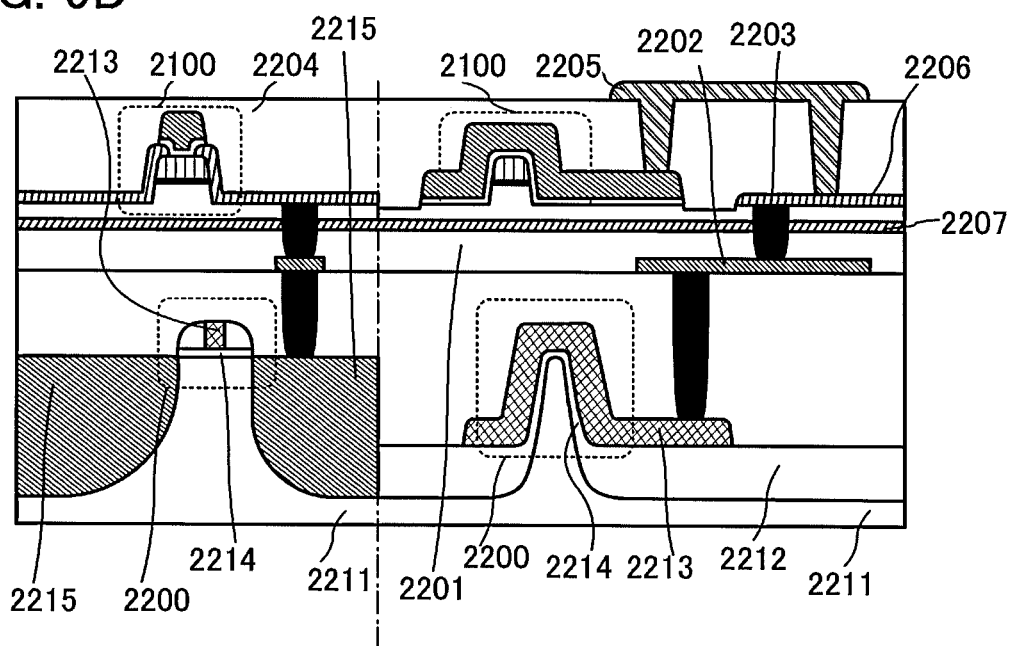

A circuit diagram in FIG. 9C shows a configuration in which sources of the transistors 2100 and 2200 are connected to each other and drains of the transistors 2100 and 2200 are connected to each other. With such a configuration, the transistors can function as an analog switch.

[Memory Device Example]

Figure 10A:
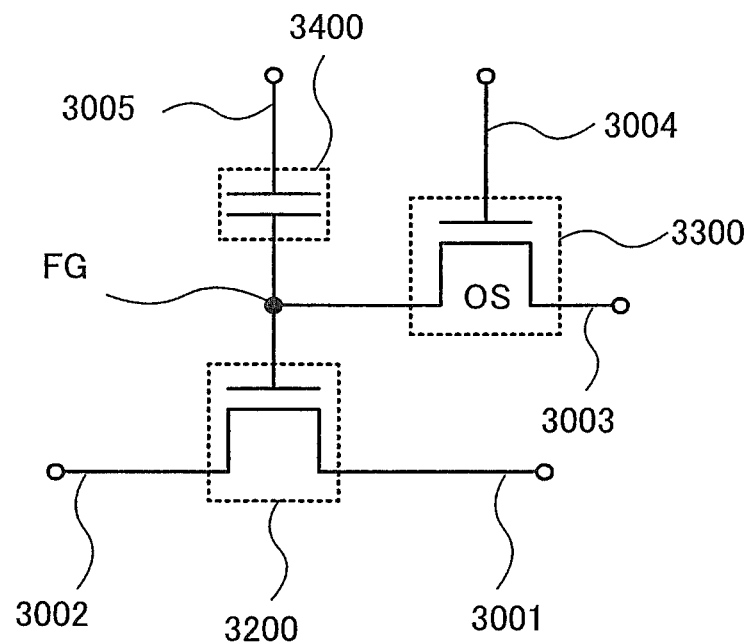
FIGS. 10A and 10B are each a circuit diagram of a memory device of one embodiment of the present invention.
Figure 10B:
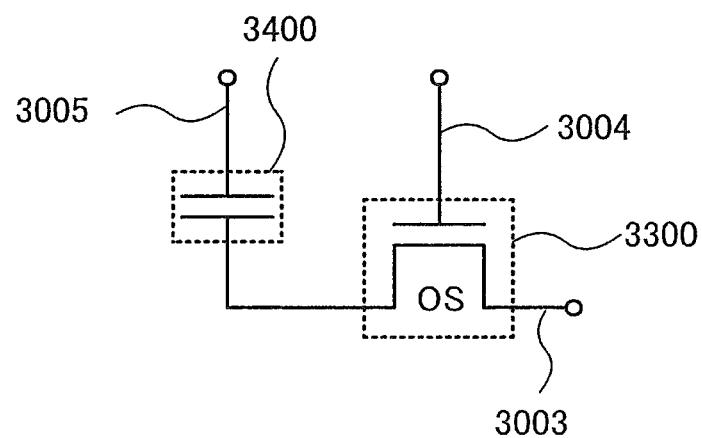

An example of a semiconductor device (memory device) which includes the transistor of one embodiment of the present invention, which can retain stored data even when not powered, and which has an unlimited number of write cycles is shown in FIGS. 10A and 10B.

The semiconductor device illustrated in FIG. 10A includes a transistor 3200 using a first semiconductor, a transistor 3300 using a second semiconductor, and a capacitor 3400. Note that any of the above-described transistors described in Embodiment 3 can be used as the transistor 3300.

The transistor 3300 is a transistor using an oxide semiconductor. Since the off-state current of the transistor 3300 is low, stored data can be retained for a long period at a predetermined node of the semiconductor device. In other words, power consumption of the semiconductor device can be reduced because refresh operation becomes unnecessary or the frequency of refresh operation can be extremely low.

In FIG. 10A, a first wiring 3001 is electrically connected to a source of the transistor 3200. A second wiring 3002 is electrically connected to a drain of the transistor 3200. A third wiring 3003 is electrically connected to one of the source and the drain of the transistor 3300. A fourth wiring 3004 is electrically connected to the gate of the transistor 3300. The gate of the transistor 3200 and the other of the source and the drain of the transistor 3300 are electrically connected to the one electrode of the capacitor 3400. A fifth wiring 3005 is electrically connected to the other electrode of the capacitor 3400.

The semiconductor device in FIG. 10A has a feature that the potential of the gate of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to a node FG where the gate of the transistor 3200 and the one electrode of the capacitor 3400 are electrically connected to each other. That is, a predetermined charge is supplied to the gate of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, whereby the charge is held at the node FG (retaining).

Since the off-state current of the transistor 3300 is extremely low, the charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 3200, an apparent threshold voltage $V_{th\_H}$ at the time when the high-level charge is given to the gate of the transistor 3200 is lower than an apparent threshold voltage $V_{th\_L}$ at the time when the low-level charge is given to the gate of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 3200 is turned on. On the other hand, in the case where the low-level charge is supplied to the node FG in writing, even when the potential of the fifth wiring 3005 is $V_0$ ($<V_{th\_L}$), the transistor 3200 remains off. Thus, the data retained in the node FG can be read by determining the potential of the second wiring 3002.

Note that in the case where memory cells are arrayed, it is necessary that data of a desired memory cell be read in read operation. In the case where data of the other memory cells is not read, the fifth wiring 3005 may be supplied with a potential at which the transistor 3200 is turned off regardless of the charge supplied to the node FG, that is, a potential lower than $V_{th\_H}$. Alternatively, the fifth wiring 3005 may be supplied with a potential at which the transistor 3200 is turned on regardless of the charge supplied to the node FG, that is, a potential higher than $V_{th\_L}$.

The semiconductor device in FIG. 10B is different form the semiconductor device in FIG. 10A in that the transistor 3200 is not provided. Also in this case, writing and retaining operation of data can be performed in a manner similar to the semiconductor device in FIG. 10A.

Reading of data in the semiconductor device in FIG. 10B is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of a first terminal of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor may be used for a driver circuit for driving a memory cell, and a transistor including the second semiconductor may be stacked over the driver circuit as the transistor 3300.

When including a transistor using an oxide semiconductor and having an extremely low off-state current, the semiconductor device described above can retain stored data for a long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Further, in the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulating layer is not caused. That is, the semiconductor device of one embodiment of the present invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

<RF Tag>

An RF tag including the transistor or the memory device is described below with reference to FIG. 11.

The RF tag of one embodiment of the present invention includes a memory circuit, stores data in the memory circuit, and transmits and receives data to/from the outside by using contactless means, for example, wireless communication. With these features, the RF tag can be used for an individual authentication system in which an object or the like is recognized by reading the individual information, for example. Note that the RF tag is required to have high reliability in order to be used for this purpose.

A configuration of the RF tag will be described with reference to FIG. 11. FIG. 11 is a block diagram illustrating a configuration example of an RF tag.

Figure 11:
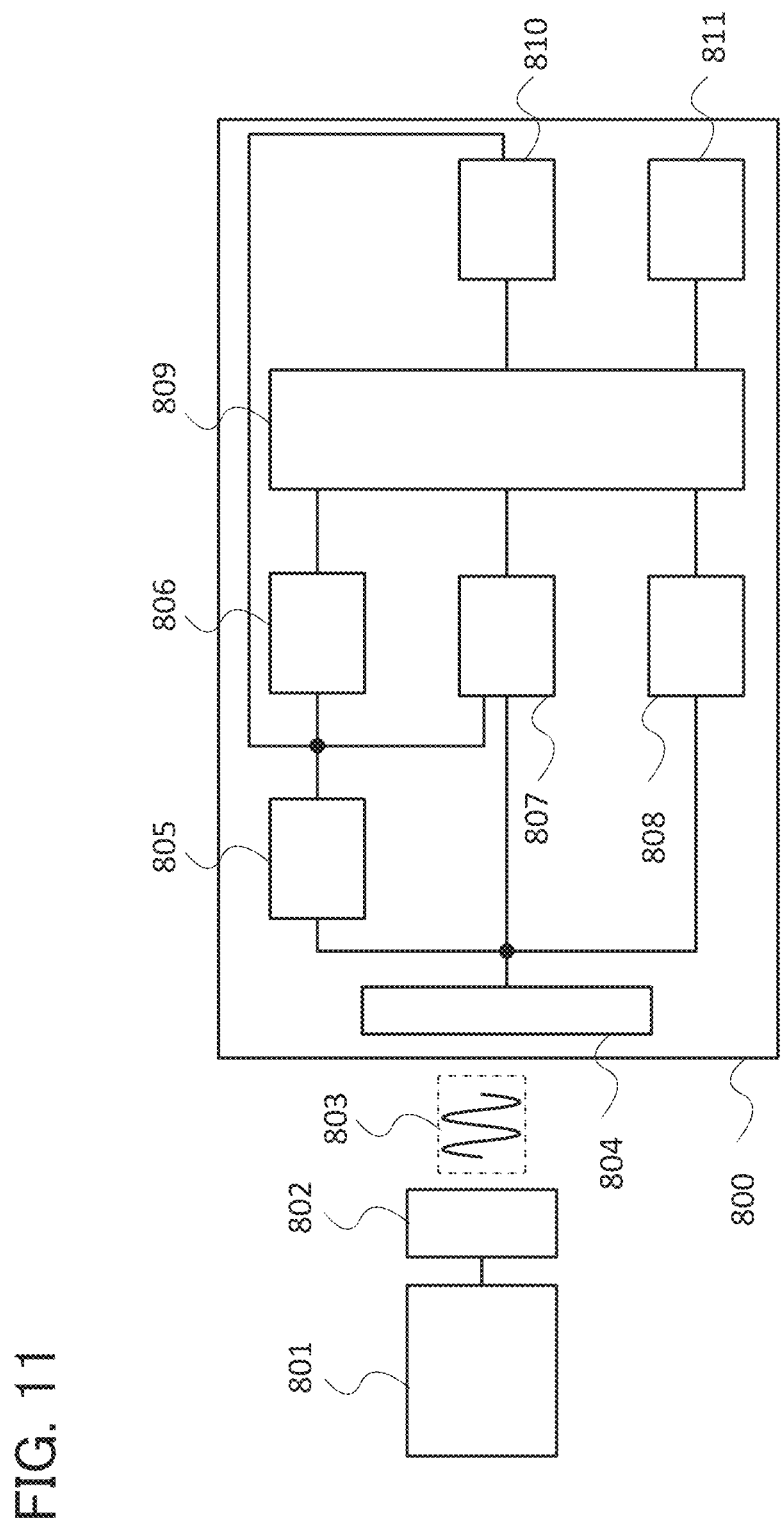
FIG. 11 is a block diagram of an RF tag of one embodiment of the present invention.
Figure 12A:
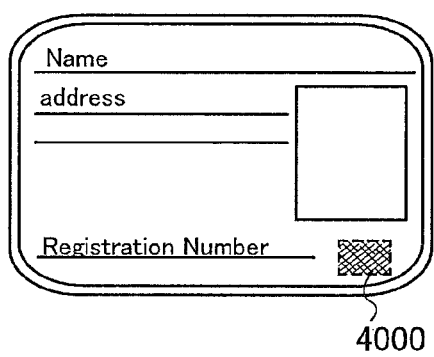
FIGS. 12A to 12F illustrate application examples of an RF tag of one embodiment of the present invention.
Figure 12B:
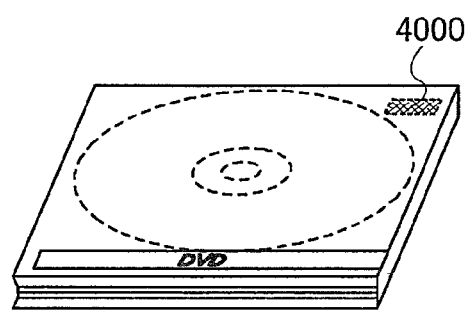
Figure 12C:
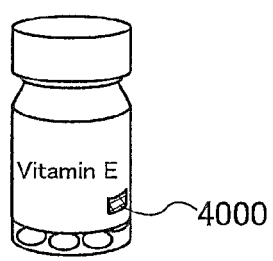
Figure 12D:
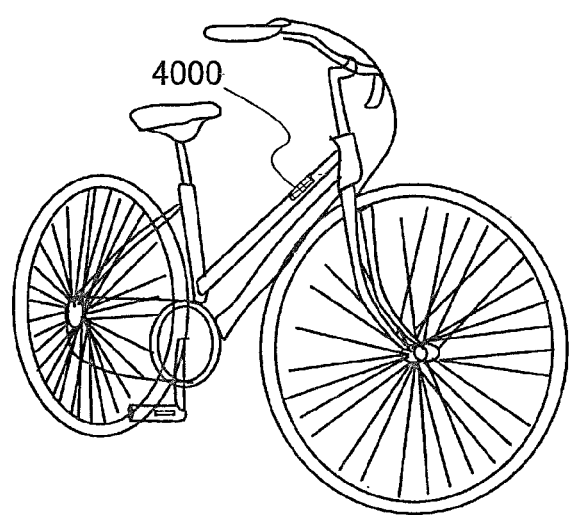
Figure 12E:
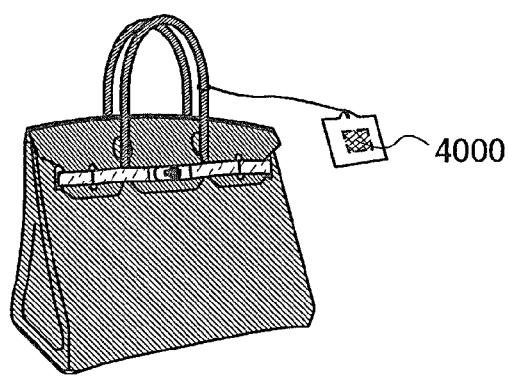
Figure 12F:
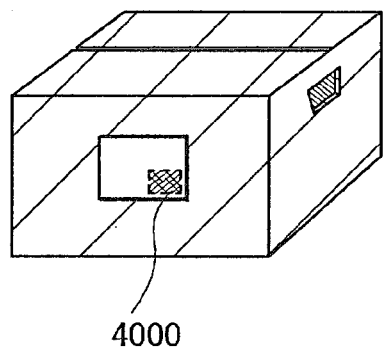

As shown in FIG. 11, an RF tag 800 includes an antenna 804 which receives a radio signal 803 that is transmitted from an antenna 802 connected to a communication device 801 (also referred to as an interrogator, a reader/writer, or the like). The RF tag 800 includes a rectifier circuit 805, a constant voltage circuit 806, a demodulation circuit 807, a modulation circuit 808, a logic circuit 809, a memory circuit 810, and a ROM 811. A semiconductor of a transistor having a rectifying function included in the demodulation circuit 807 may be a material which enables a reverse current to be low enough, for example, an oxide semiconductor. This can suppress the phenomenon of a rectifying function becoming weaker due to generation of a reverse current and prevent saturation of the output from the demodulation circuit. In other words, the input to the demodulation circuit and the output from the demodulation circuit can have a relation closer to a linear relation. Note that data transmission methods are roughly classified into the following three methods: an electromagnetic coupling method in which a pair of coils is provided so as to face each other and communicates with each other by mutual induction, an electromagnetic induction method in which communication is performed using an induction field, and a radio wave method in which communication is performed using a radio wave. Any of these methods can be used in the RF tag 800.

Next, the structure of each circuit will be described. The antenna 804 exchanges the radio signal 803 with the antenna 802 which is connected to the communication device 801. The rectifier circuit 805 generates an input potential by rectification, for example, half-wave voltage doubler rectification of an input alternating signal generated by reception of a radio signal at the antenna 804 and smoothing of the rectified signal with a capacitor provided in a later stage in the rectifier circuit 805. Note that a limiter circuit may be provided on an input side or an output side of the rectifier circuit 805. The limiter circuit controls electric power so that electric power which is higher than or equal to certain electric power is not input to a circuit in a later stage if the amplitude of the input alternating signal is high and an internal generation voltage is high.

The constant voltage circuit 806 generates a stable power supply voltage from an input potential and supplies it to each circuit. Note that the constant voltage circuit 806 may include a reset signal generation circuit. The reset signal generation circuit is a circuit that generates a reset signal of the logic circuit 809 by utilizing rise of the stable power supply voltage.

The demodulation circuit 807 demodulates the input alternating signal by envelope detection and generates the demodulated signal. Further, the modulation circuit 808 performs modulation in accordance with data to be output from the antenna 804.

The logic circuit 809 analyzes and processes the demodulated signal. The memory circuit 810 holds the input data and includes a row decoder, a column decoder, a memory region, and the like. Further, the ROM 811 stores an identification number (ID) or the like and outputs it in accordance with processing.

Note that the decision whether each circuit described above is provided or not can be made as appropriate as needed.

Here, the above-described memory device can be used as the memory circuit 810. Since the memory device of one embodiment of the present invention can retain data even when not powered, the memory device is suitable for an RF tag. Further, the memory device of one embodiment of the present invention needs power (voltage) needed for data writing lower than that needed in a conventional nonvolatile memory; thus, it is possible to prevent a difference between the maximum communication range in data reading and that in data writing. Furthermore, it is possible to suppress malfunction or incorrect writing which is caused by power shortage in data writing.

Since the memory device of one embodiment of the present invention can be used as a nonvolatile memory, it can also be used as the ROM 811. In this case, it is preferable that a manufacturer separately prepare a command for writing data to the ROM 811 so that a user cannot rewrite data freely. Since the manufacturer gives identification numbers before shipment and then starts shipment of products, instead of putting identification numbers to all the manufactured RF tags, it is possible to put identification numbers to only good products to be shipped. Thus, the identification numbers of the shipped products are in series and customer management corresponding to the shipped products is easily performed.

<Application Examples of RF Tag>

Application examples of the RF tag of one embodiment of the present invention are shown below with reference to FIGS. 12A to 12F. The RF tag is widely used and can be provided for, for example, products such as bills, coins, securities, bearer bonds, documents (e.g., driver's licenses or resident's cards, see FIG. 12A), recording media (e.g., DVDs or video tapes, see FIG. 12B), packaging containers (e.g., wrapping paper or bottles, see FIG. 12C), vehicles (e.g., bicycles, see FIG. 12D), personal belongings (e.g., bags or glasses), foods, plants, animals, human bodies, clothing, household goods, medical supplies such as medicine and chemicals, and electronic devices (e.g., liquid crystal display devices, EL display devices, television sets, or cellular phones), or tags on products (see FIGS. 12E and 12F).

An RF tag 4000 of one embodiment of the present invention is fixed on products by, for example, being attached to a surface thereof or being embedded therein. For example, the RF tag 4000 is fixed to each product by being embedded in paper of a book, or embedded in an organic resin of a package. The RF tag 4000) of one embodiment of the present invention is small, thin, and lightweight, so that the design of a product is not impaired even after the RF tag 4000 of one embodiment of the present invention is fixed thereto. Further, bills, coins, securities, bearer bonds, documents, or the like can have identification functions by being provided with the RF tag 4000 of one embodiment of the present invention, and the identification functions can be utilized to prevent counterfeits. Moreover, the efficiency of a system such as an inspection system can be improved by providing the RF tag 4000 of one embodiment of the present invention for packaging containers, recording media, personal belongings, foods, clothing, household goods, electronic devices, or the like. Vehicles can also have higher security against theft or the like by being provided with the RF tag 4000 of one embodiment of the present invention.

As described above, the RF tag of one embodiment of the present invention can be used for the above-described purposes.

<CPU>

A CPU including a semiconductor device such as any of the above-described transistors or the above-described memory device is described below.

Figure 13:
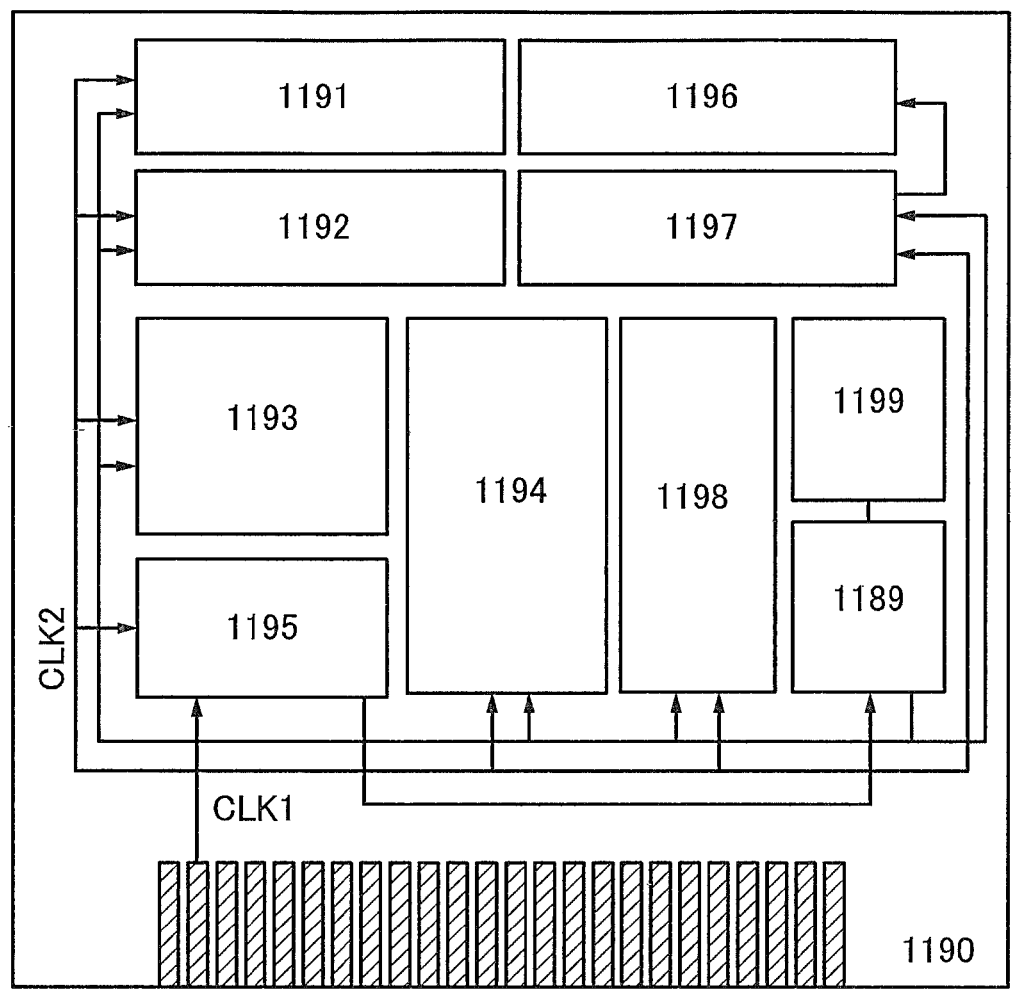
FIG. 13 is a block diagram illustrating a CPU of one embodiment of the present invention.

FIG. 13 is a block diagram illustrating a configuration example of a CPU including any of the above-described transistors as a component.

The CPU illustrated in FIG. 13 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198 (Bus I/F), a rewritable ROM 1199, and an ROM interface 1189 (ROM I/F). A semiconductor substrate, an SOI substrate, a glass substrate, or the like is used as the substrate 1190. The rewritable ROM 1199 and the ROM interface 1189 may be provided over a separate chip. Needless to say, the CPU in FIG. 13 is just an example in which the configuration has been simplified, and an actual CPU may have a variety of configurations depending on the application. For example, the CPU may have the following configuration: a structure including the CPU illustrated in FIG. 13 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 judges an interrupt request from an external input/output device or a peripheral circuit on the basis of its priority or a mask state, and processes the request. The register controller 1197 generates an address of the register 1196, and reads/writes data from/to the register 1196 in accordance with the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal CLK2 based on a reference clock signal CLK1, and supplies the internal clock signal CLK2 to the above circuits.

In the CPU illustrated in FIG. 13, a memory cell is provided in the register 1196. For the memory cell of the register 1196, any of the above-described transistors, the above-described memory device, or the like can be used.

In the CPU illustrated in FIG. 13, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of power supply voltage to the memory cell in the register 1196 can be stopped.

Figure 14:
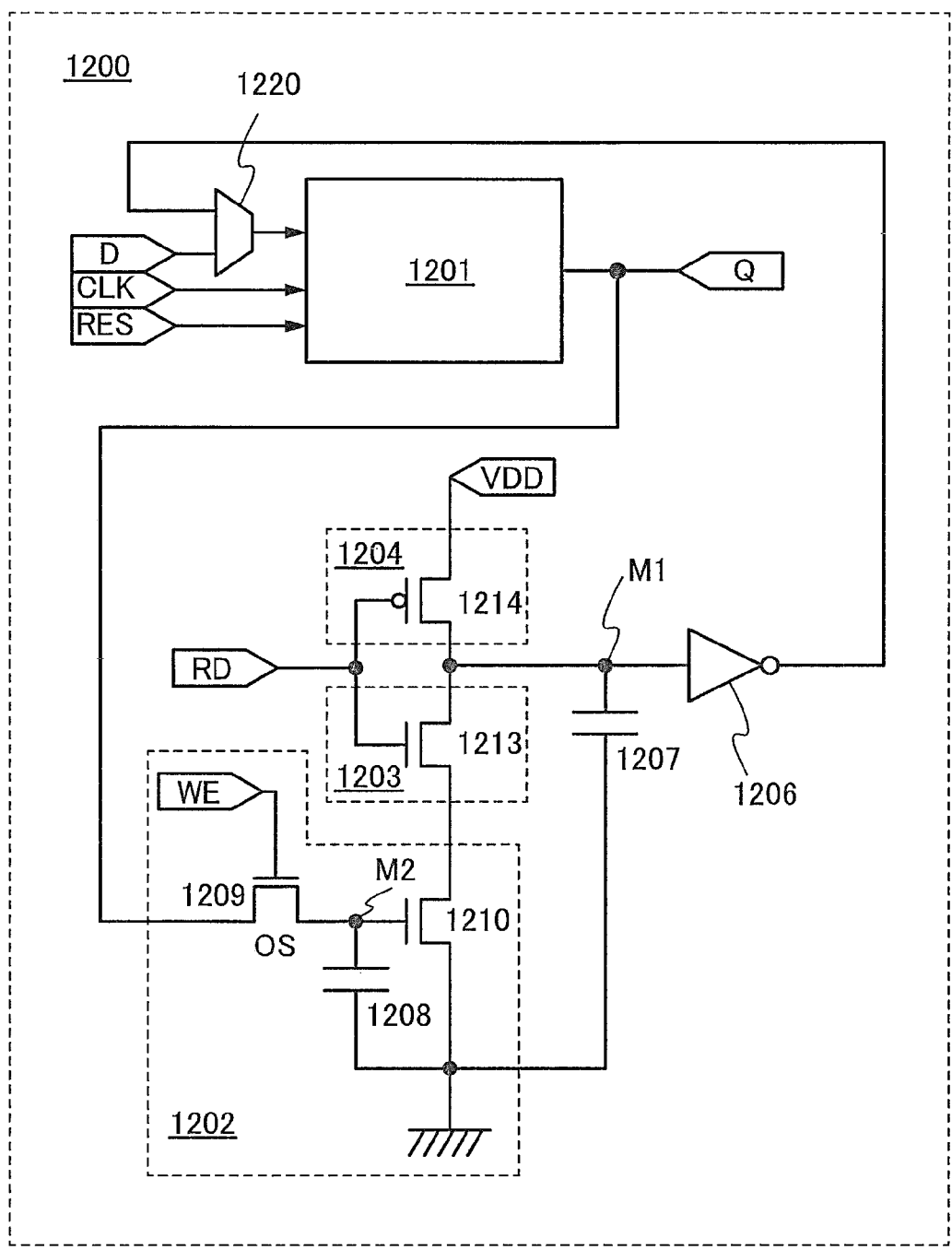
FIG. 14 is a circuit diagram of a memory element of one embodiment of the present invention.

FIG. 14 is an example of a circuit diagram of a memory element that can be used as the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line which can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line which can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line which can supply a low power supply potential (e.g., a GND line). The other of the pair of electrodes of the capacitor 1208 can be supplied with a constant potential. For example, the other of the pair of electrodes of the capacitor 1208 can be supplied with the low power supply potential (e.g., GND) or the high power supply potential (e.g., VDD). The other of the pair of electrodes of the capacitor 1208 is electrically connected to the line which can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to a first gate (first gate electrode) of the transistor 1209. As for each of the switch 1203 and the switch 1204, a conduction state or a non-conduction state between the first terminal and the second terminal is selected by the control signal RD which is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 14 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 14, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 14, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor layer. Further alternatively, in the memory element 1200, a transistor in which a channel is formed in an oxide semiconductor layer can be included besides the transistor 1209, and a transistor in which a channel is formed in a layer or the substrate 1190 including a semiconductor other than an oxide semiconductor can be used for the rest of the transistors.

As the circuit 1201 in FIG. 14, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 which is provided in the circuit 1202.

The off-state current of a transistor in which a channel is formed in an oxide semiconductor layer is extremely low. For example, the off-state current of a transistor in which a channel is formed in an oxide semiconductor layer is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Therefore, the power supply can be stopped even for a short time in the processor or one or a plurality of logic circuits included in the processor, resulting in lower power consumption.

Although the memory element 1200 is used in a CPU, the memory element 1200 can also be used in an LSI such as a digital signal processor (DSP), a custom LSI, or a programmable logic device (PLD), and a radio frequency identification (RF).

<Display Panel>

A display panel including a semiconductor device such as any of the above-described transistors is described below.

Figure 15A:
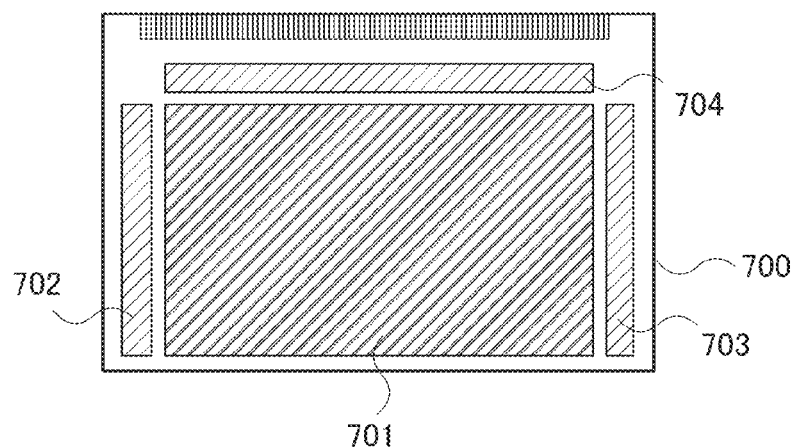
FIG. 15A illustrates a structure of a display device of one embodiment of the present invention and FIGS. 15B and 15C are circuit diagrams thereof.
Figure 15B:
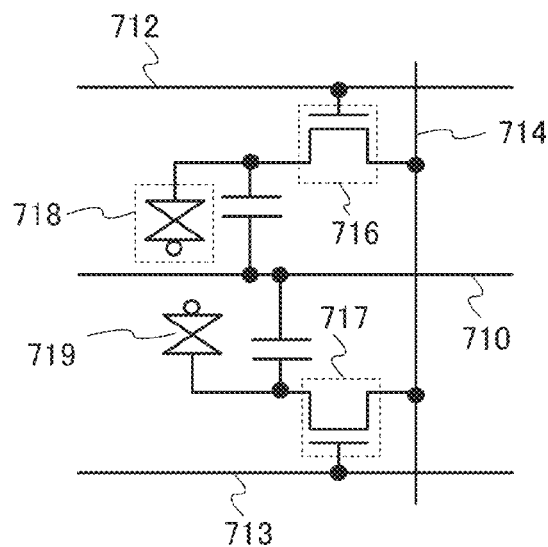
Figure 15C:
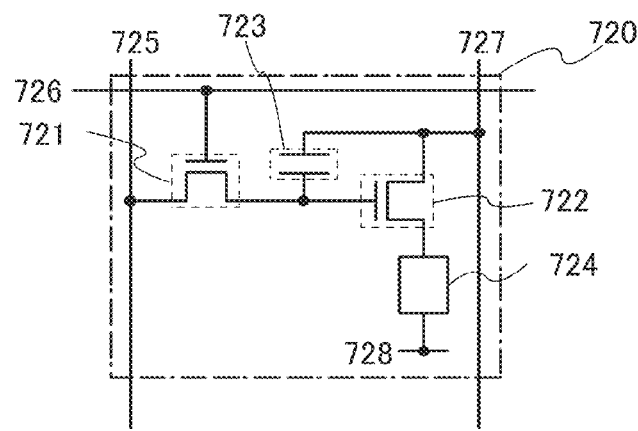

FIG. 15A is a top view of the display panel of one embodiment of the present invention. FIG. 15B is a circuit diagram illustrating a pixel circuit that can be used in the case where a liquid crystal element is used in a pixel in the display panel of one embodiment of the present invention. FIG. 15C is a circuit diagram illustrating a pixel circuit that can be used in the case where an organic EL element is used in a pixel in the display panel of one embodiment of the present invention.

The transistor in the pixel portion can be formed in accordance with Embodiment 3. The transistor can easily be an n-channel transistor, and thus, part of a driver circuit that can be formed using an n-channel transistor in the driver circuit is formed over the same substrate as the transistor of the pixel portion. With the use of the transistor described in Embodiment 3 for the pixel portion or the driver circuit in this manner, a highly reliable display device can be provided.

FIG. 15A is a block diagram illustrating an example of an active matrix display device. A pixel portion 701, a first scan line driver circuit 702, a second scan line driver circuit 703, and a signal line driver circuit 704 are formed over a substrate 700 of the display device. In the pixel portion 701, a plurality of signal lines extended from the signal line driver circuit 704 are arranged and a plurality of scan lines extended from the first scan line driver circuit 702 and the second scan line driver circuit 703 are arranged. Note that pixels which include display elements are arranged in a matrix in regions where the scan lines and the signal lines are crossed. The substrate 700 of the display device is connected to a timing control circuit (also referred to as a controller or a controller IC) through a connection portion such as a flexible printed circuit (FPC).

In FIG. 15A, the first scan line driver circuit 702, the second scan line driver circuit 703, and the signal line driver circuit 704 are formed over the substrate 700 where the pixel portion 701 is formed. Accordingly, the number of components that are provided outside, such as a driver circuit, can be reduced, so that a reduction in cost can be achieved. Further, if the driver circuit is provided outside the substrate 700, wirings would need to be extended and the number of connections of wirings would be increased, but by providing the driver circuit over the substrate 700, the number of connections of the wirings can be reduced. Consequently, an improvement in reliability or yield can be achieved.

[Liquid Crystal Panel]

FIG. 15B illustrates an example of a circuit configuration of a pixel in a liquid crystal panel that is one mode of a display panel. Here, a circuit of a pixel that can be used in a VA liquid crystal display panel is illustrated.

This pixel circuit can be applied to a structure in which one pixel includes a plurality of pixel electrode layers. The pixel electrode layers are connected to different transistors, and the transistors can be driven with different gate signals. Accordingly, signals applied to individual pixel electrode layers in a multi-domain pixel can be controlled independently.

A gate wiring 712 of a transistor 716 and a gate wiring 713 of a transistor 717 are separated so that different gate signals can be supplied thereto. In contrast, a source or drain electrode layer 714 functioning as a data line is shared by the transistors 716 and 717. Any of the transistors described in Embodiment 3 can be used as appropriate as each of the transistors 716 and 717. Thus, the liquid crystal display panel can have high reliability.

The shapes of a first pixel electrode layer electrically connected to the transistor 716 and a second pixel electrode layer electrically connected to the transistor 717 are described. The first pixel electrode layer and the second pixel electrode layer are separated by a slit. The first pixel electrode layer has a V shape and the second pixel electrode layer is provided so as to surround the first pixel electrode.

A gate electrode of the transistor 716 is connected to the gate wiring 712, and a gate electrode of the transistor 717 is connected to the gate wiring 713. When different gate signals are supplied to the gate wiring 712 and the gate wiring 713, operation timings of the transistor 716 and the transistor 717 can be varied. As a result, alignment of liquid crystals can be controlled.

Further, a storage capacitor may be formed using a capacitor wiring 710, a gate insulating layer functioning as a dielectric, and a capacitor electrode electrically connected to the first pixel electrode layer or the second pixel electrode layer.

The multi-domain pixel includes a first liquid crystal element 718 and a second liquid crystal element 719. The first liquid crystal element 718 includes the first pixel electrode layer, a counter electrode layer, and a liquid crystal layer therebetween. The second liquid crystal element 719 includes the second pixel electrode layer, a counter electrode layer, and a liquid crystal layer therebetween.

Note that a pixel circuit of one embodiment of the present invention is not limited to that shown in FIG. 15B. For example, a switch, a resistor, a capacitor, a transistor, a sensor, a logic circuit, or the like may be added to the pixel circuit shown in FIG. 15B.

[Organic EL Panel]

FIG. 15C illustrates an example of a circuit configuration of a pixel in an organic EL panel that is another mode of the display panel.

In an organic EL element, by application of voltage to a light-emitting element, electrons are injected from one of a pair of electrodes included in the organic EL element and holes are injected from the other of the pair of electrodes, into a layer containing a light-emitting organic compound; thus, current flows. The electrons and holes are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

FIG. 15C illustrates an example of a pixel circuit applicable to an organic EL panel. Here, one pixel includes two n-channel transistors. Note that the oxide semiconductor film of one embodiment of the present invention can be used for a channel formation region of an n-channel transistor. Further, digital time grayscale driving can be employed for the pixel circuit.

The configuration of the applicable pixel circuit and operation of a pixel employing digital time grayscale driving will be described.

A pixel 720 includes a switching transistor 721, a driver transistor 722, a light-emitting element 724, and a capacitor 723. A gate electrode layer of the switching transistor 721 is connected to a scan line 726, a first electrode (one of a source electrode layer and a drain electrode layer) of the switching transistor 721 is connected to a signal line 725, and a second electrode (the other of the source electrode layer and the drain electrode layer) of the switching transistor 721 is connected to a gate electrode layer of the driver transistor 722. The gate electrode layer of the driver transistor 722 is connected to a power supply line 727 through the capacitor 723, a first electrode of the driver transistor 722 is connected to the power supply line 727, and a second electrode of the driver transistor 722 is connected to a first electrode (a pixel electrode) of the light-emitting element 724. A second electrode of the light-emitting element 724 corresponds to a common electrode 728. The common electrode 728 is electrically connected to a common potential line provided over the same substrate.

As each of the switching transistor 721 and the driver transistor 722, any of the transistors described in Embodiment 3 can be used as appropriate. In this manner, a highly reliable organic EL panel can be provided.

The potential of the second electrode (the common electrode 728) of the light-emitting element 724 is set to be a low power supply potential. Note that the low power supply potential is lower than a high power supply potential supplied to the power supply line 727. For example, the low power supply potential can be GND, 0 V, or the like. The high power supply potential and the low power supply potential are set to be higher than or equal to the forward threshold voltage of the light-emitting element 724, and the difference between the potentials is applied to the light-emitting element 724, whereby current is supplied to the light-emitting element 724, leading to light emission. The forward voltage of the light-emitting element 724 refers to a voltage at which a desired luminance is obtained, and includes at least forward threshold voltage.

Note that gate capacitance of the driver transistor 722 can be used as a substitute for the capacitor 723, so that the capacitor 723 can be omitted. The gate capacitance of the driver transistor 722 may be formed between the channel formation region and the gate electrode layer.

Next, a signal input to the driver transistor 722 is described. In the case of a voltage-input voltage driving method, a video signal for sufficiently turning on or off the driver transistor 722 is input to the driver transistor 722. In order for the driver transistor 722 to operate in a linear region, voltage higher than the voltage of the power supply line 727 is applied to the gate electrode of the driver transistor 722. Note that voltage higher than or equal to voltage which is the sum of power supply line voltage and the threshold voltage $V_{th}$ of the driver transistor 722 is applied to the signal line 725.

In the case of performing analog grayscale driving, a voltage higher than or equal to a voltage which is the sum of the forward voltage of the light-emitting element 724 and the threshold voltage $V_{th}$ of the driver transistor 722 is applied to the gate electrode layer of the driver transistor 722. A video signal by which the driver transistor 722 is operated in a saturation region is input, so that current is supplied to the light-emitting element 724. In order for the driver transistor 722 to operate in a saturation region, the potential of the power supply line 727 is set higher than the gate potential of the driver transistor 722. When an analog video signal is used, it is possible to supply current to the light-emitting element 724 in accordance with the video signal and perform analog grayscale driving.

Note that a configuration of a pixel circuit is not limited to that shown in FIG. 15C. For example, a switch, a resistor, a capacitor, a sensor, a transistor, a logic circuit, or the like may be added to the pixel circuit shown in FIG. 15C.

In the case where any of the transistors described in Embodiment 3 is used for the circuit shown in FIGS. 15A to 15C, the source electrode (the first electrode) is electrically connected to the low potential side and the drain electrode (the second electrode) is electrically connected to the high potential side. Furthermore, the potential of the first gate electrode may be controlled by a control circuit or the like and the potential described above as an example, e.g., a potential lower than the potential applied to the source electrode, may be input to the second gate electrode through a wiring that is not illustrated.

<Electronic Device>

The semiconductor device of one embodiment of the present invention can be used for display devices, personal computers, or image reproducing devices provided with recording media (typically, devices which reproduce the content of recording media such as digital versatile discs (DVDs) and have displays for displaying the reproduced images). Other examples of electronic devices that can be equipped with the semiconductor device of one embodiment of the present invention are mobile phones, game machines including portable game consoles, portable data appliances, e-book readers, cameras such as video cameras and digital still cameras, goggle-type displays (head mounted displays), navigation systems, audio reproducing devices (e.g., car audio systems and digital audio players), copiers, facsimiles, printers, multifunction printers, automated teller machines (ATM), and vending machines. FIGS. 16A to 16F illustrate specific examples of these electronic devices.

Figure 16A:
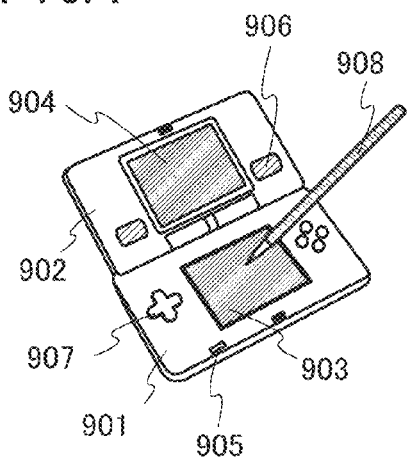
FIGS. 16A to 16F illustrate electronic devices of one embodiment of the present invention.

FIG. 16A illustrates a portable game console including a housing 901, a housing 902, a display portion 903, a display portion 904, a microphone 905, a speaker 906, an operation key 907, a stylus 908, and the like. Although the portable game machine in FIG. 16A has the two display portions 903 and 904, the number of display portions included in a portable game machine is not limited to this.

Figure 16B:
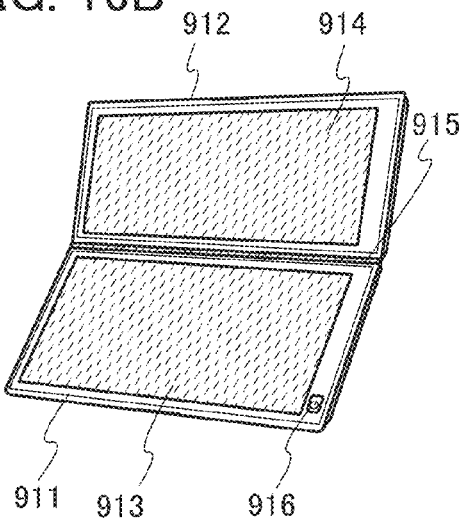

FIG. 16B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by providing a touch panel in a display device. Alternatively, the position input function can be added by provision of a photoelectric conversion element called a photosensor in a pixel portion of a display device.

Figure 16C:
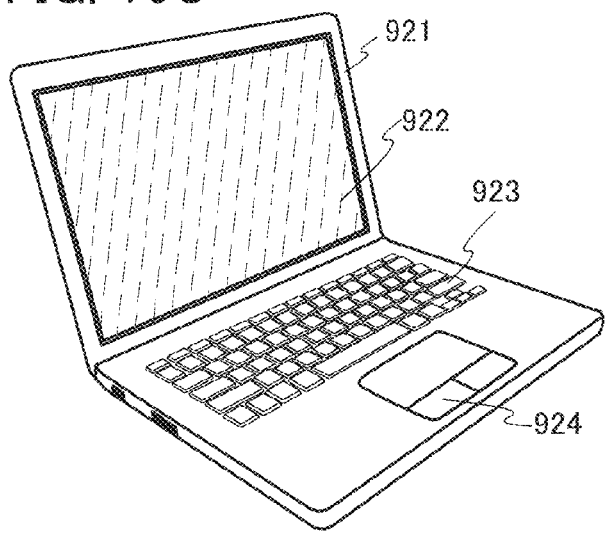

FIG. 16C illustrates a laptop personal computer, which includes a housing 921, a display portion 922, a keyboard 923, a pointing device 924, and the like.

Figure 16D:
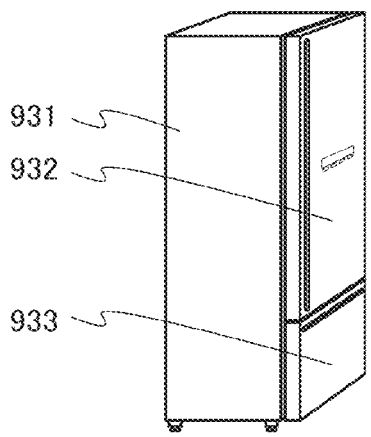

FIG. 16D illustrates the electric refrigerator-freezer including a housing 931, a door for a refrigerator 932, a door for a freezer 933, and the like.

Figure 16E:
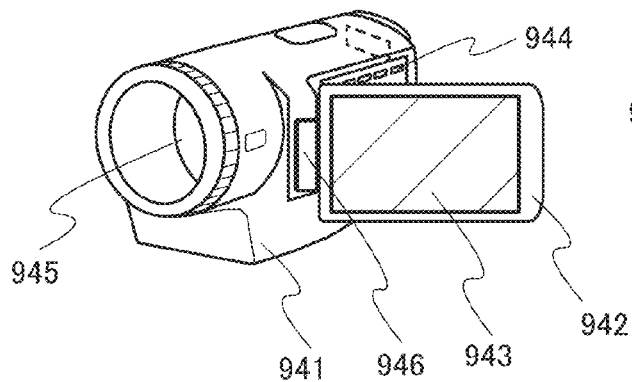

FIG. 16E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 16F:
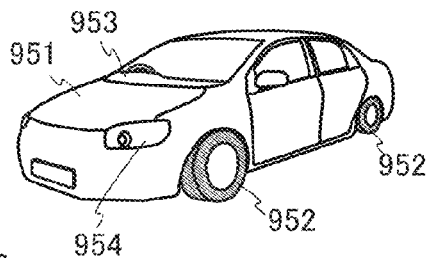

FIG. 16F illustrates an ordinary vehicle including a car body 951, wheels 952, a dashboard 953, lights 954, and the like.

The structures, the methods, and the like described in this embodiment can be combined as appropriate with any of the structures, the methods, and the like described in the other embodiments.

This application is based on Japanese Patent Application serial no. 2013-190216 filed with Japan Patent Office on Sep. 13, 2013, the entire contents of which are hereby incorporated by reference.

What is claimed is:

1. A method of manufacturing a semiconductor device, comprising the steps of:
    forming a first oxide semiconductor layer containing a single metal element as a constituent element over a substrate by a thermal chemical vapor deposition method;
    forming a second oxide semiconductor layer containing two or more metal elements as constituent elements by the thermal chemical vapor deposition method and by epitaxial growth using the first oxide semiconductor layer as a seed crystal successively after the first oxide semiconductor layer is formed; and forming an insulating layer over the second oxide semiconductor layer,
    wherein the second oxide semiconductor layer comprises indium, an element M, and zinc, M being Al, Ti, Ga, Y, Zr, La, Ce, Nd, or Hf, and
    wherein the second oxide semiconductor layer has a concentration gradient such that, near an interface with the insulating layer, the concentration of element M is lower as the second oxide semiconductor layer is farther from the insulating layer, and near an interface with the first oxide semiconductor layer, the concentration of element M is lower as the second oxide semiconductor layer is farther from the first oxide semiconductor layer.

2. The method of manufacturing a semiconductor device according to claim 1, wherein the first oxide semiconductor layer and the second oxide semiconductor layer are formed in a same deposition chamber.

3. The method of manufacturing a semiconductor device according to claim 1,
wherein the second oxide semiconductor layer comprises a channel, and
wherein a gate electrode is formed to overlap side surfaces of the first oxide semiconductor layer and side surfaces of the second oxide semiconductor layer in a channel width direction.

4. The method of manufacturing a semiconductor device according to claim 1,
wherein the thermal chemical vapor deposition method is a metal organic chemical vapor deposition method.

5. A method of manufacturing a semiconductor device, comprising the steps of:
forming a first oxide semiconductor layer containing a single metal element as a constituent element over a substrate by a thermal chemical vapor deposition method;
forming a second oxide semiconductor layer containing two or more metal elements as constituent elements by the thermal chemical vapor deposition method and by epitaxial growth using the first oxide semiconductor layer as a seed crystal successively after the first oxide semiconductor layer is formed;
forming a first insulating layer over the second oxide semiconductor layer,
forming a source electrode and a drain electrode connected to the first oxide semiconductor layer and the second oxide semiconductor layer;
forming a second insulating layer adjacent to one of the first oxide semiconductor layer and the second oxide semiconductor layer; and forming a gate electrode adjacent to the second insulating layer,
wherein the second oxide semiconductor layer comprises indium, an element M, and zinc, M being Al, Ti, Ga, Y, Zr, La, Ce, Nd, or Hf, and
wherein the second oxide semiconductor layer has a concentration gradient such that, near an interface with the first insulating layer, the concentration of element M is lower as the second oxide semiconductor layer is farther from the first insulating layer, and near an interface with the first oxide semiconductor layer, the concentration of element M is lower as the second oxide semiconductor layer is farther from the first oxide semiconductor layer.

6. The method of manufacturing a semiconductor device according to claim 5, wherein the gate electrode overlaps the second oxide semiconductor layer with the second insulating layer provided therebetween.

7. The method of manufacturing a semiconductor device according to claim 5, wherein the first oxide semiconductor layer overlaps the gate electrode with the second insulating layer provided therebetween.

8. The method of manufacturing a semiconductor device according to claim 5, wherein the thermal chemical vapor deposition method is a metal organic chemical vapor deposition method.

9. The method of manufacturing a semiconductor device according to claim 5, wherein a thickness of the first oxide semiconductor layer is 0.1-atomic-layer thick to 20-atomic-layer thick.

10. The method of manufacturing a semiconductor device according to claim 5,
wherein the first oxide semiconductor layer contains zinc.

11. The method of manufacturing a semiconductor device according to claim 5, wherein the first oxide semiconductor layer and the second oxide semiconductor layer are formed at a temperature of 400 ° C. to 800 ° C.

12. The method of manufacturing a semiconductor device according to claim 5,
wherein the second oxide semiconductor layer comprises a channel, and
wherein the gate electrode overlaps side surfaces of the first oxide semiconductor layer and side surfaces of the second oxide semiconductor layer in a channel width direction.

13. A method of manufacturing a semiconductor device, comprising the steps of:
forming a first oxide semiconductor layer containing a single metal element as a constituent element over a substrate by a thermal chemical vapor deposition method;
forming a second oxide semiconductor layer containing two or more metal elements as constituent elements by the thermal chemical vapor deposition method and by epitaxial growth using the first oxide semiconductor layer as a seed crystal successively after the first oxide semiconductor layer is formed;
forming a first insulating layer over the second oxide semiconductor layer;
forming a source electrode and a drain electrode connected to the first oxide semiconductor layer and the second oxide semiconductor layer;
forming a third oxide semiconductor layer by the thermal chemical vapor deposition method and by epitaxial growth using the second oxide semiconductor layer as a seed crystal, the third oxide semiconductor layer overlapping side surfaces of the first oxide semiconductor layer and side surfaces of the second oxide semiconductor layer in a channel width direction;
forming a second insulating layer over the third oxide semiconductor layer; and
forming a gate electrode over the second insulating layer,
wherein the second oxide semiconductor layer comprises indium, an element M, and zinc, M being Al, Ti, Ga, Y, Zr, La, Ce, Nd, or Hf, and
wherein the second oxide semiconductor layer has a concentration gradient such that, near an interface with the first insulating layer, the concentration of element M is lower as the second oxide semiconductor layer is farther from the first insulating layer, and near an interface with the first oxide semiconductor layer, the concentration of element M is lower as the second oxide semiconductor layer is farther from the first oxide semiconductor layer.

14. The method of manufacturing a semiconductor device according to claim 13, wherein the thermal chemical vapor deposition method is a metal organic chemical vapor deposition method.

15. The method of manufacturing a semiconductor device according to claim 13, wherein a thickness of the first oxide semiconductor layer is 0.1-atomic-layer thick to 20-atomic-layer thick.

16. The method of manufacturing a semiconductor device according to claim 13,
wherein the first oxide semiconductor layer contains zinc, and
wherein the third oxide semiconductor layer contains indium and zinc.

17. The method of manufacturing a semiconductor device according to claim 13, wherein the first oxide semiconductor layer, the second oxide semiconductor layer, and the third oxide semiconductor layer are formed at a temperature of 400 °C. to 800 °C.

18. The method of manufacturing a semiconductor device according to claim 13,
wherein the second oxide semiconductor layer comprises a channel, and
wherein the gate electrode overlaps the third oxide semiconductor layer in a channel width direction.

19. The method of manufacturing a semiconductor device according to claim 1,
wherein the first oxide semiconductor layer is formed using an organometallic gas containing zinc and a gas containing oxygen, and
wherein the second oxide semiconductor layer is formed using an organometallic gas containing indium, an organometallic gas containing gallium, the organometallic gas containing zinc, and the gas containing oxygen.

20. The method of manufacturing a semiconductor device according to claim 1, wherein the second oxide semiconductor layer is formed while a flow rate of a source gas is changed, whereby a composition of the second oxide semiconductor layer changes in a thickness direction.

21. The method of manufacturing a semiconductor device according to claim 1, wherein an electron affinity of the second oxide semiconductor layer is higher than an electron affinity of the first oxide semiconductor layer.

22. The method of manufacturing a semiconductor device according to claim 5,
wherein the first oxide semiconductor layer is formed using an organometallic gas containing zinc and a gas containing oxygen, and
wherein the second oxide semiconductor layer is formed using an organometallic gas containing indium, an organometallic gas containing gallium, the organometallic gas containing zinc, and the gas containing oxygen.

23. The method of manufacturing a semiconductor device according to claim 5, wherein the second oxide semiconductor layer is formed while a flow rate of a source gas is changed, whereby a composition of the second oxide semiconductor layer changes in a thickness direction.

24. The method of manufacturing a semiconductor device according to claim 5, wherein an electron affinity of the second oxide semiconductor layer is higher than an electron affinity of the first oxide semiconductor layer.

* * * * *